United States Patent
Edahiro et al.

(10) Patent No.: US 7,263,003 B2
(45) Date of Patent: Aug. 28, 2007

(54) TWO-TRANSISTOR FLASH MEMORY DEVICE USING REPLICA CELL ARRAY TO CONTROL THE PRECHARGE/DISCHARGE AND SENSE AMPLIFIER CIRCUITS OF THE PRIMARY CELL ARRAY

(75) Inventors: Toshiaki Edahiro, Yokohama (JP); Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 3 days.

(21) Appl. No.: 11/177,355

(22) Filed: Jul. 11, 2005

(65) Prior Publication Data

US 2006/0083064 A1 Apr. 20, 2006

(30) Foreign Application Priority Data

Oct. 14, 2004 (JP) ............................. 2004-300823

(51) Int. Cl.
*G11C 11/34* (2006.01)
(52) U.S. Cl. ..................... 365/185.25; 365/185.17; 365/185.2; 365/203; 365/210
(58) Field of Classification Search ........... 365/185.05, 365/185.17 X, 185.18, 185.2 X, 185.25 O, 365/189.01, 203 X, 204, 210 X, 185.17, 365/203
See application file for complete search history.

(56) References Cited

U.S. PATENT DOCUMENTS 5,325,337 A * 6/1994 Buttar ..................... 365/210

6,630,707 B1 * 10/2003 Shinmori ................... 257/315

OTHER PUBLICATIONS

Nobuaki Otsuka, et al., "Circuit Techniques for 1.5-V Power Supply Flash Memory", IEEE Journal of Solid-State Circuits, vol. 32, No. 8, Aug. 1997, pp. 1217-1230.
Rino Micheloni, et al., "The Flash Memory Read Path: Building Blocks and Critical Aspects", Proceedings of the IEEE, vol. 91, No. 4, Apr. 2003, pp. 537-553.
Wei-Hua Liu, et al., "A 2-Transistor Source-select (2TS) Flash EEPROM for 1.8V-Only Applications", Non-Volatile Semiconductor Memory Workshop 4.1, 1997, pp. 1-3.

* cited by examiner

*Primary Examiner*—VanThu Nguyen
(74) *Attorney, Agent, or Firm*—Oblon, Spivak, McClelland, Maier & Neustadt, P.C.

(57) ABSTRACT

A semiconductor memory device includes a memory cell array, first bit lines, second bit lines, a first precharge circuit, a sense amplifier, and a read control circuit. The memory cell array has a first cell array including first memory cells arranged in a matrix and a second cell array including second memory cells. The first bit line electrically connects the first memory cells in a same column. The second bit line electrically connects the second memory cells in a same column. The first precharge circuit precharges the first bit lines in a read operation. The sense amplifier amplifies the data read from the first memory cells in a read operation. The read control circuit precharges and discharges the second bit lines in a read operation and, on the basis of the time required to precharge and discharge the second bit lines, controls the first precharge circuit and the sense amplifier.

16 Claims, 67 Drawing Sheets

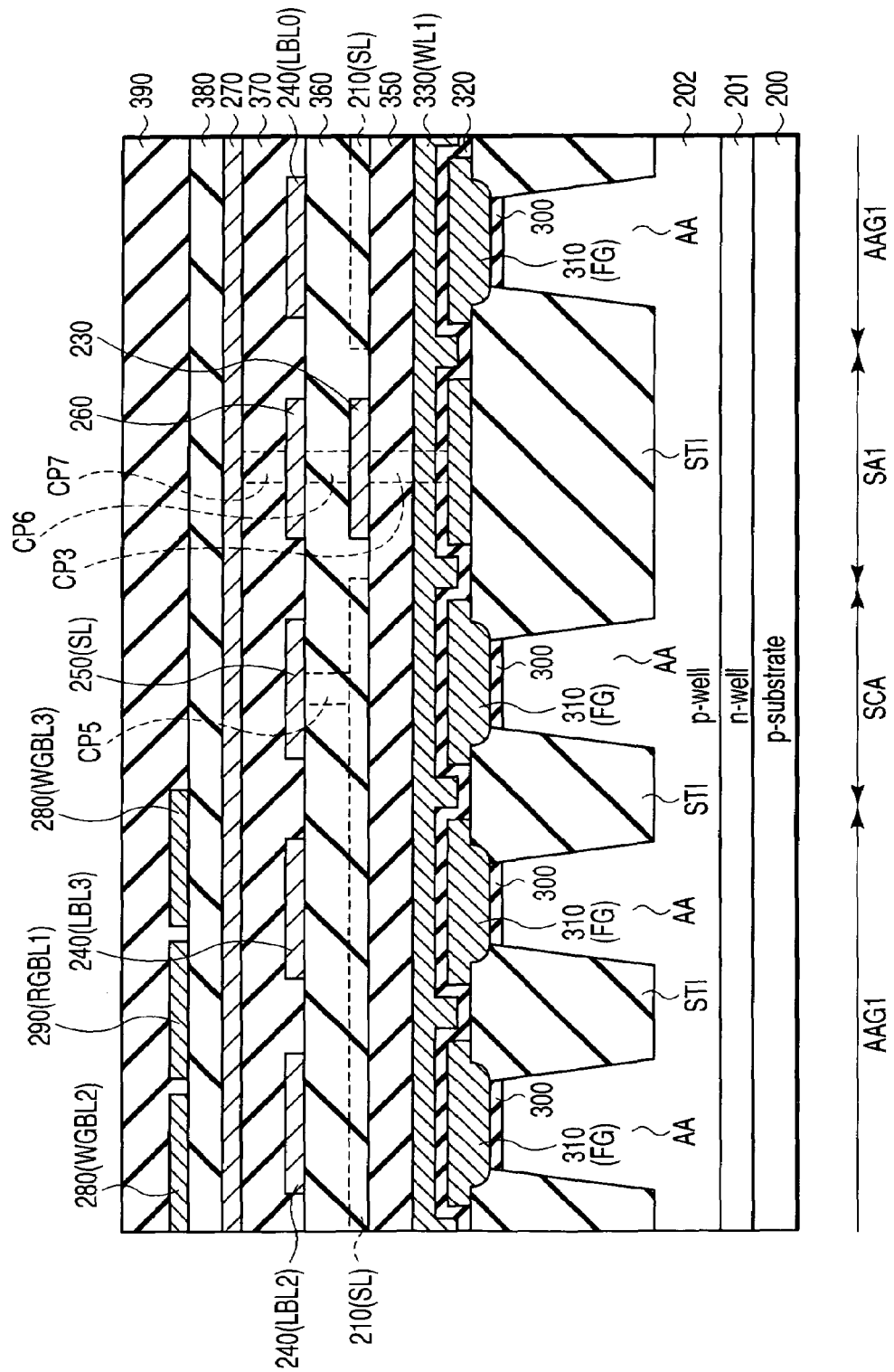
F I G. 15

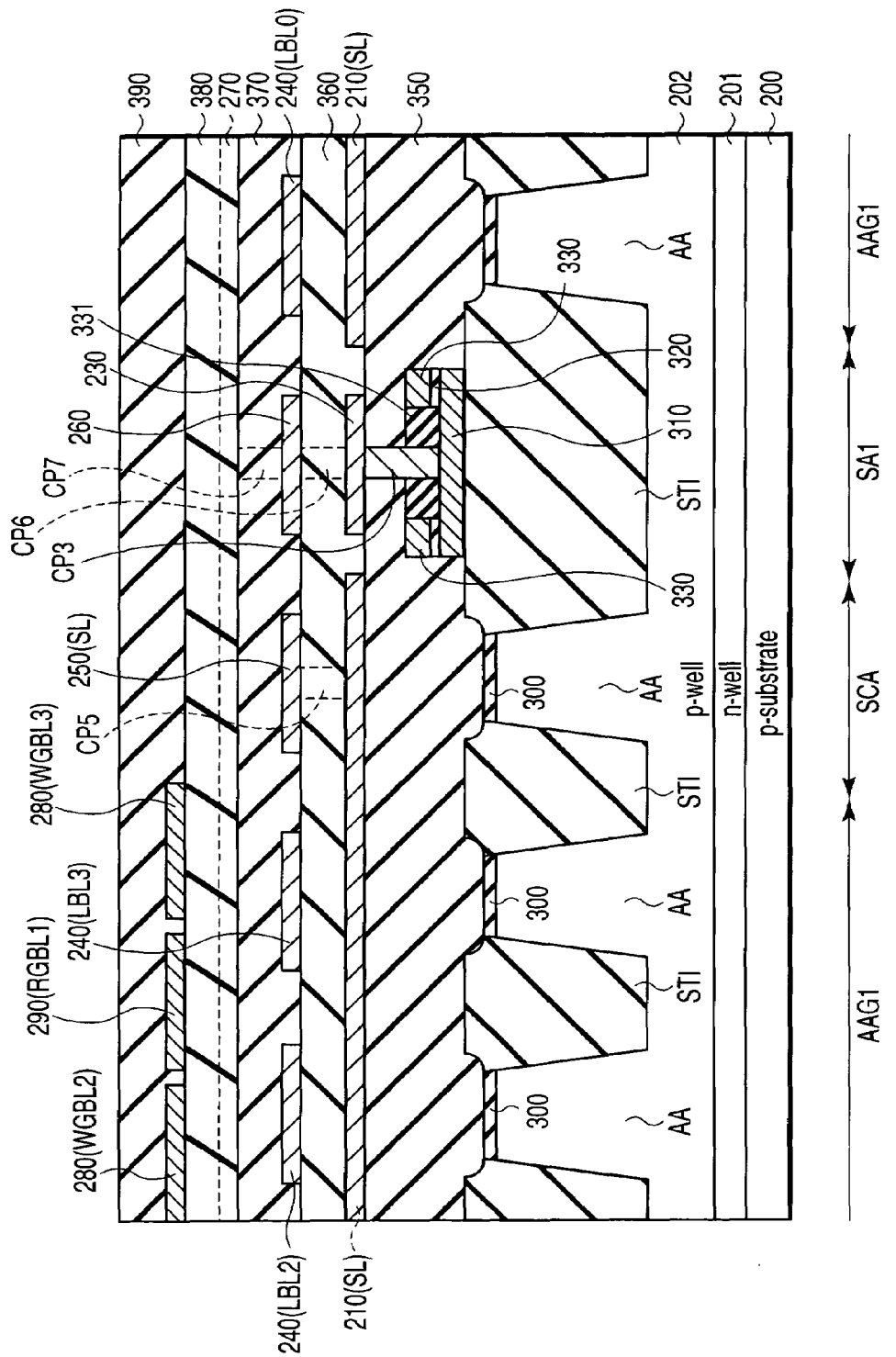
F I G. 16

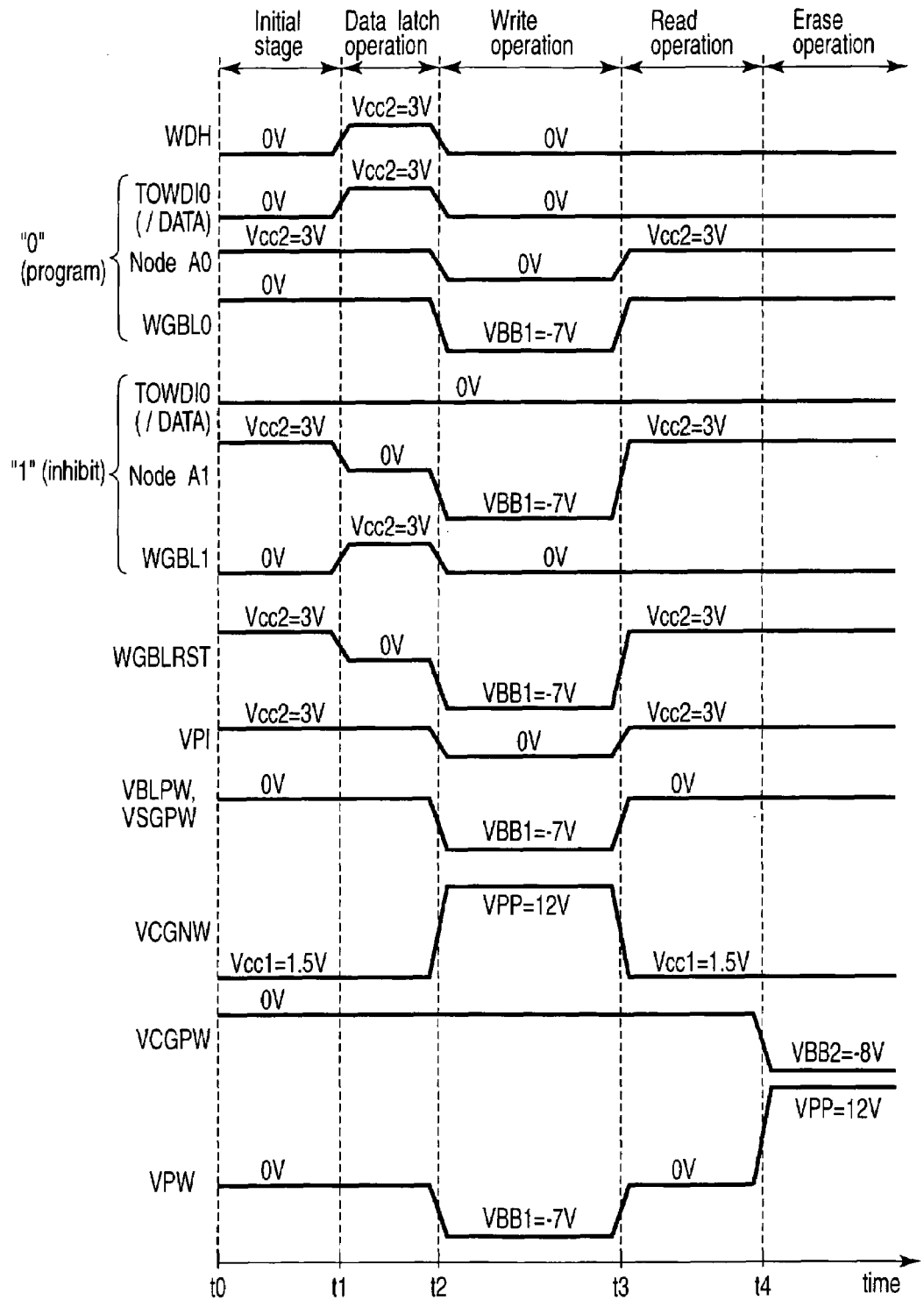
F I G. 2 8

INITIAL STAGE

READ OPERATION

ERASE OPERATION

FIG. 40  $C_{R\_RGBL} > C_{RGBL}$

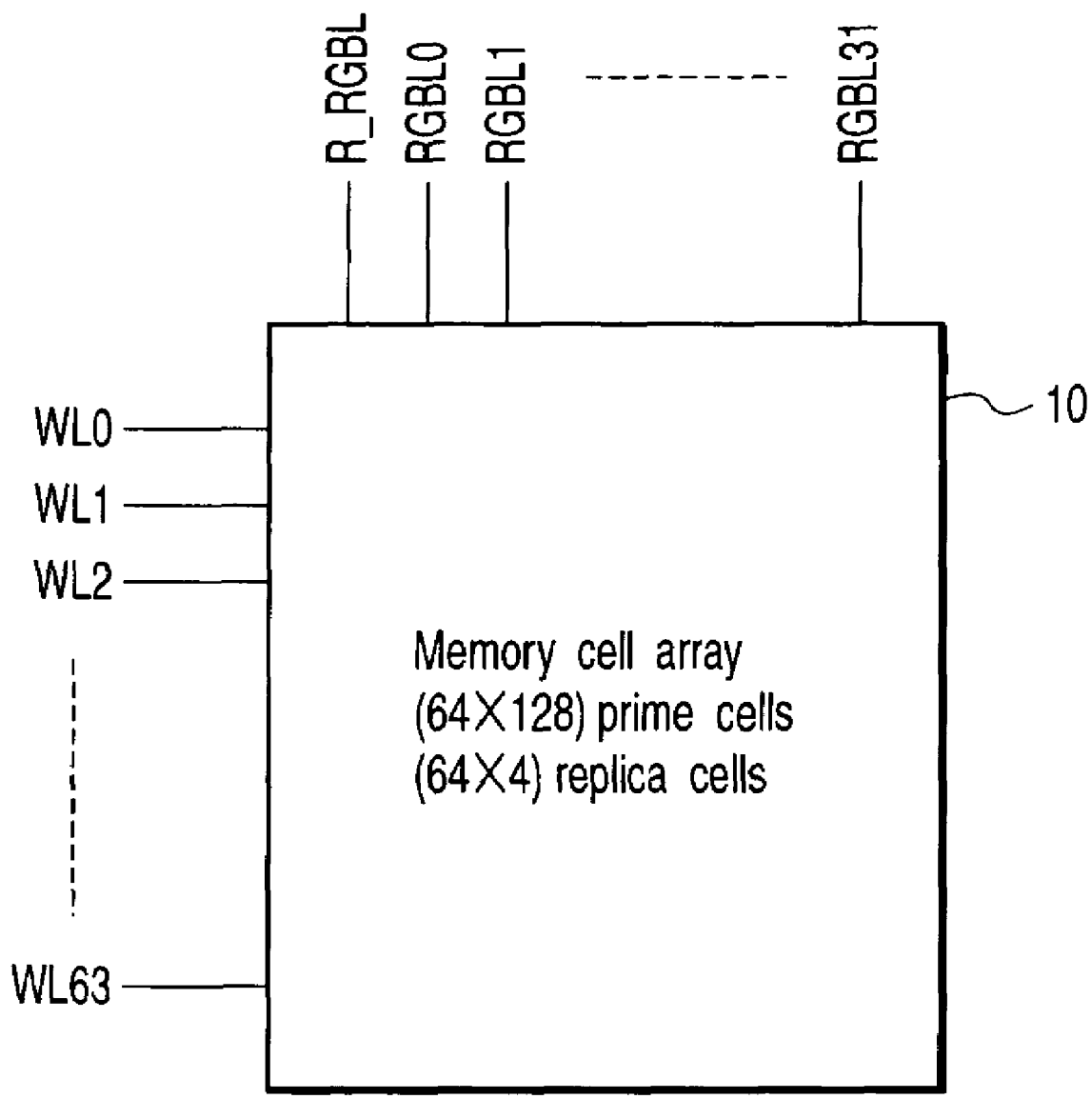
F I G. 5 0

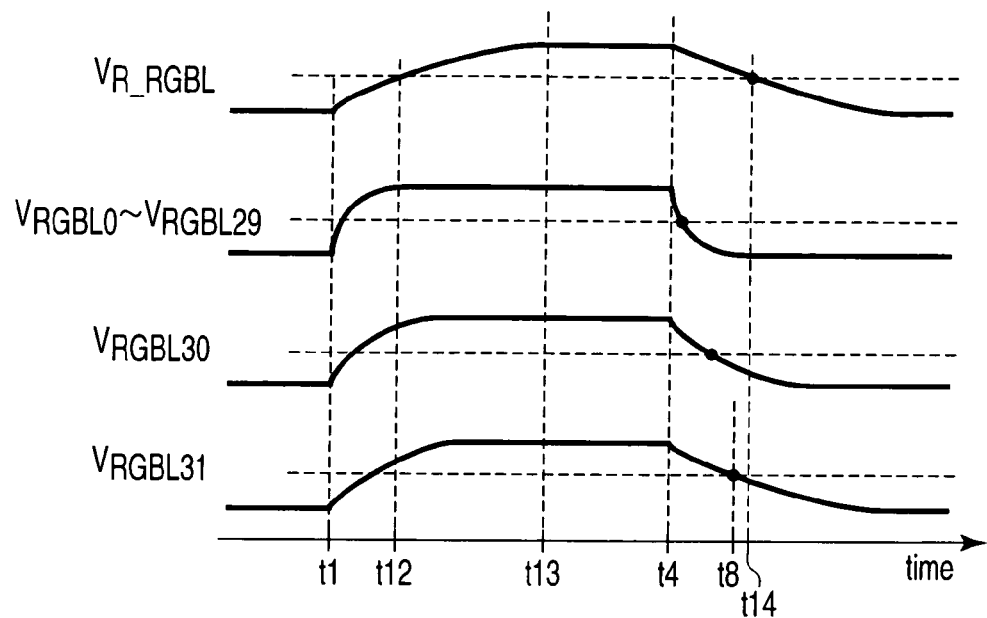
F I G. 5 4
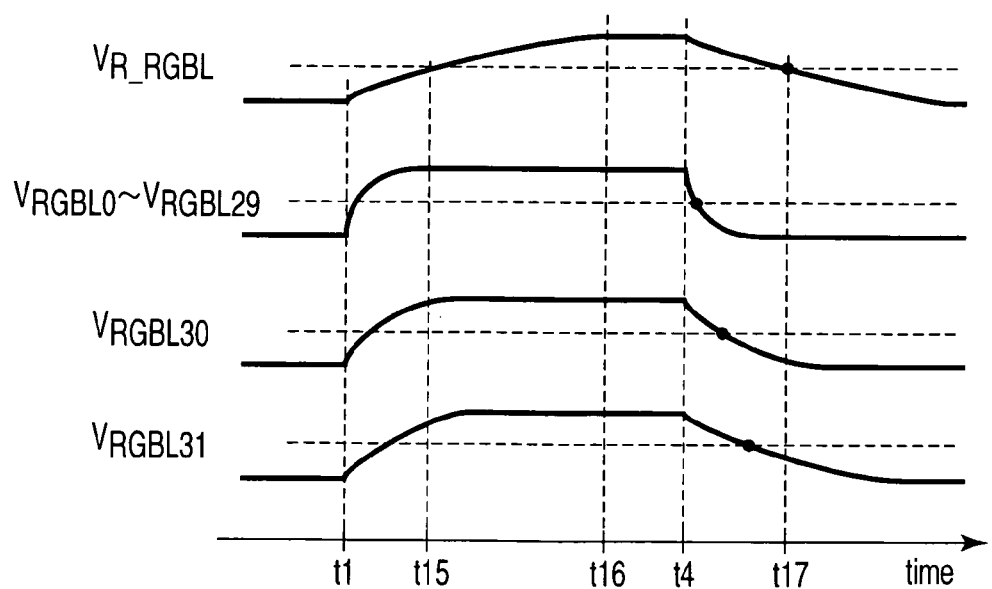
F I G. 5 5

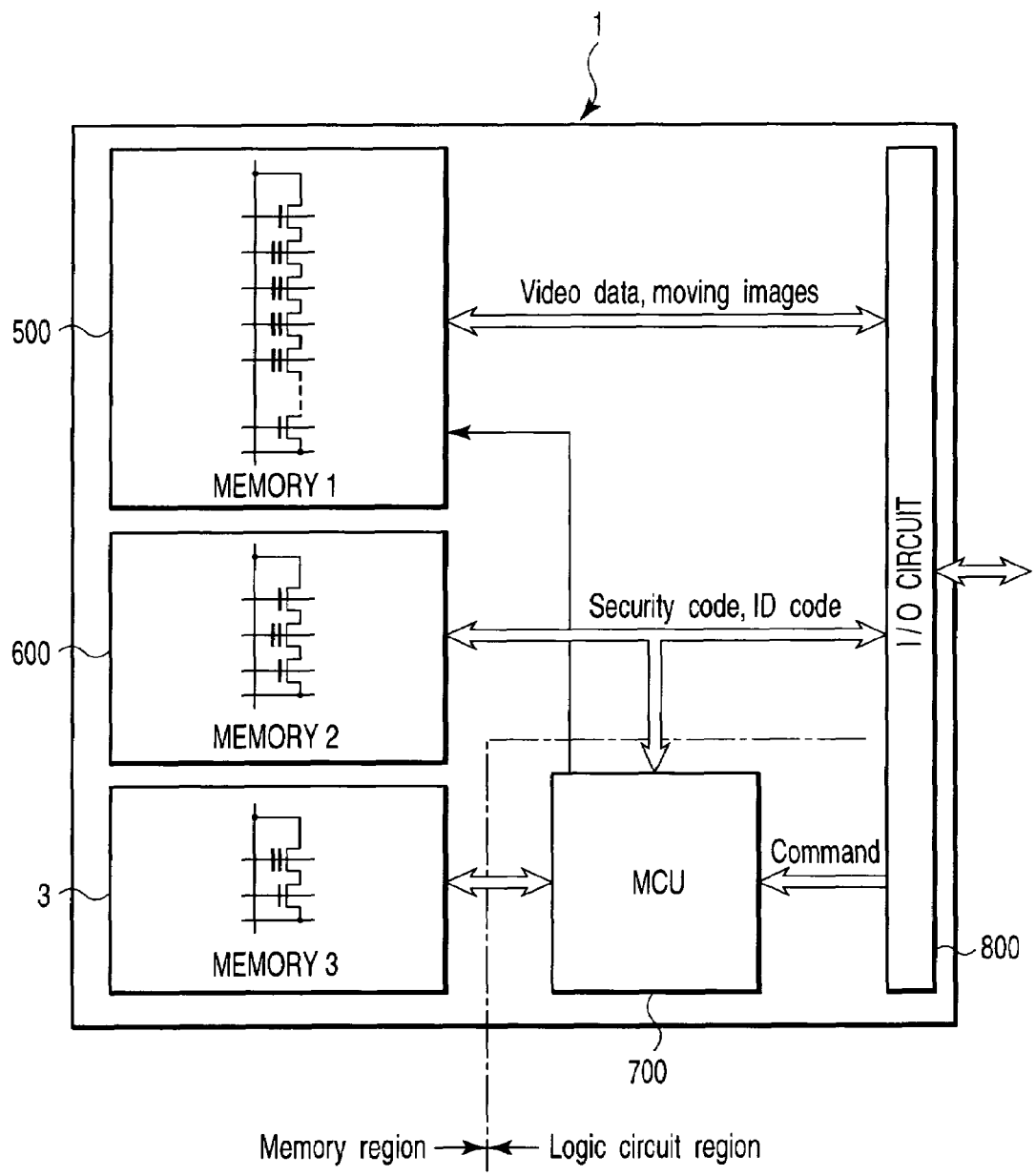
F I G. 5 6

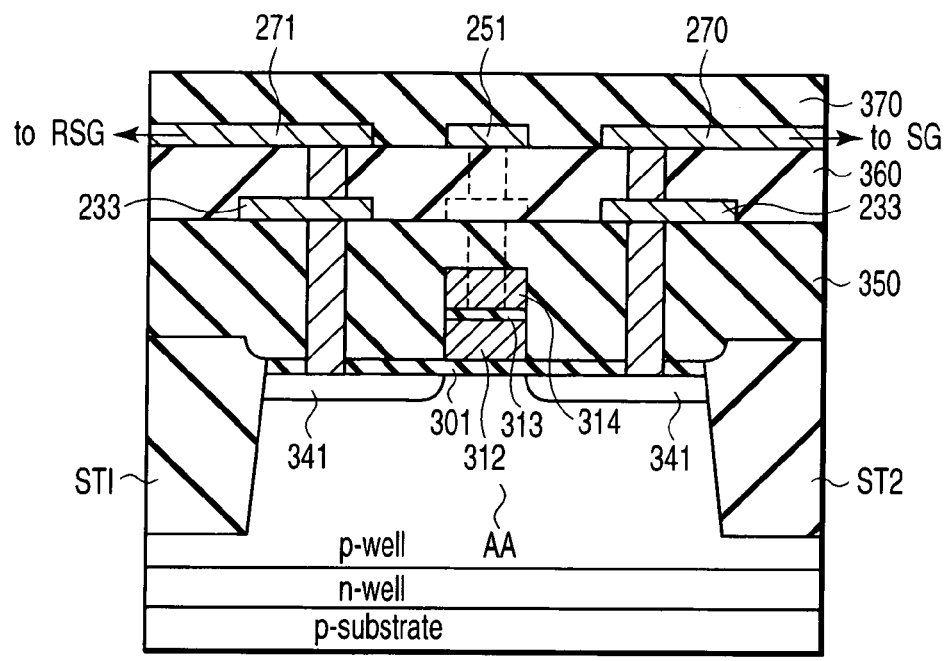
F I G. 6 3
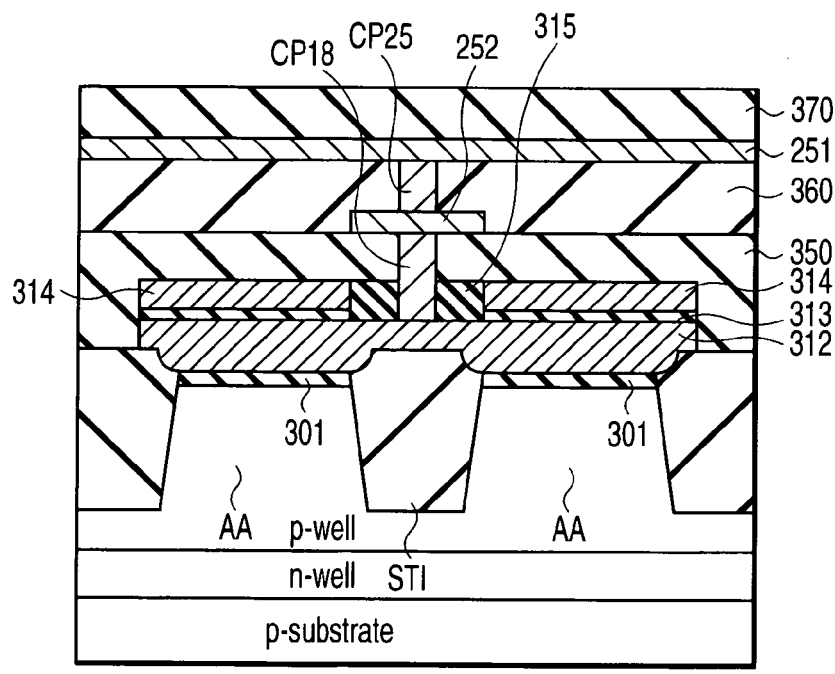
F I G. 6 4

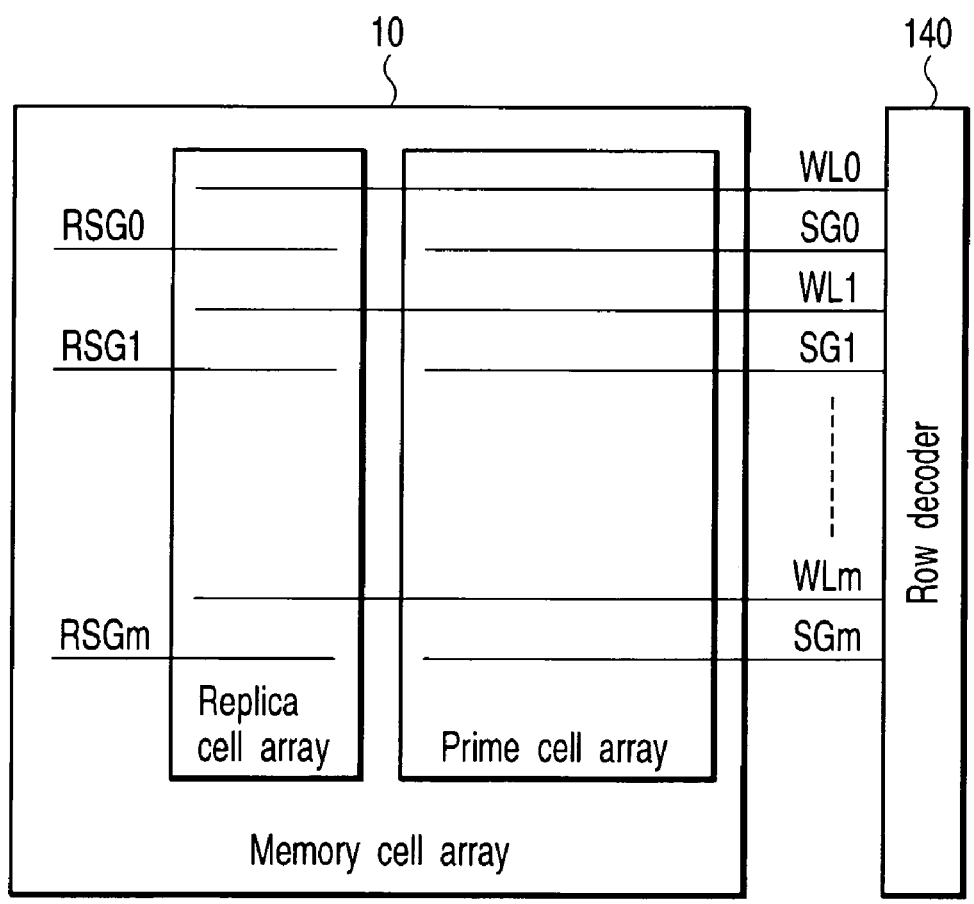
F I G. 67

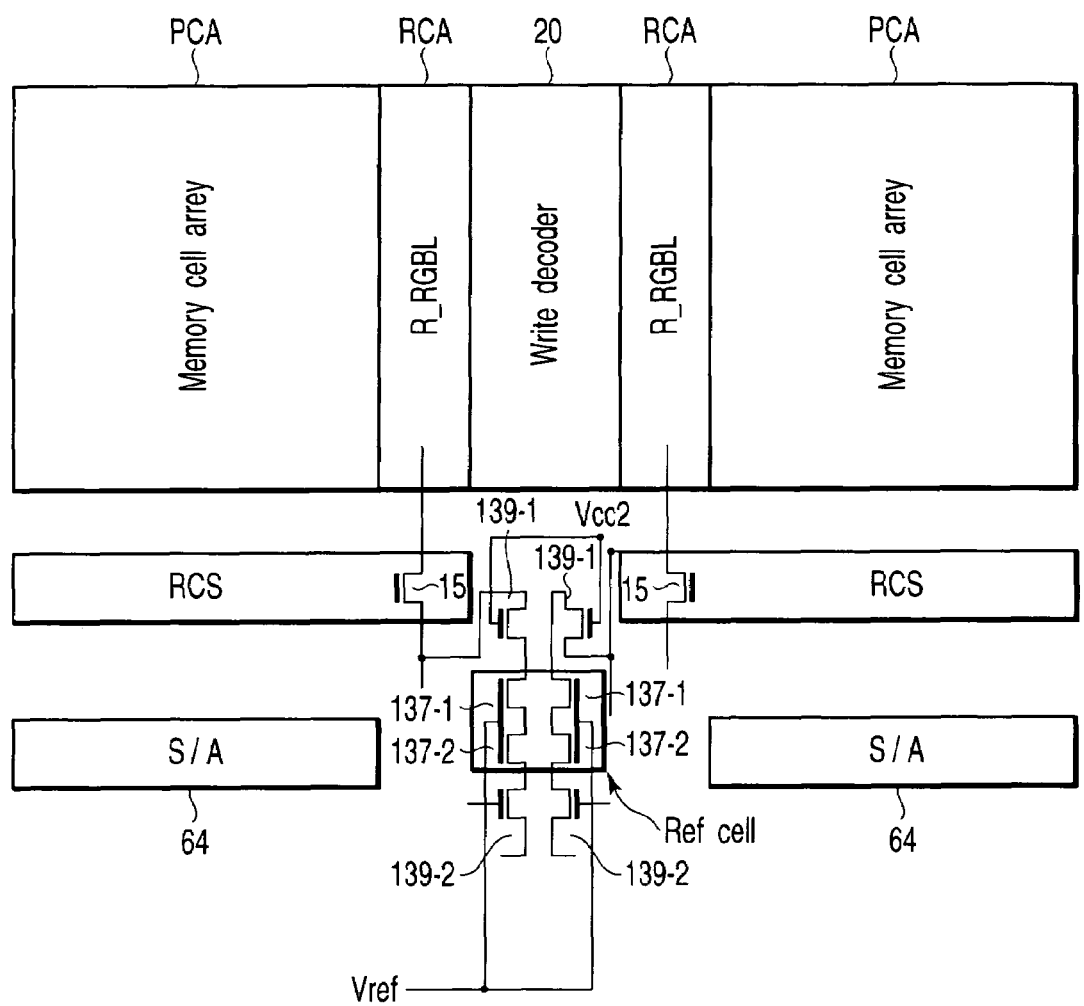
F I G. 70

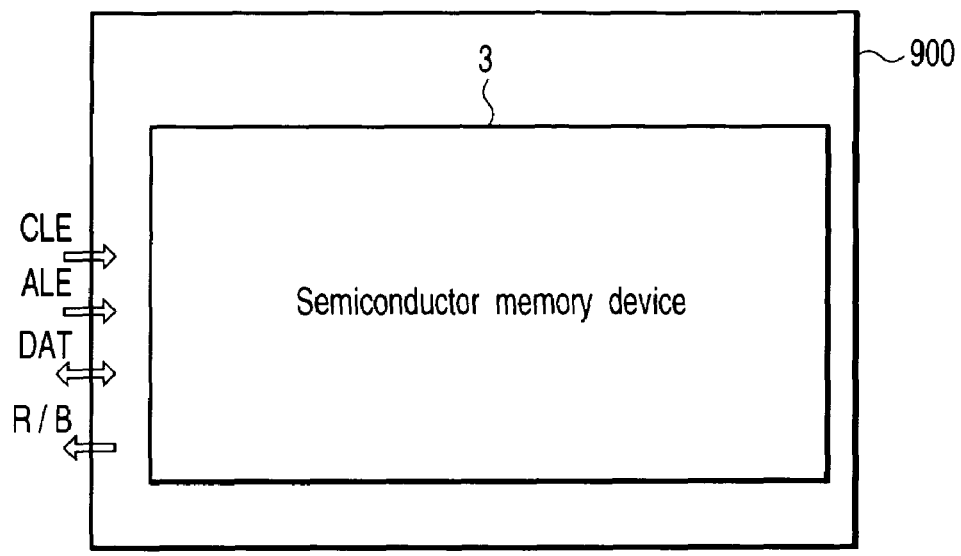
F I G. 71
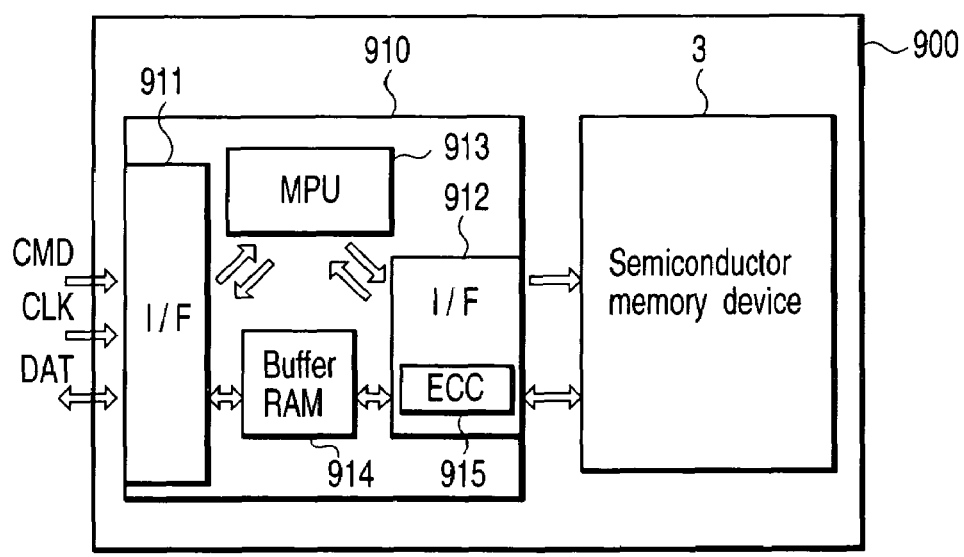
F I G. 72

TWO-TRANSISTOR FLASH MEMORY DEVICE USING REPLICA CELL ARRAY TO CONTROL THE PRECHARGE/DISCHARGE AND SENSE AMPLIFIER CIRCUITS OF THE PRIMARY CELL ARRAY

CROSS-REFERENCE TO RELATED APPLICATIONS

This application is based upon and claims the benefit of priority from prior Japanese Patent Application No. 2004-300823, filed Oct. 14, 2004, the entire contents of which are incorporated herein by reference.

BACKGROUND OF THE INVENTION

1. Field of the Invention

This invention relates to a semiconductor memory device and a method of controlling the same. More specifically, this invention relates to a nonvolatile semiconductor memory device with MOS transistors each having a floating gate and a control gate.

2. Description of the Related Art

NOR and NAND flash memories have been widely used as nonvolatile semiconductor memory devices.

In recent years, a flash memory combining the features of the NOR flash memory and the NAND flash memory has been proposed. This type of flash memory has been disclosed in, for example, Wei-Hua Liu, "A 2-Transistor Source-select (2TS) Flash EEPROM for 1.8-V-Only Application," Non-Volatile Semiconductor Memory Workshop 4.1, 1997. A flash memory of this type (hereinafter, referred to as a 2Tr flash memory) has memory cells each of which includes two MOS transistors. In such a memory cell, one MOS transistor, which functions as a nonvolatile memory section, includes a control gate and a floating gate and is connected to a bit line. The other MOS transistor, which is connected to a source line, is used to select a memory cell.

In a semiconductor memory, a bit line is precharged or discharged, thereby reading the data. At this time, if the bit line is not precharged or discharged sufficiently, the data can be read erroneously. A method of solving this problem has been proposed in, for example, Nobuyuki O., et al., "Circuit Techniques for 1.5-V Power Supply Flash Memory," IEEE Journal of Solid-State Circuits, Vol. 32, No. 8, August, 1997, pp. 1217-1230 and Rino M., et al., "The Flash Memory Read Path: Building Blocks and Critical Aspects," PROCEEDINGS OF THE IEEE, Vol. 91, No. 4, April, 2003, pp. 537-553.

However, these methods have a problem: erroneous reading cannot be dealt with sufficiently by, for example, a 2Tr flash memory. In a 2Tr flash memory, there is a channel capacitance in a bit line even when the word line potential is zero. In addition, disturbance in a write or a read operation can make the threshold value of the memory cell fluctuate. As a result, even if a replica circuit is provided, it is difficult to perform control to keep the precharge time and discharge time constant.

BRIEF SUMMARY OF THE INVENTION

A semiconductor memory device according to an aspect of the present invention includes:

first memory cells each of which has a first MOS transistor including a floating gate and a control gate, and a second MOS transistor having a drain connected to a source of the first MOS transistor;

a first cell array in which the first memory cells are arranged in a matrix;

second memory cells each of which has a third MOS transistor including a floating gate and a control gate, and a fourth MOS transistor having a drain connected to a source of the third MOS transistor;

a second cell array which includes the second memory cells;

a memory cell array which includes the first cell array and the second cell array;

first bit lines each of which electrically connects commonly the drains of the first MOS transistors in a same column in the first cell array;

second bit lines each of which electrically connects commonly the drains of the third MOS transistors in a same column in the second cell array;

a first precharge circuit which precharges the first bit lines in a read operation;

a sense amplifier which amplifies the data read from the first memory cells in the read operation; and a read control circuit which precharges and discharges the second bit lines in the read operation and, on the basis of the time required to precharge and discharge the second bit lines, controls the first precharge circuit and the sense amplifier.

A method of controlling a semiconductor memory device which includes a first and a second memory cell array each of which has memory cells each including a first MOS transistor having a floating gate and a control gate and a second MOS transistor having a drain connected to a source of the first MOS transistor, and word lines each of which connects commonly the control gates of the first MOS transistors in a same row, the method according to an aspect of the present invention includes:

erasing all of the memory cells included in the first and second memory cell arrays;

injecting electrons into the floating gates of the memory cells connected to m (m is an integer) of the word lines included in the second memory cell array and making the threshold voltages of the memory cells positive;

comparing the time required to discharge bit lines each of which connects commonly the drains of the first MOS transistors in a same column in the first memory cell array with the time required to discharge second bit lines each of which connects commonly the drains of the first MOS transistors in a same column in the second memory cell array; and decreasing the value of m and returning to the erasing all of the memory cells, if the result of the comparison shows that the second bit lines took a shorter time to discharge than the bit lines.

A memory card according to an aspect of the present invention includes a semiconductor memory device, the device including:

first memory cells each of which has a first MOS transistor including a floating gate and a control gate, and a second MOS transistor having a drain connected to a source of the first MOS transistor;

a first cell array in which the first memory cells are arranged in a matrix;

second memory cells each of which has a third MOS transistor including a floating gate and a control gate, and a fourth MOS transistor having a drain connected to a source of the third MOS transistor;

a second cell array which includes the second memory cells;

a memory cell array which includes the first cell array and the second cell array;

first bit lines each of which electrically connects commonly the drains of the first MOS transistors in a same column in the first cell array;

second bit lines each of which electrically connects commonly the drains of the third MOS transistors in a same column in the second cell array;

a first precharge circuit which precharges the first bit lines in a read operation;

a sense amplifier which amplifies the data read from the first memory cells in the read operation; and a read control circuit which precharges and discharges the second bit lines in the read operation and, on the basis of the time required to precharge and discharge the second bit lines, controls the first precharge circuit and the sense amplifier.

BRIEF DESCRIPTION OF THE SEVERAL VIEWS OF THE DRAWING

FIG. 15 is a sectional view taken along line 15-15 of FIG. 7;

FIG. 16 is a sectional view taken along line 16-16 of FIG. 7;

FIG. 28 is a timing chart for various signals in the operation of the 2Tr flash memory according to the first embodiment;

FIG. 50 is a block diagram of the memory cell array included in the 2Tr flash memory according to the third embodiment;

FIGS. 52 to 55 are timing charts for various signals in a read operation of the 2Tr flash memory according to the third embodiment;

FIG. 56 is a block diagram of a system LSI according to a fourth embodiment of the present invention;

FIGS. 63 and 64 are sectional views of a 2Tr flash memory according to a second modification of the second embodiment;

FIG. 67 is a block diagram of the memory cell array included in a 2Tr flash memory according to a third modification of each of the first to fourth embodiments;

FIG. 70 is a circuit diagram of a part of the 2Tr flash memory according to the third modification of each of the first to fourth embodiments;

FIG. 71 is a block diagram of a memory card including a flash memory according to the first to fourth embodiments;

FIG. 72 is a block diagram of a memory card including a flash memory according to the first to fourth embodiments;

DETAILED DESCRIPTION OF THE INVENTION

Figure 1:
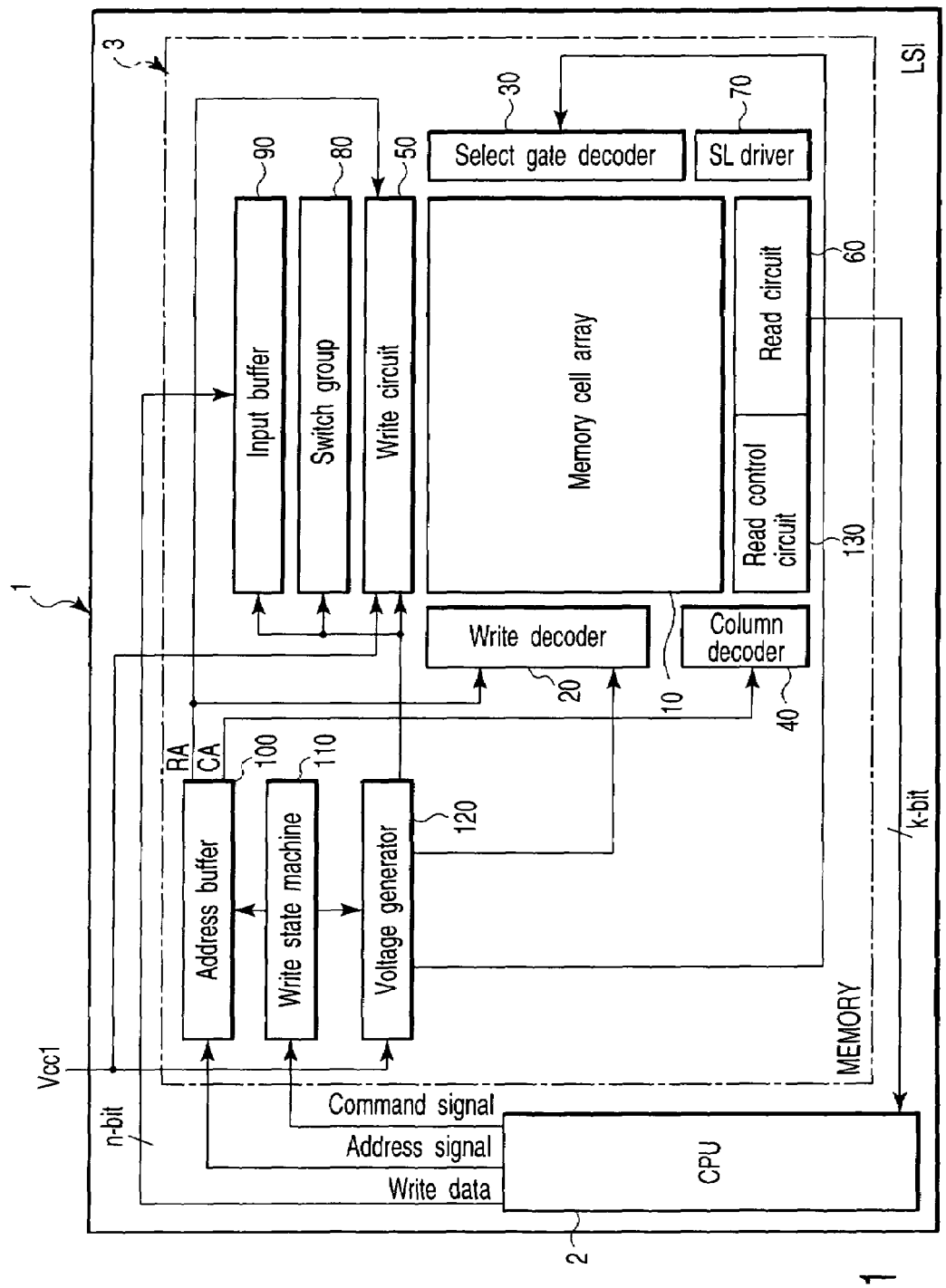
FIG. 1 is a block diagram of a system LSI according to a first embodiment of the present invention.

Referring to FIG. 1, a semiconductor memory device according to a first embodiment of the present invention will be explained. FIG. 1 is a block diagram of a system LSI according to the first embodiment.

As shown in FIG. 1, the system LSI 1 comprises a CPU 2 and a 2Tr flash memory 3. The CPU 2 exchanges data with the flash memory 3. The flash memory 3 comprises a memory cell array 10, a write decoder 20, a select gate decoder 30, a column decoder 40, a write circuit 50, a read circuit 60, a source line driver 70, a switch group 80, an input buffer 90, an address buffer 100, a write state machine 110, a voltage generator 120, and a read control circuit 130. A voltage of Vcc1 (1.25 to 1.65V) is externally applied to the LSI 1.

Figure 2:
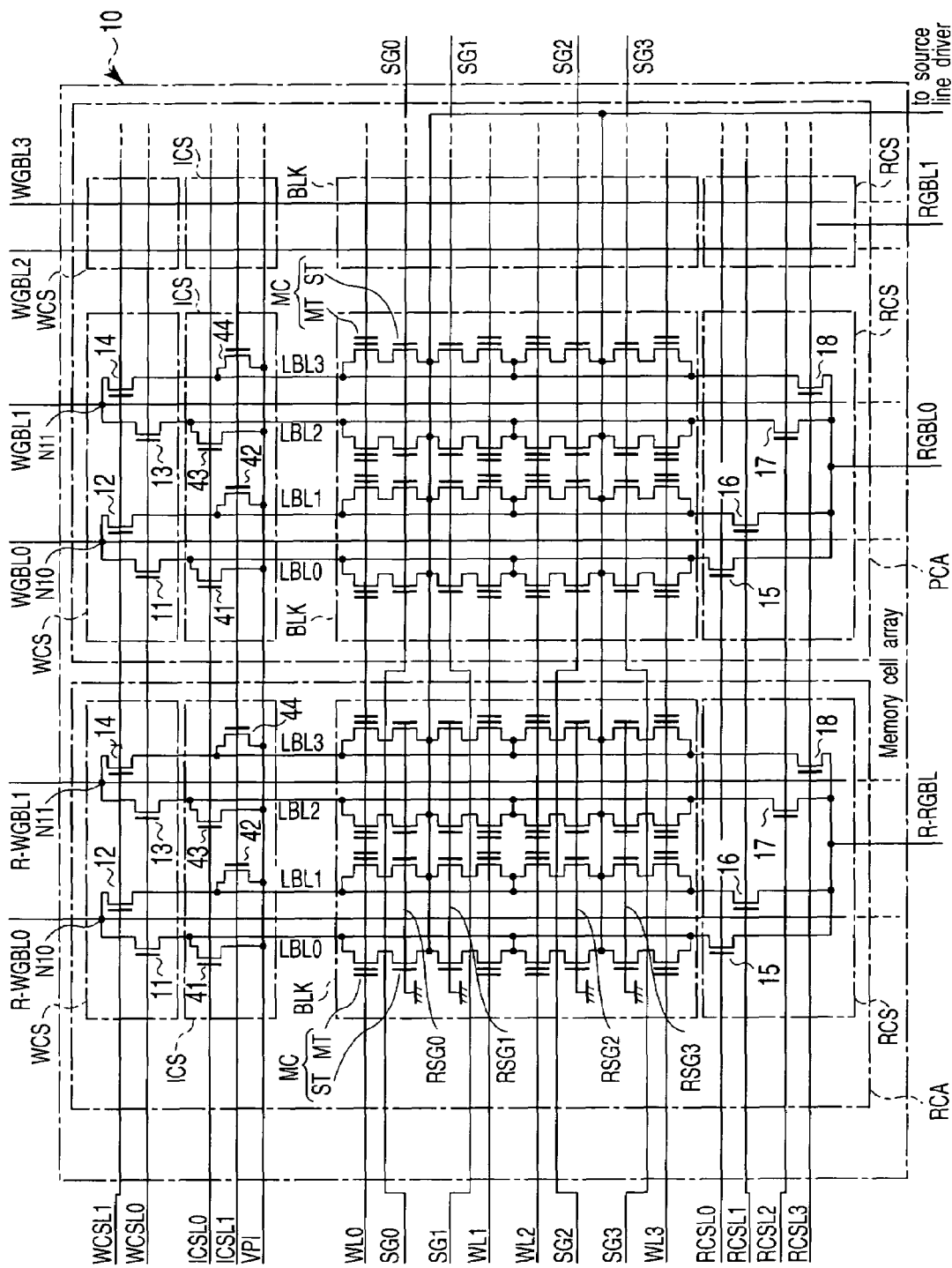
FIG. 2 is a circuit diagram of the memory cell array of a 2Tr flash memory according to the first embodiment.

The memory cell array 10 has a plurality of memory cells arranged in a matrix. Using FIG. 2, the configuration of the memory cell array 10 will be explained. FIG. 2 is a circuit diagram of a part of the memory cell array 10.

As shown in FIG. 2, the memory cell array 10 has a main cell array (hereinafter, referred to as a prime cell array PCA) and a replica cell array RCA.

The prime cell array PCA has (m+1)×(n+1) memory cell blocks BLK (m and n are natural numbers). The prime cell array PCA further has write column selectors WCS, read column selectors RCS, and write inhibit column selectors ICS, which are provided for the memory cell blocks BLK in a one-to-one correspondence. The replica cell array RCA has (m+1)×1 memory cell blocks BLK. The replica cell array RCA further has write selectors WCS, read column selectors RCS, and write inhibit column selectors ICS, which are provided for the memory cell blocks in a one-to-one correspondence. Although the number of columns of memory cell blocks included in the replica cell array RCA is one in FIG. 2, it may be more than one.

Each of the memory cell blocks BLK includes a plurality of memory cells MC. The memory cells MC is the memory cells of a 2Tr flash memory. Specifically, each of the memory cells MC includes a memory cell transistor MT and a select transistor ST. The source of the memory cell transistor MT is connected to the drain of the select transistor ST. The memory cell transistor MT has a stacked gate structure that includes a floating gate on a semiconductor substrate with a gate insulating film interposed therebetween and a control gate on the floating gate with an inter-gate insulating film interposed therebetween. Memory cells MC adjoining each other in the column direction share the drain region of the memory cell transistor MT or the source region of the select transistor ST. Each of the memory cell blocks BLK includes (4×4) memory cells MC. Although the number of memory cells MC arranged in the column direction is 4 in FIG. 2, this is illustrative and not restrictive. For instance, the number of memory cells MC may be 8 or 16. The drain regions of the memory cell transistors MT arranged in four columns are connected to four local bit lines LBL0 to LBL3 in a one-to-one correspondence. One end of each of local bit lines LBL0 to LBL3 is connected to a write column selector WCS and the other end is connected to a read column selector RCS.

The memory cells MC in the prime cell array PCA are used to store data, whereas the memory cells MC in the replica cell array RCA are not used to store data but used to control the reading of the data from the prime cell array PCA. Hereinafter, to distinguish the memory cells in the prime cell array PCA from those in the replica cell array RCA, the former are called the prime cells PC and the latter the replica cells RC.

In the memory cell array 10, the control gates of the memory cell transistors MT in a same row are connected commonly to any one of the word lines WL0 to WL(4m+3). Each of the local bit lines LBL0 to LBL3 connects the memory cell transistors to one another only in each of the memory cell blocks BLK, whereas each of the word lines WL connects the memory cell transistors in a same row to one another even across the memory cell blocks. In addition, each of the word lines WL further connects the memory cell transistors in the same row to one another even across the prime cell array PCA and replica cell array RCA.

In the prime cell array PCA, the gates of the select transistors ST in a same row are connected commonly to any one of the select gate lines SG0 to SG(4m+3). Each of the select gate lines SG0 to SG(4m+3) connects the gates of the select transistors in the same row to one another even across the memory cell blocks. In the replica cell array RCA, the gates of the select transistors ST in the same row are connected commonly to any one of the replica select gate lines RSG0 to RSG(4m+3).

Word lines WL0 to WL(4m+3) are connected to the write decoder 20. One end of each of the select gate lines SG0 to SG(4m+3) is connected to the select gate decoder 30. The other ends of the select gate lines cross the replica cell array RCA and are connected to the write decoder 20. That is, the replica cell array RCA is provided at the end of the memory cell array 10 and is most separate from the select gate decoder 30. The replica select gate lines RSG0 to RSG(4m+3) are isolated from select gate lines SG0 to SG(4m+3) and are set to the same potential (VPW) as that of the well region in which the memory cell array 10 is formed. The source regions of the select transistors ST are connected to one another between memory cell blocks BLK and are connected to the source line driver 70.

Next, the configuration of a write column selector WCS will be explained. Each of the write column selectors WCS includes four MOS transistors 11 to 14. One end of the current path of each of the MOS transistors 11 to 14 is connected to one end of the corresponding one of local bit lines LBL0 to LBL3. The other ends of the current paths of the MOS transistors 11 and 12 are connected to each other and the other ends of the current paths of the MOS transistors 13 and 14 are connected to each other. Hereinafter, the common junction node of the MOS transistors 11 and 12 is called node N10 and the common junction node of the MOS transistors 13 and 14 is called node N11. The gates of the MOS transistors 11 to 14 are connected to any one of write column select lines WCSL0 to WCSL(2m+1). The MOS transistors 11, 13 included in the write column selectors WCS in a same row are connected to the same one of the write column select lines WCSL(h−1) (h: 1, 3, 5, . . . ). The MOS transistors 12, 14 included in the write column selectors WCS in the same row are connected to the same one of the write column select lines WCSLh. One of the write column select lines WCSL0 to WCSL(2m+1) is selected by the column decoder 40 in a write operation.

Each of the nodes N10, N11 in the prime cell array PCA is connected to any one of the write global bit lines WGBL0 to WGBL(2n+1). The nodes N10, N11 in the replica cell array RCA are connected to the replica write global bit lines R_WGBL0, R_WGBL1, respectively. Each of the write global bit lines WGBL0 to WGBL(2n+1) and replica write global bit lines R_WGBL0, R_WGBL1 connects commonly the nodes N10 or nodes N11 of the first column selectors WCS in a same column.

Next, the configuration of a read column selector RCS will be explained. Each of the read column selectors RCS includes four MOS transistors 15 to 18. One end of the current path of each of the MOS transistors 15 to 18 is connected to one end of the corresponding one of the local bit lines LBL0 to LBL3. The other ends of the current paths of the MOS transistors 15 and 18 are connected to each other. Hereinafter, the common junction node of the MOS transistors 15 and 18 is called node N20. Each of the gates of the MOS transistors 15 to 18 is connected to a different one of the read column select lines RCSL0 to RCSL(4m+3). Each of the MOS transistors 15 to 18 included in the read column selectors RCS in a same row is connected to the same one of the read column select lines RCSL0 to RCSL (4m+3). One of the read column select lines RCSL0 to RCSL(4m+3) is selected by the column decoder 40 in a read operation.

Node N20 in the prime cell array PCA is connected to any one of the read global bit lines RGBL0 to RGBLn. Node N20 in the replica cell array RCA is connected to the replica read global bit line R_RGBL. Each of the read global bit lines RGBL0 to RGBLn and replica read global bit line R_RGBL connects commonly the nodes N20 of the first column selectors RCS in a same column.

Next, the configuration of a write inhibit column selector ICS will be explained. Each of the write inhibit column selectors ICS includes four MOS transistors 41 to 44. One end of the current path of each of the MOS transistors 41 to 44 is connected to one end of the corresponding one of the local bit lines LBL0 to LBL3. A write inhibit voltage VPI is applied commonly to the other ends of the current paths of the MOS transistors 41 and 44. The write inhibit voltage VPI is generated by the voltage generator 120. The gates of the MOS transistors 41 to 44 are connected to any one of the write inhibit column select lines ICSL0 to ICSL(2m+1). The MOS transistors 41, 43 included in the write inhibit column selectors ICS in a same row are connected to the same one of the write column select lines WCSL(h−1) (h: 1, 3, 5, . . . ). The MOS transistors 42, 44 included in the write column selectors ICS in the same row are connected to the same one of the write column select lines WCSLh. One of the write inhibit column select lines ICSL0 to ICSL(2m+1) are selected by the column decoder 40 in a write operation.

The configuration of the memory cell array 10 can also be explained as follows. In the memory cell array 10, a plurality of memory cells MC are arranged in a matrix. The control gates of the memory cell transistors MC of the memory cell MCs in a same row are connected commonly to a word line. The gates of the select transistors of the memory cells in the same row are connected to a select gate line. The drains of the memory cell transistors MT of four memory cells MC in a same column are connected commonly to any one of the local bit lines LBL0 to LBL3. Specifically, the memory cells MC in the memory cell array 10 are connected to a different one of the different local bit lines LBL0 to LBL3 in units of four memory cells MC arranged in a line. Then, one end of each of the local bit lines LBL0 in a same column and one end of each of the local bit lines LBL1 in a same column are connected commonly to any one of the write global bit lines WGBL0 to WGBL(2n+1) via the MOS transistors 11, 12, respectively. Moreover, one end of each of the local bit lines LBL2 in a same column and one end of each of the local bit lines LBL3 in a same column are connected commonly to any one of the write global bit lines WGBL- to WGBL(2n+1) via the MOS transistors 13, 14, respectively. The other ends of local bit lines LBL0 to LBL3 in the same column are connected equally to any one of the read global bit lines RGBL0 to RGBLn via the MOS transistors 15 to 18. Furthermore, local bit lines LBL0 to LBL3 are connected via the MOS transistors 41 to 44 to write inhibit nodes, respectively. Then, the sources of the select transistors ST of the memory cells MC are connected to one another and then are connected to the source line driver. In the memory cell array with the above configuration, four columns of four memory cells MC connected to the same local bit line makes a single memory block BLK. The memory cell blocks in a same column are connected to a common write global bit line and a common read global bit line. The memory cell blocks BLK in a different column are connected to a different write global bit line and a different read global bit line.

In the above configuration, the memory cells MC in the memory cell block BLK located farthest away from the select gate decoder 30 function as replica cells.

The number of memory cells in a memory cell block, the number of read global bit lines RGBL, and the number of write global bit lines WGBL are not limited to the embodiment. The parasitic capacitance of each of the local bit lines LBL0 to LBL3 in the prime cell array PCA is equal to or lower than that of each of the local bit lines LBL0 to LBL3 in the replica cell array RCA. This relationship holds even when all of the prime cells PC connected to the local bit lines LBL0 to LBL3 in the prime cell array PCA are in an erase state.

The input buffer 90 holds the write data supplied from the CPU 2.

The switch group 80 transfers the write data held at the input buffer 30 to the write circuit 50.

Figure 3:
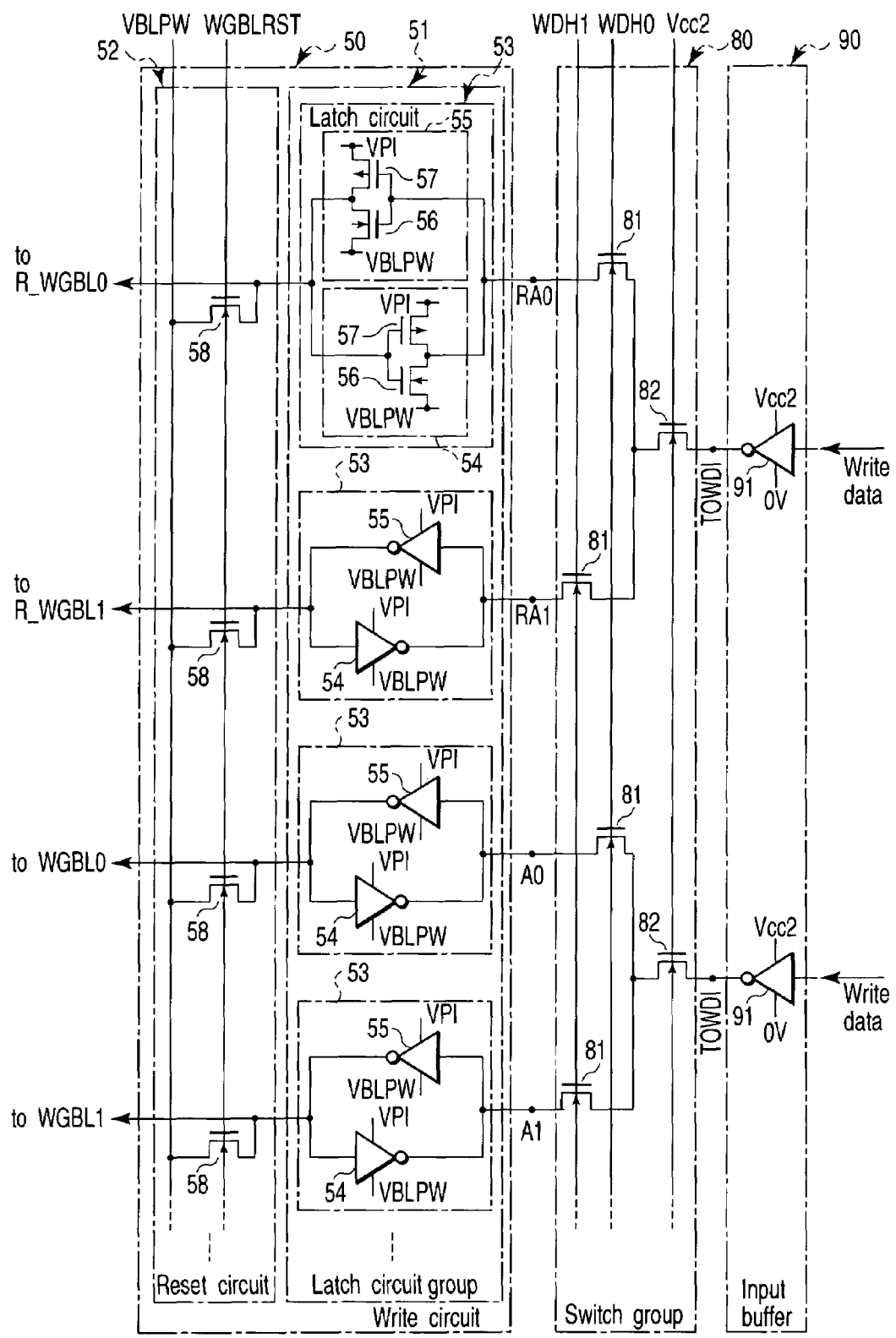
FIG. 3 is a circuit diagram of the write selector, write circuit, and switch group included in the 2Tr flash memory according to the first embodiment.

The configuration of each of the write circuit 50, switch group 80, and input buffer 90 will be explained using FIG. 3. FIG. 3 is a circuit diagram of the write circuit 50, switch group 80, and input buffer 90.

First, the write circuit 50 will be explained. The write circuit 50 includes a latch circuit group 51 and a reset circuit 52. The latch circuit group 51 has latch circuits 53 provided for write global bit lines WGBL0 to WGBL(2n+1), R_WGBL0, R_WGBL1 in a one-to-one correspondence. Each of the latch circuits 53 includes two inverters 54, 55. The input terminal of the inverter 54 is connected to the output terminal of the inverter 55. The output terminal of the inverter 54 is connected to the input terminal of the inverter 55. The junction node of the input terminal of the inverter 54 and the output terminal of the inverter 55 makes the output node of the latch circuit 53 and is connected to the corresponding write global bit line and replica write global bit line. Each of the inverters 54, 55 includes an n-channel MOS transistor 56 and a p-channel MOS transistor 57 which have their current paths connected in series. The source of the n-channel MOS transistor 56 is connected to VBLPW node and the source of the p-channel MOS transistor 57 is connected to write inhibit voltage node VPI. The gate of the n-channel MOS transistor 56 and the gate of the p-channel MOS transistor 57 are connected to each other. The junction node of the drain of the p-channel MOS transistor 57 and the drain of the n-channel MOS transistor 56 in the inverter 55 is connected to the junction node of the gate of the p-channel MOS transistor 57 and the gate of the n-channel MOS transistor 56 in the inverter 54 and is further connected to the corresponding write global bit line. In addition, the junction node of the drain of the p-channel MOS transistor 57 and the drain of the n-channel MOS transistor 56 in the inverter 54 is connected to the junction node of the gate of the p-channel MOS transistor 57 and the gate of the n-channel MOS transistor 56 in the inverter 55. The junction node makes the input node of the latch circuit 53.

The reset circuit 52 has n-channel MOS transistors 58 provided for write global bit lines WGBL0 to WGBL(2n+1), R_WGBL0, R_WGBL1 in a one-to-one correspondence. The drain of each of the n-channel MOS transistors 58 is connected to the corresponding write global bit line. The n-channel MOS transistors have their sources connected commonly to VBLPW node and their gates connected commonly to WGBLRST node.

The switch group 80 has n-channel MOS transistors 81 and n-channel MOS transistors 82, which are provided for the latch circuits 53 in a one-to-one correspondence. One end of the current path of each of the MOS transistors 81 is connected to the input node of the corresponding latch circuit 53. The other ends of the current paths of two MOS transistors 81 connected to adjacent latch circuits are connected to each other. That is, MOS transistors 81 connected to the latch circuits 53 corresponding to write global bit lines WGBL0, WGBL1 have the other ends of their current paths connected to each other. The same holds true for the MOS transistors 81 connected to the latch circuits 53 corresponding to write global bit lines WGBL2, WGBL3 and for replica write global bit lines R_WGBL0, R_WGBL1. The gates of the MOS transistors 81 connected to the latch circuits 53 corresponding to write global bit lines WGBL(h−1) (h=1, 3, 5, . . . ) are connected commonly to WDH0 node. The gates of the MOS transistors 81 connected to the latch circuits 53 corresponding to the write global bit lines WGBLh are connected commonly to WDH1 node. The other ends of the current paths of the MOS transistors 81 connected to one another are connected to one end of the current path of the MOS transistor 82. A positive voltage Vcc2 (nearly 3V) is applied simultaneously to the gates of the MOS transistors 82. The positive voltage Vcc2 is generated by, for example, the voltage generator 120. Hereinafter, the junction nodes of the MOS transistors 81 corresponding to the prime cell array PCA and the input nodes of the latch circuits 53 are called node A0 to node A(2n+1). The nodes corresponding to the replica cell array are called RA0 and RA1.

Next, the input buffer 90 will be explained. The input buffer 90 includes inverters 91 provided for the MOS transistors 82 in the switch group 80 in a one-to-one correspondence. The write data supplied from the CPU 2 is input to the input node of each of the inverters 91. The output node of the inverter 91 is connected to the other end of the current path of the corresponding MOS transistor 82. The inverter 91 operates using Vcc2 as its high-voltage-side power supply potential and 0V as its low-voltage-side power supply potential. Hereinafter, the junction nodes of the output nodes of the inverters 91 corresponding to the prime cell array PCA and the MOS transistors 82 are called node TOWDI0 to node TOWDI((2n+1)/2). The nodes corresponding to the replica cell array are simply called TOWDI.

Referring to FIG. 1, the explanation will be continued.

The column decoder 40 decodes a column address signal, thereby producing a column address decode signal. On the basis of the column address decode signal, the column select lines WCSL, RCSL, ICSL are selected.

In a read operation, the read circuit 60 precharges read global bit lines RGBL0 to RGBLn and amplifies the data read onto read global bit lines RGBL0 to RGBLn.

The read control circuit 130, in a read operation, precharges and discharges the replica read global bit lines R_RGBL. Then, on the basis of the precharge time and discharge time of the replica read global bit lines R_RGBL, the read control circuit 130 controls the read circuit 60.

Figure 4:
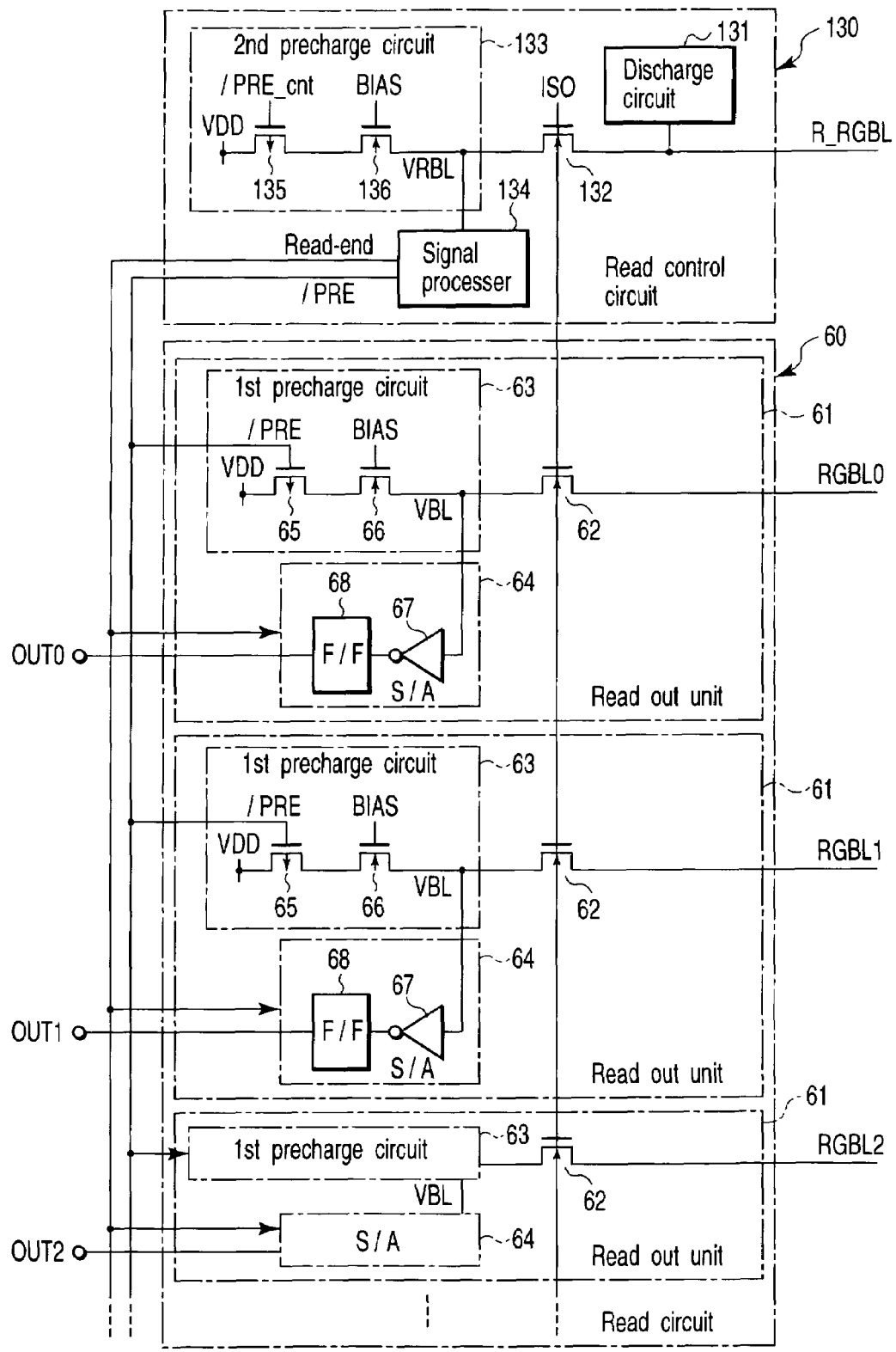
FIG. 4 is a circuit diagram of the read circuit and read control circuit included in the 2Tr flash memory according to the first embodiment.

The configuration of each of the read circuit 60 and read control circuit 230 will be explained using FIG. 4. FIG. 4 is a circuit diagram of the read circuit 60 and read control circuit 130.

The read circuit 60 includes read units 61 provided for read global bit lines RGBL0 to RGBLn in a one-to-one correspondence. Each of the read units 61 includes a MOS transistor 62, a first precharge circuit 63, and a sense amplifier 64.

Each of the first precharge circuits 63 precharges the corresponding one of the read global bit lines RGBL0 to RGBLn in a read operation. The first precharge circuit 63 includes a p-channel MOS transistor 65 and an n-channel MOS transistor 66. The source of the p-channel MOS transistor 65 is connected to a power supply voltage VDD (e.g., 1.3V). A precharge signal /PRE is input to its gate. The drain of the n-channel MOS transistor 66 is connected to the drain of the MOS transistor 65. A bias signal BIAS is input to its gate.

The sense amplifier 64 amplifies the data read onto the corresponding one of the read global bit lines RGBL0 to RGBLn in a read operation. The sense amplifier 64 includes an inverter 67 and a flip-flop 68. The input node of the inverter 67 is connected to the source of the MOS transistor 66. The output node of the inverter 67 is connected to the input node of the flip-flop 68. The amplified read data is output at the corresponding one of the output nodes OUT0 to OUtn of the flip-flops 68.

One end of the current path of the MOS transistor 62 is connected to the corresponding one of the read global bit lines RGBL0 to RGBLn. The other end of its current path is connected to the source of the MOS transistor 66 and the input node of the inverter 67. The n-channel MOS transistor is used as isolating MOS transistor 62. That is, the first precharge circuit 63 and sense amplifier 64 are connected to the corresponding one of the read global bit lines RGBL0 to RGBLn via the isolating MOS transistor 62. Then, the gates of all of the MOS transistors 62 are connected to one another. A signal ISO is input to the common junction of the gates.

Next, the read control circuit 130 will be explained. The read control circuit 130 includes a discharge circuit 131, a MOS transistor 132, a second precharge circuit 133, and a signal generator 134.

The second precharge circuit 133, in a read operation, precharges the replica read global bit lines R_RGBL. The second precharge circuit 133 has the same configuration as that of the first precharge circuit and the same precharging capability as that of the latter. The second precharge circuit 133 includes a p-channel MOS transistor 135 and an n-channel MOS transistor 136. The p-channel MOS transistor 135 has its source connected to a power supply voltage VDD. A precharge control signal /PRE_cnt is input to its gate. The n-channel MOS transistor 136 has its drain connected to the drain of the MOS transistor 135. A bias signal BIAS is input to its gate.

The MOS transistor 132 is an n-channel MOS transistor one end of whose current path is connected to the replica read global bit line R_RGBL and the other end of whose current path is connected to the source of the MOS transistor 136. That is, the second precharge circuit 133 is connected to the replica read global bit lines R_RGBL via the MOS transistor 132. The gate of the MOS transistor 132 is connected to the gate of the MOS transistor 62. To the junction node, a signal ISO is input.

The signal generator 134, in a read operation, generates a read end signal Read-end and a precharge signal /PRE on the basis of the source potential of the MOS transistor 136, that is, the potential on the replica read global bit line R_RGBL. The precharge signal /PRE is input to the gate of the MOS transistor 65 of the first precharge circuit 63 as described above. The read end signal Read-end is input to the flip-flop 68 of the sense amplifier 64. According to the read end signal Read-end, the flip-flop 68 determines the output.

Figure 5:
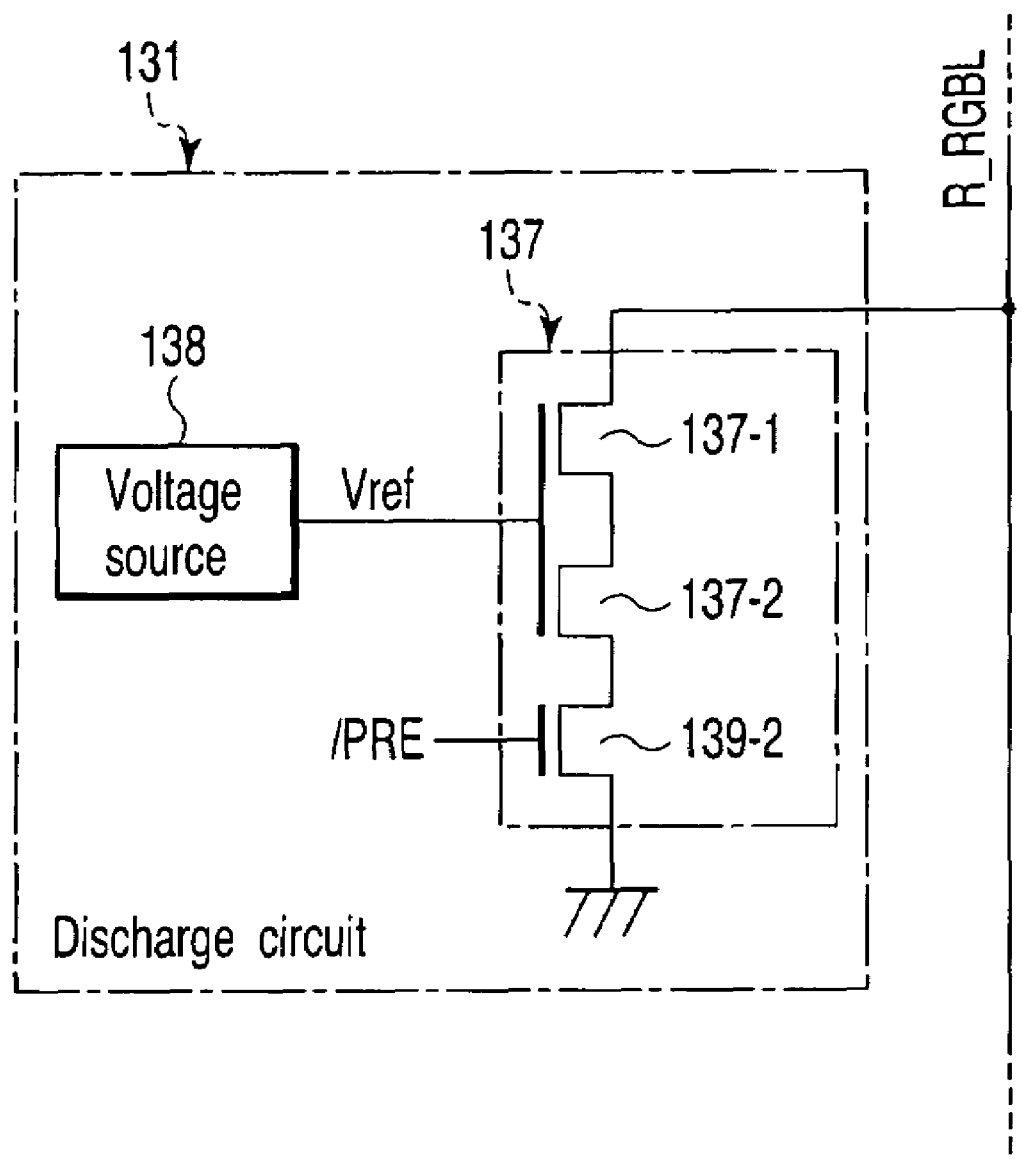
FIG. 5 is a circuit diagram of the discharge circuit included in the 2Tr flash memory according to the first embodiment.

The discharge circuit 131 discharges the replica read global bit lines R_RGBL. The configuration of the discharge circuit 131 will be explained using FIG. 5. FIG. 5 is a circuit diagram of the discharge circuit 131. As shown in FIG. 5, the discharge circuit 131 includes a current source circuit 137 and a voltage generator 138.

The voltage generator 138 outputs a constant voltage Vref when discharging the replica read global bit lines R_RGBL.

The current source circuit 137 discharges the replica read global bit lines R_RGBL by causing a current corresponding to the constant voltage Vref to flow. The current source circuit 137 includes n-channel MOS transistors 137-1, 137-2, 139-2. The MOS transistor 137-1 has its drain connected to the replica read global bit line R_RGBL and its source connected to the drain of the MOS transistor 137-2. The gates of the MOS transistors 137-1, 137-2 are connected to each other. To the junction node, the constant voltage Vref is applied. The source of the MOS transistor 137-2 is connected to the drain of the MOS transistor 139-2. The source of the MOS transistor 139-2 is grounded. The signal /PRE or signal /PRE-cnt is applied to the gate of the MOS transistor 139-2.

The MOS transistors 137-1, 137-2 may have the same configuration as, for example, that of a memory cell MC in the memory cell array 10. Specifically, the MOS transistor 137-1 corresponds to a memory cell transistor MT and the MOS transistor 137-2 corresponds to a select transistor ST. There is provided a contact plug connected to the floating gates of both transistors. The constant voltage Vref is applied to the contact plug.

Referring to FIG. 1, the explanation will be continued.

The source line driver 70 supplies a voltage to the source lines SL.

The address buffer 100 holds an address signal supplied from the CPU 2. Then, the address buffer 100 supplies a column address signal CA to the column decoder 40 and a row address signal RA to the write decoder 20 and select gate decoder 30.

The write state machine 110 controls the operation of each circuit included in the flash memory 3 on the basis of a command signal supplied from the CPU 2, thereby performing timing control in writing, erasing, or reading data, and executing a specific algorithm determined for each operation.

The voltage generator 120 generates a plurality of internal voltages on the basis of the voltage Vcc1 (about 1.25 to 1.65V) externally input. The voltage generator 120 has a negative charge pump circuit and a positive charge pump circuit. Then, the voltage generator 120 generates a negative voltage VBB1 (=−7V), VBB2 (=−8V) and positive voltages VPP (=12V) and Vcc2 (=3V).

Figure 6:
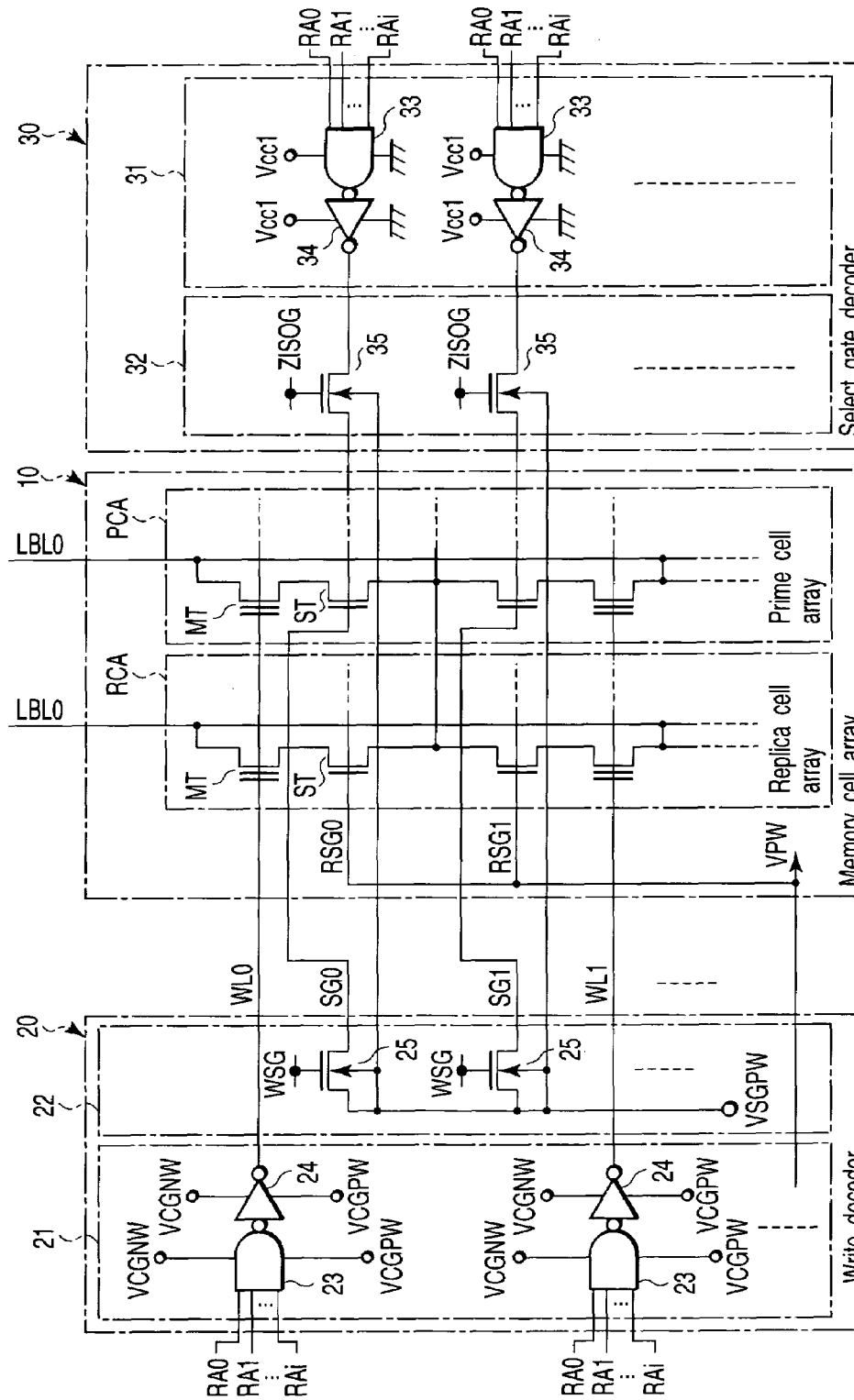
FIG. 6 is a circuit diagram of the memory cell array, write decoder, and select gate decoder included in the 2Tr flash memory according to the first embodiment.

Next, using FIG. 6, the configuration of the write decoder 20 and select gate decoder 30 will be explained. In a write operation, the write decoder 20 not only selects any one of the word lines WL0 to WL(4m+3) and applies a positive potential VPP (12V) to the selected word line but also applies a negative potential VBB1 (−7V) to all of the select gate lines SG0 to SG(4m+3). In an erase operation, the write decoder 20 applies a negative potential VBB2 (−8V) to all of the word lines and the positive voltage VPP to the p-well region in which the memory cell array has been formed.

In a read operation, the select gate decoder 30 selects any one of the select gate lines SG0 to SG(4m+3) and applies a potential Vcc2 (3V) to the selected select gate line. In addition, the select gate decoder 30 controls the signal ISO to control the operation of the isolating MOS transistor 62.

First, the configuration of the select gate decoder 30 will be explained. The select gate decoder 30 includes a row address decode circuit 31 and a switch element group 32. The row address decode circuit 31, which operates on the power supply voltage Vcc2, decodes (i+1)-bit row address signals RA0 to RAi, thereby producing a row address decode signal. The row address decode circuit 31 has NAND circuits 33 and inverters 34 provided for select gate lines SG0 to SG(4m+3) in a one-to-one correspondence. The NAND circuit 33 performs NAND operation on each bit in row address signals RA0 t RAi. Then, the inverter 34 inverts the result of the NAND operation and outputs the inverted value as a row address decode signal.

The switch element group 32 has n-channel MOS transistors 35. The n-channel MOS transistors 35 are provided for select gate lines SG0 to SG(4m+3) in a one-to-one correspondence. The outputs of the inverters 34 are supplied to select gate lines SG0 to SG(4m+3) via the current paths of the n-channel MOS transistors 35. A control signal ZISOG is input to the gates of the n-channel MOS transistors 35. The control signal ZISOG turns off the MOS transistors 35 in a write operation and turns on the MOS transistors 35 in a read operation.

Next, the configuration of the write decoder 20 will be explained. The write decoder 20 includes a row address decode circuit 21 and a switch element group 22. The row address decode circuit 21 decodes (i+1)-bit row address signals RA0 to RAi, thereby producing a row address decode signal. The row address signal is supplied to word line WL0 to WL(4m+3). The row address decode circuit 21 includes NAND circuits 23 and inverters 24 provided for word lines WL0 to WL(4m+3) in a one-to-one correspondence. The NAND circuit 23 and inverter 24 have their positive power supply voltage nodes connected to a power supply voltage node VCGNW and their negative power supply voltage node connected to a power supply voltage node VCGPW. The NAND circuit 23 performs NAND operation on each bit in the row address signals RA0 to RAi. Any one of Vcc1, 0V, the positive voltage VPP and negative voltages VBB1, VBB2 generated by the voltage generator 130 is applied to each of the power supply voltage nodes VCGNW, VCGPW. Then, the inverter 24 inverts the result of the NAND operation and outputs the result as a row address decode signal.

The switch element group 22 has n-channel MOS transistors 25. The n-channel MOS transistors 25 are provided for select gate lines SG0 to SG(4m+3) in a one-to-one correspondence. One end of the current path of each of the MOS transistors 25 is connected to the corresponding one of the select gate lines SG0 to SG(4m+3) and the other end is connected to VSGPW node. To VSGPW node, VBB1 and VPP generated by the voltage generator 120 or 0V is applied. A control signal WSG is input to the gate of the MOS transistor 25. The control signal WSG turns on the MOS transistors 25 in a write operation and turns off the MOS transistors 25 in an erase and a read operation.

The write decoder 20 also applies the voltage VPW to the semiconductor substrate (well region) in which the memory cell array 10 has been formed. The voltage VPW is also applied to replica select gate lines RSG0 to RSG(4m+3) connected to the well region.

Figure 7:
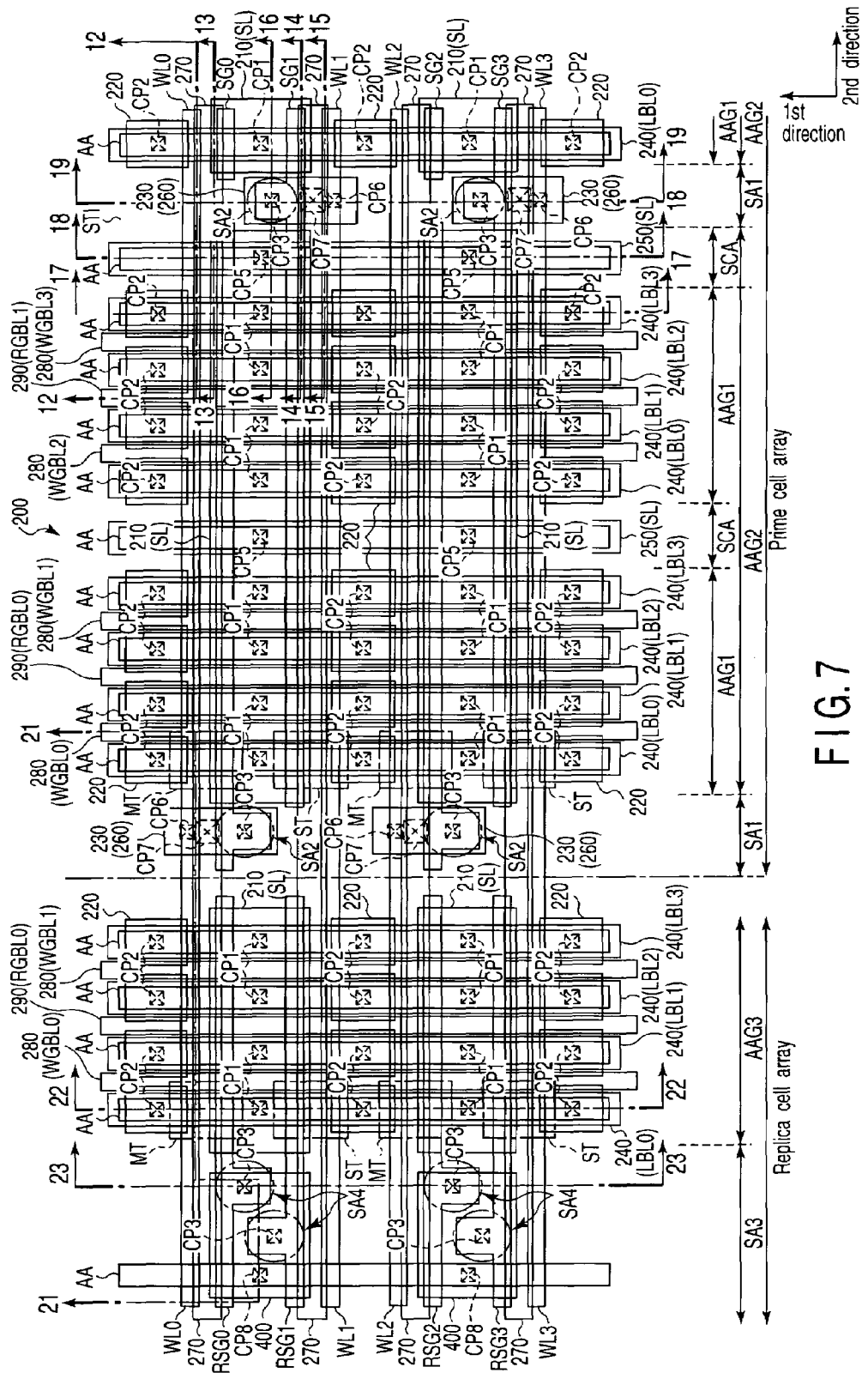
FIG. 7 is a plan view of the memory cell array included in the 2Tr flash memory according to the first embodiment.

Next, using FIGS. 7 to 11, a plane structure of the memory cell array 10 included in the 2Tr flash memory 3 will be explained. FIG. 7 is a plan view of a part of the memory cell array 10. FIGS. 8 to 11 are plan views showing plane patterns of metal wiring layers of a first to a fourth layer, respectively, together with element regions, word lines, and select gate lines. The regions shown correspond to FIG. 7.

As shown in FIGS. 7 to 11, in the semiconductor substrate (p-well region) 200, a plurality of strip-shaped element regions AA extending in a first direction are formed in a second direction perpendicular to the first direction. Then, strip-shaped word lines WL0 to WL(4m+3) are formed in the second direction so as to cross the element regions AA. In the prime cell array PCA, select gate lines SG0 to SG(4m+3) are formed parallel to word lines WL0 to WL(4m+3). In the replica cell array RCA, replica select gate lines RSG0 to RSG(4m+3) are formed parallel to word lines WL0 to WL(4m+3). Word lines WL0 to WL(4m+3) are electrically connected between the prime cell array PCA and the replica cell array RCA, whereas they electrically isolated from select gate lines SG0 to SG(4m+3) and replica select gate lines RSG0 to RSG(4m+3) between the array PCA and the array RCA. In the regions where word lines WL0 to WL(4m+3) cross the element regions AA, memory cell transistors MT are formed. In the regions where select gate lines SG0 to SG(4m+3) cross the element regions AA, and in the region where replica select gate lines RSG0 to RSG(4m+3) cross the element regions AA, select transistors ST are formed. In the regions where word lines WL0 to WL(4m+3) cross the element regions AA, floating gates (not shown) separated on a memory cell transistor MT basis are formed. Like a memory cell transistor MT, a select transistor ST has a control gate and a floating gate. However, unlike a memory cell transistor MT, the floating gates of select transistors ST adjoining in the second direction are connected to each other. Adjacent prime cells have their select gate lines SG or word lines WL adjoining each other. Adjacent replica cells have their replica select gate lines RSG or word lines WL adjoining each other.

Hereinafter, a group of four columns of element regions AA in the prime cell array PCA is referred to as a first element region group AAG1. A region where a column of element regions AA is formed between adjacent first element region groups AAG1 is referred to as a source contact region SCA. The memory cells MC formed in the first element region groups AAG1 are used for storing data. The memory cells MC in the source contact region SCA are dummy memory cells and are not used for storing data. A stitch region SA1 is formed every two columns of first element region groups AAG1. In the first embodiment, no element region AA is formed in the stitch region SA1. The width of the stitch region SA1 is equal to the sum of the width of an element region AA and the width of the element isolating region STI formed between element regions AA. On the stitch region SA1, too, word lines WL0 to WL(4m+3) and select gate lines SG0 to SG(4m+3) are formed. However, word lines WL0 to WL(4m+3) and select gate lines SG0 to SG(4m+3) existing in the stitch region SA1 do not practically form the memory cells. In the stitch regions SA1, a part of each of the select gate lines SG0 to SG(4m+3) is made wider so as to project particularly toward the adjacent select gate lines. The region is referred to as a shunt region SA2. The shunt regions SA2 are provided in select gate line SG0 to SG(4m+3) alternately. Specifically, in a stitch region SA1, a shunt region SA2 is formed in each of the select gate lines SG0, SG2, SG4, . . . . In another stitch region SA1 adjacent to the stitch region, a shunt region SA2 is formed in each of the select gate lines SG1, SG3, SG5, . . . . The select gate lines where no shunt region SA2 is formed are partially removed in the stitch regions SA1. Hereinafter, a region obtained by combining a first element region group AAG1 and a source contact region SCA is referred to as a second element region group AAG2.

Furthermore, a group of four columns of element regions AA in the replica cell array RCA is referred to as a third element region group AAG3. A region which adjoins a third element region group AAG3 and includes a column of element regions AA is referred to as a stitch region SA3. On the stitch region SA3, too, word lines WL0 to WL(4m+3) and replica select gate lines RSG0 to RSG(4m+3) are formed. However, word lines WL0 to WL(4m+3) and replica select gate lines RSG0 to RSG(4m+3) existing in the stitch region SA3 do not practically form the replica cells. As in the stitch region SA1, in the stitch regions SA3, a part of each of the replica select gate lines RSG0 to RSG(4m+3) is made wider so as to project particularly toward the adjacent select gate lines. Hereinafter, the region is referred to as a shunt region SA4.

Figure 8:
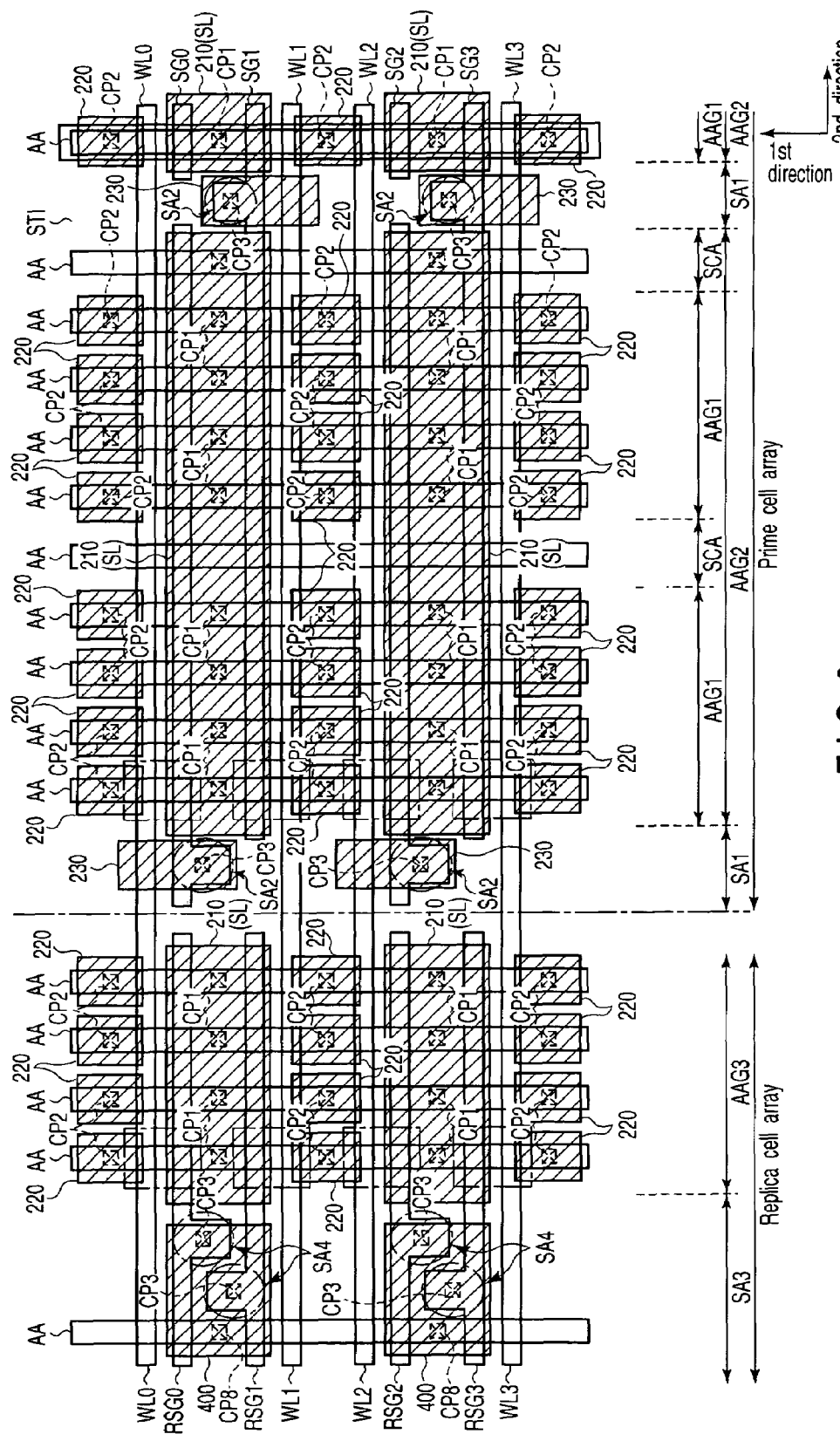
FIG. 8 is a plan view of the memory cell array included in the 2Tr flash memory according to the first embodiment, showing a plane pattern of a first-layer metal wiring layer.

Next, using FIGS. 7 and 8, a pattern of a first-layer metal wiring layer existing above word lines WL0 to WL(4m+3), select gate lines SG0 to SG(4m+3), and replica select gate lines RSG0 to RSG(4m+3) will be explained. In FIG. 8, the shaded region is a first-layer metal wiring layer.

First, the configuration of the prime cell array PCA will be explained. As shown in FIG. 8, between adjacent select gate lines SG (between SG0 and SG1, between SG2 and SG3, . . . ), a strip-shaped metal wiring layer 210 extending in the second direction is formed. The metal wiring layer 210 is a part of a source line SL. The metal wiring layers 210 are isolated from one another by stitch regions SA1 in its longitudinal direction (or the second direction). That is, the metal wiring layers 210 are independent on a second element region group AAG2 basis. Each of the metal wiring layer 210 is connected to the source region of a select transistor ST by a contact plug CP1. In the first embodiment, in the source contact region SCA, no contact plug CP1 is formed, with the result that the metal wiring layer 210 is not electrically connected to the source region of the memory cell in the source contact region SCA. On the drain region of the memory cell transistor MT in the first element region group AAG1, an island pattern of metal wiring layer 220 is formed. The metal wiring layers 220 are isolated from one another. Each of the metal wiring layers 220 is connected to the drain of the corresponding memory cell transistor MT by a contact plug CP2. Therefore, metal wiring layer 220 along in the second direction and a strip-shaped metal wiring layer 210 along in the second direction are provided alternately in the first direction. On the shunt region SA2, an island pattern of metal wiring layer 230 is formed. The metal wiring layer 230 is connected to the shunt region SA2 of the corresponding select gate line SG by a contact plug CP3. The metal wiring layer 230 is extended in the first direction from the top of the corresponding select gate line SG to the top of the region from which the adjacent select gate line SG has been removed.

Next, the configuration of the replica cell array RCA will be explained. As shown in the figure, a strip-shaped metal wiring layer 210 is formed in the second direction between adjacent replica select gate lines RSG (between RSG0 and RSG1, between RSG1 and RSG2, . . . ). The metal wiring layer 210 is a part of a source line SL in the replica cell array RCA. The metal wiring layer 210 is connected to the source region of a select transistor ST in a replica cell by a contact plug CP1. As in the prime cell array PCA, a metal wiring layer 220 with an island pattern is formed on the drain of a memory cell transistor MT in the third element region group AAG3. The metal wiring layer 220 is connected to the drain region of the corresponding memory cell transistor MT by a contact plug CP2. In the stitch region SA3, metal wiring layers 400 separated from the metal wiring layers 210 are formed. The metal wiring layers 400 are connected to the shunt regions SA4 of replica select gate lines RSG0 to RSG(4m+3) by contact plugs CP3 and are further connected to the element regions AA by contact plugs CP8.

Figure 9:
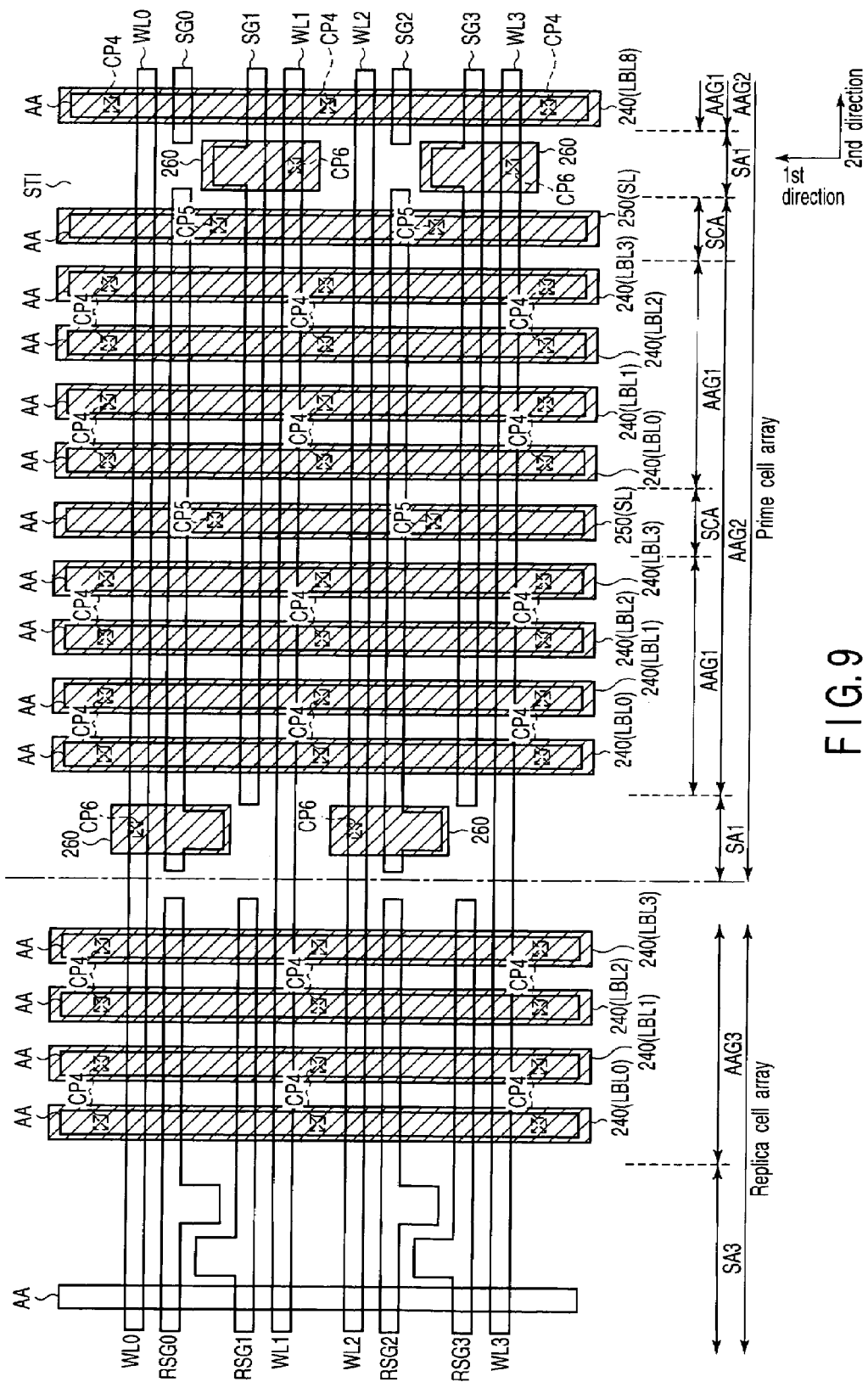
FIG. 9 is a plan view of the memory cell array included in the 2Tr flash memory according to the first embodiment, showing a plane pattern of a second-layer metal wiring layer.

Next, using FIGS. 7 and 9, a pattern of a second-layer metal wiring layer existing on the first-layer metal wiring layers 210 to 230 and 400 will be explained. In FIG. 9, the shaded region is the second-layer metal wiring layer.

As shown in FIG. 9, in the first and third element region groups AAG1, strip-shaped metal wiring layers 240 are formed in the first direction above element regions AA. The metal wiring layers 240 function as local bit lines LBL0 to LBL3. The metal wiring layers 240 are connected to the first-layer metal wiring layer 220 by contact plugs CP4. In source contact regions SCA, metal wiring layers 250 whose pattern is similar to that of the metal wiring layers 240 are formed. Therefore, the line width of the metal wiring layers 250 is the same as that of the metal wiring layers 240. The metal wiring layers 250 function as part of the source lines SL. The metal wiring layers 250 are connected to the first-layer metal wiring layers 210 by contact plugs 5. That is, a plurality of metal wiring layers 210 isolated in the first direction are connected to one another by a metal wiring layer 250. In the stitch region SA1, metal wiring layers 260 with an island pattern are formed. The metal wiring layers 260 are formed so as to correspond to the first-layer metal wiring layers 230. The shape of a metal wiring layer 260 is the same of the layer 230 and overlaps the layer 230. The metal wiring layers 260 are connected to the metal wiring layers 230 by contact plugs CP6. While in FIGS. 7 and 9, the contact plugs CP6 are directly above the word line WL, the present embodiment is not limited to this, as long as the contact plugs CP6 are provided in positions where the metal wiring layers 230 and 260 can be connected.

Figure 10:
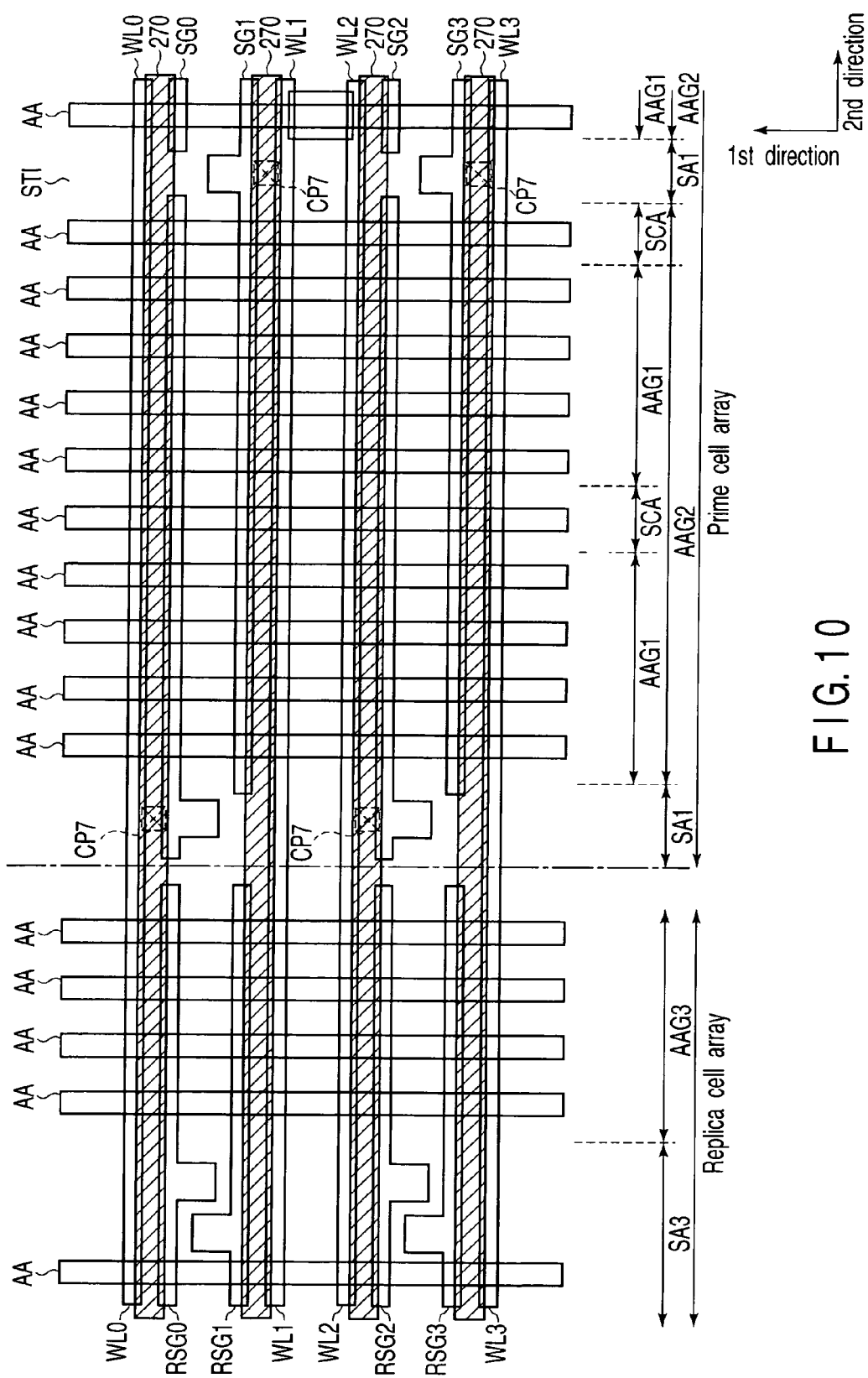
FIG. 10 is a plan view of the memory cell array included in the 2Tr flash memory according to the first embodiment, showing a plane pattern of a third-layer metal wiring layer.

Next, using FIGS. 7 and 10, a pattern of a third-layer metal wiring layer existing on the second-layer metal wiring layers 240 to 260 will be explained. In FIG. 10, the shaded region is the third-layer metal wiring layer.

As shown in FIG. 10, strip-shaped metal wiring layers 270 are formed in the second direction. The metal wiring layers 270 are formed for sets of word line and select gate line (a set of WL0 and SG1, a set of WL1 and SG1, . . . ) in a one-to-one correspondence. The metal wiring layers 270 are connected by contact plugs CP7 to the second-layer metal wiring layers 260 electrically connected to the corresponding select gate lines. Specifically, each of the metal wiring layers 270 function as a shunt wire for each of the select gate lines SG0 to SG(4m+3). Each of the metal wiring layers 270 is formed in a region between the central part of a word line WL and the central part of the select gate line corresponding to the word line WL. In other words, the metal wiring layer 270 runs through the central part of the memory cell MC. Therefore, the metal wiring layers 270 are arranged at equal intervals in the first direction. The metal wiring layers 270 are connected to each other between second element groups AA2 adjoining each other in the second direction. One end of the metal wiring layer 270 is connected to the select gate decoder 30. The other end of the metal wiring layer 270 passes over the replica cell array RCA and is connected to the write decoder 20.

Figure 11:
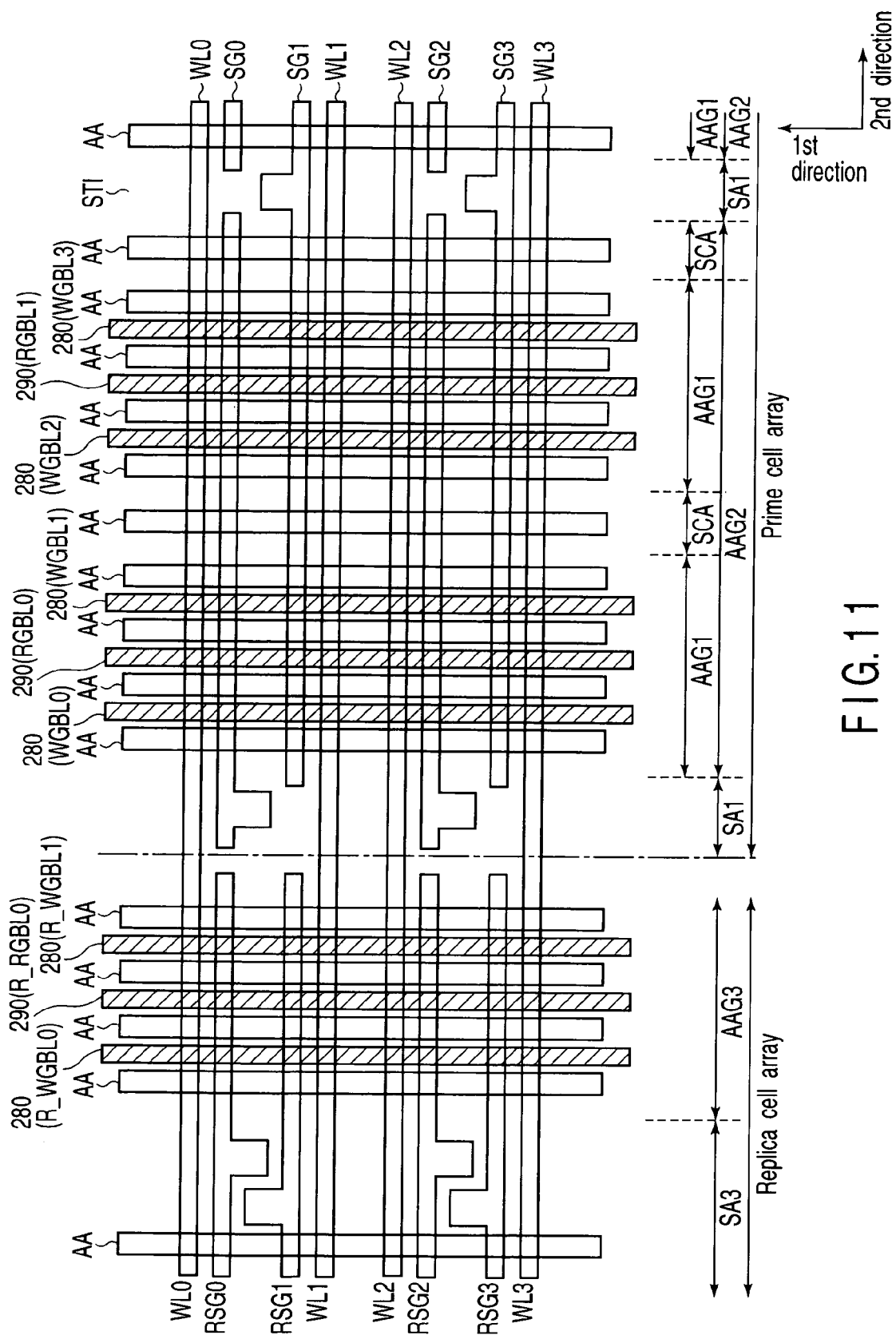
FIG. 11 is a plan view of the memory cell array included in the 2Tr flash memory according to the first embodiment, showing a plane pattern of a fourth-layer metal wiring layer.

Next, using FIGS. 7 and 11, a pattern of fourth-layer metal wiring layers existing on the third-layer metal wiring layers 270 will be explained. In FIG. 11, the shaded regions are the fourth-layer metal wiring layers.

As shown in the figures, strip-shaped metal wiring layers 280, 290 are formed in the first direction. The metal wiring layers 280 function as write global bit lines WGBL0 to WGBL(2n+1) and replica write global bit lines R_WGBL0, R_WGBL1. The metal wiring layers 290 function as read global bit lines RGBL0 to RGBLn and replica read global bit lines R_RGBL. Two metal wiring layers 280 and one metal wiring layer 290 form a set. A metal wring layer 280 is provided so as to correspond to a set of two local bit lines LBL0, LBL1 or a set of two local bit lines LBL2, LBL3. A metal wiring layer 290 is provided so as to correspond to a set of four local bit lines LBL0 to LBL3.

In the above figures, a source contact area SCA may be provided in the replica cell array RCA.

Figure 12:
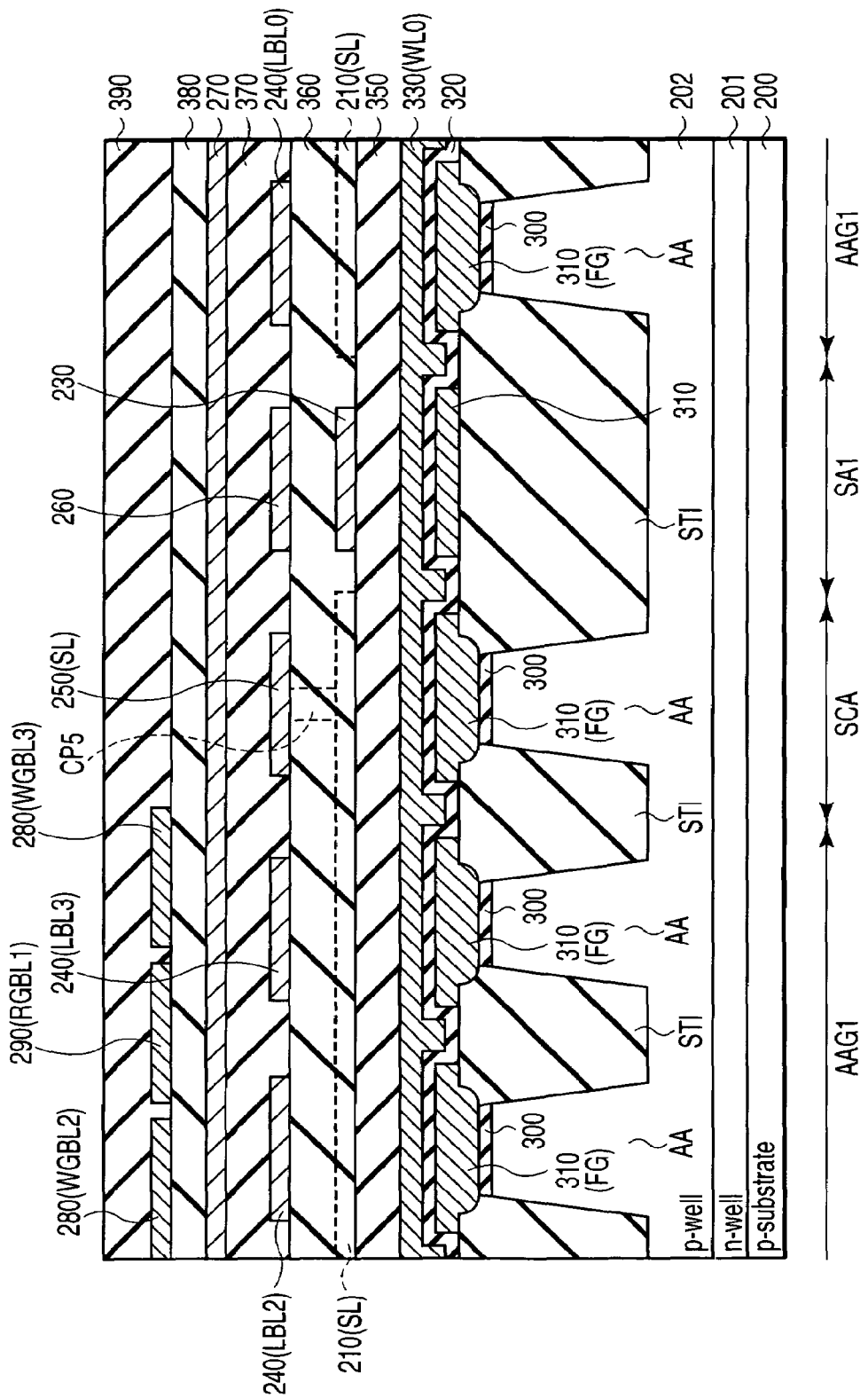
FIG. 12 is a sectional view taken along line 12-12 of FIG. 7.
Figure 13:
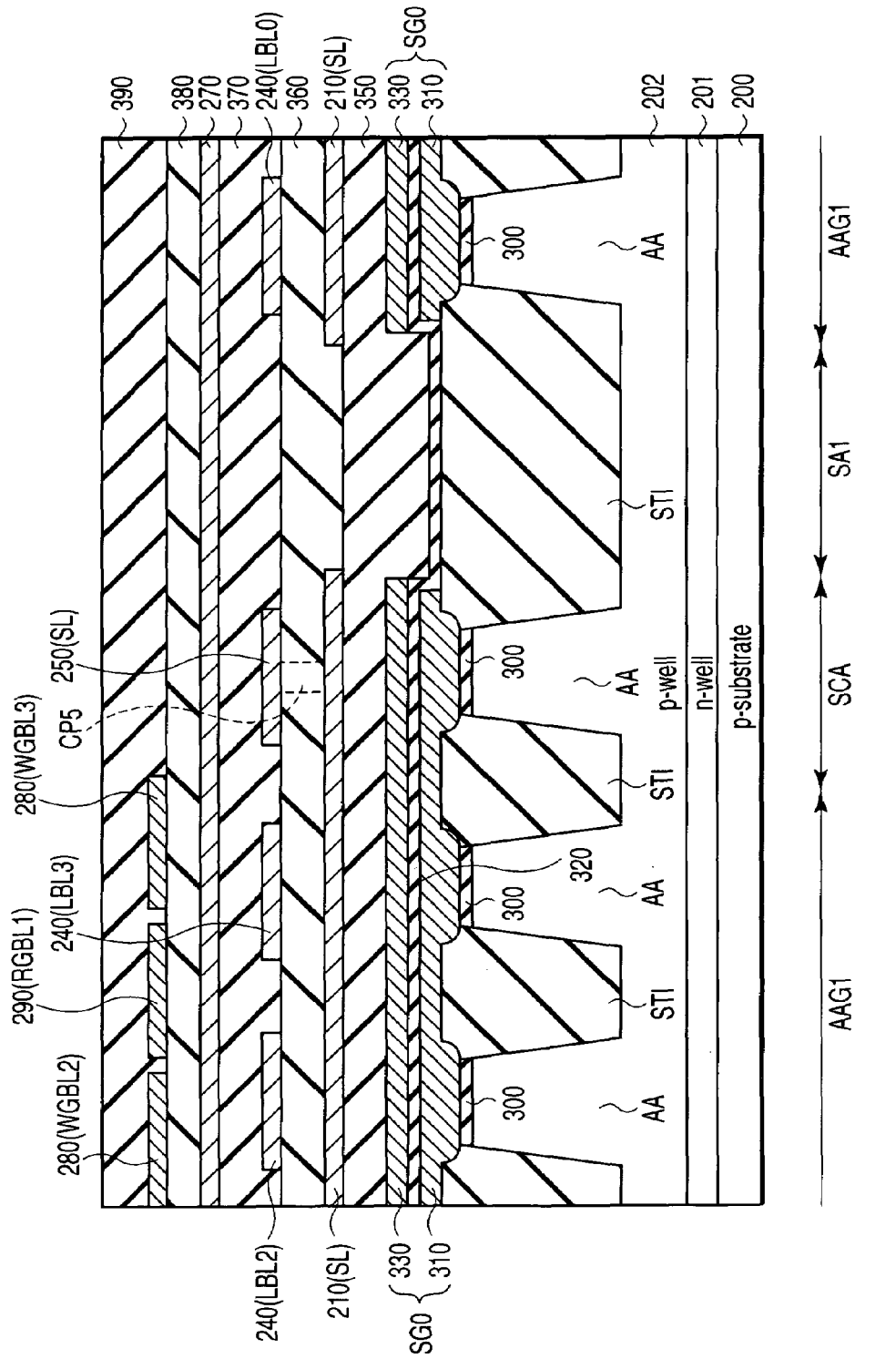
FIG. 13 is a sectional view taken along line 13-13 of FIG. 7.
Figure 14:
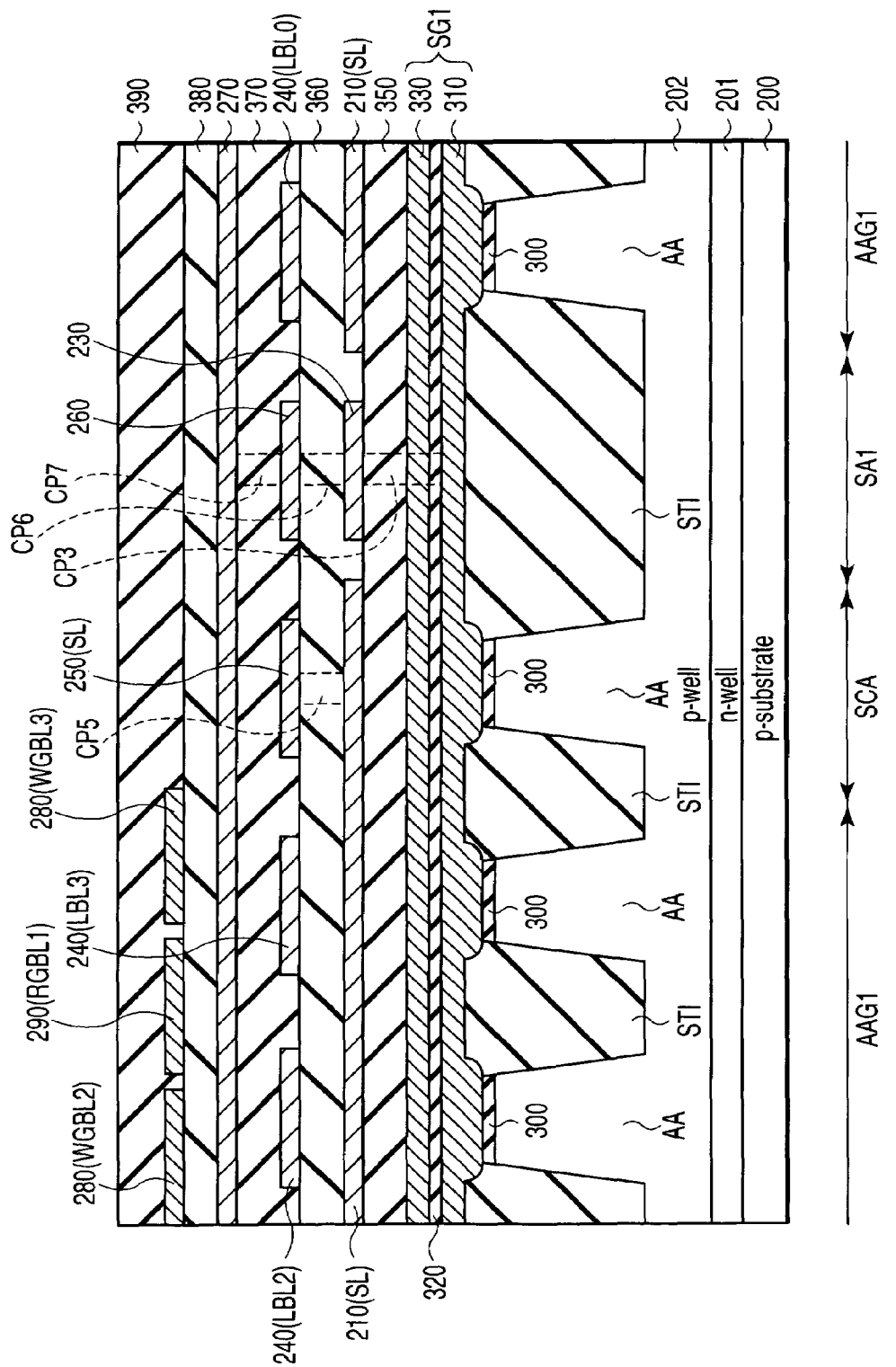
FIG. 14 is a sectional view taken along line 14-14 of FIG. 7.
Figure 17:
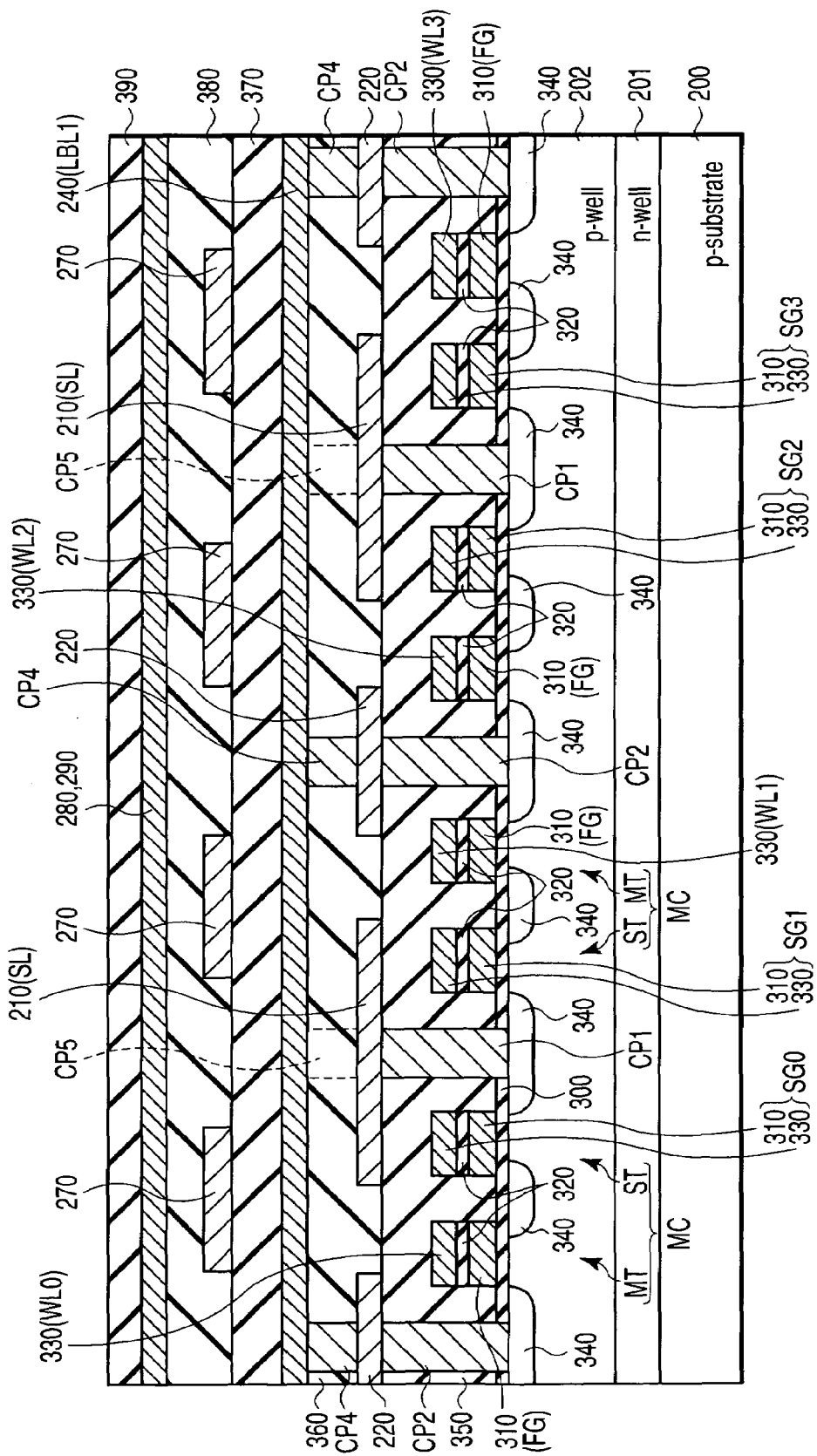
FIG. 17 is a sectional view taken along line 17-17 of FIG. 7.
Figure 18:
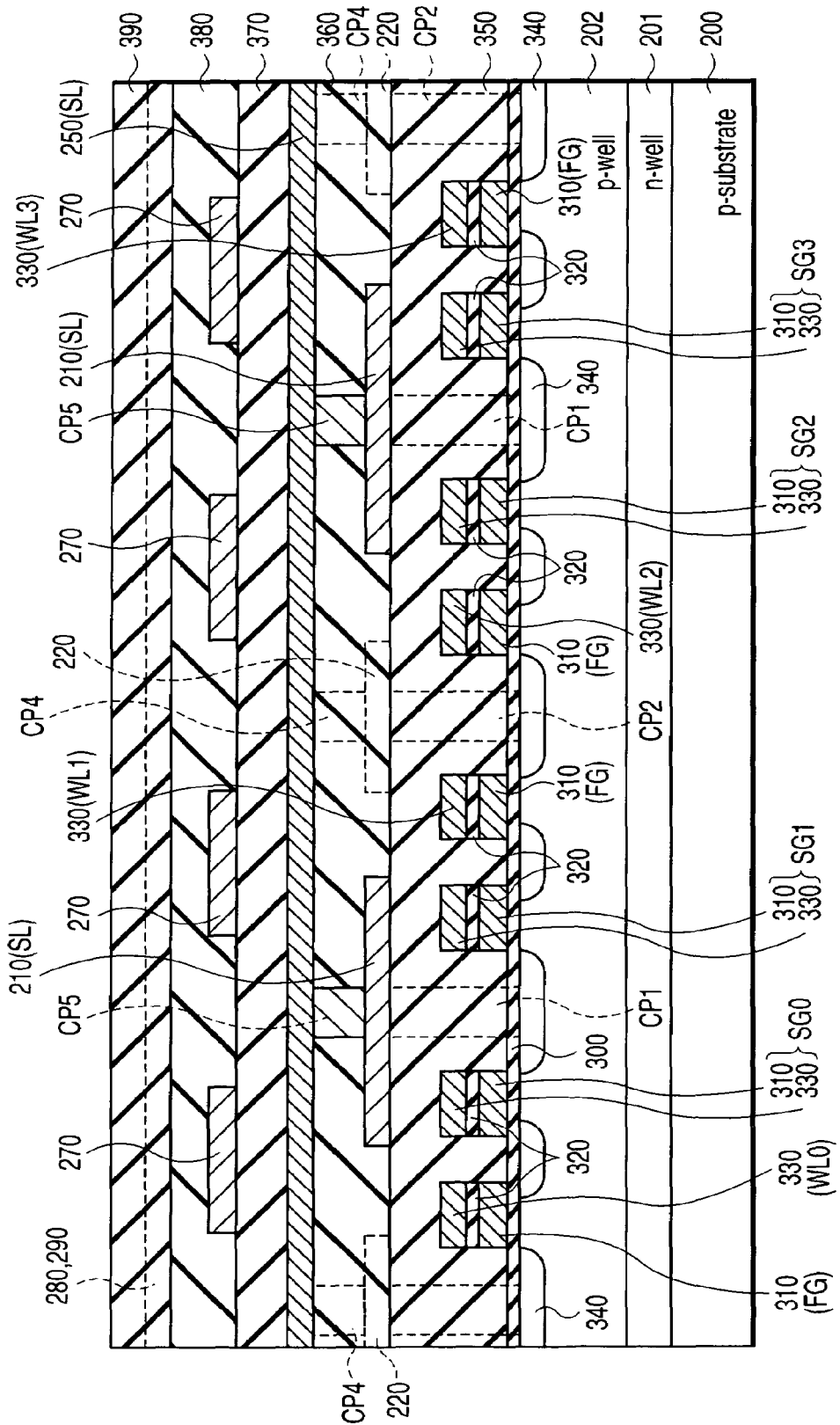
FIG. 18 is a sectional view taken along line 18-18 of FIG. 7.

Next, a sectional structure of the flash memory configured as described above will be explained. Using FIGS. 12 to 18, a sectional structure of a second element region group AAG2 in the prime cell array PCA will be explained. FIG. 12 is a sectional view taken along line 12-12 of FIG. 7. FIG. 13 is a sectional view taken along line 13-13 of FIG. 7. FIG. 14 is a sectional view taken along line 14-14 of FIG. 7. FIG. 15 is a sectional view taken along line 15-15 of FIG. 7. FIG. 16 is a sectional view taken along line 16-16 of FIG. 7. FIG. 17 is a sectional view taken along line 17-17 of FIG. 7. FIG. 18 is a sectional view taken along line 18-18 of FIG. 7.

As shown, at the surface of the p-type semiconductor substrate 200, an n-well region 201 is formed. At the surface of the n-well region 201, a p-well region 202 is formed. In the p-well region 202, an element isolating region STI is formed. The region surrounded by the element isolating region STI is an element region AA. On the element region of the p-well region 202, a gate insulating film 300 is formed. On the gate insulating film 300, the gate electrodes of a memory cell transistor MT and a select transistor ST are formed. Each of the gate electrodes of the memory cell transistor MT and the select transistor ST includes a polysilicon layer 310 formed on the gate insulating film 300, an inter-gate insulating film 320 formed on the polysilicon layer 310, and a polysilicon layer 330 formed on the inter-gate insulating film 320. The inter-gate insulating film 320 is made of, for example, a silicon oxide film, or an ON film, NO film, or ONO film having a stacked structure of a silicon oxide film and a silicon nitride film.

As shown in FIGS. 12 and 15, in a memory cell transistor MT, the polysilicon layers 310, which are isolated from each other between adjacent element regions AA along the word line, function as floating gates (FG). On the other hand, the polysilicon layers 330, which are shared by adjacent element regions AA, function as control gates (or word line WL).

As shown in FIGS. 13 and 14, in a select transistor ST, the polysilicon layers 310 are shared by adjacent element regions AA. The polysilicon layers 330 are also shared by adjacent element regions AA. Then, the polysilicon layers 310, 330 function as select gate lines SG. Of these polysilicon layers, it is only the polysilicon layers 310 that practically function as select gate lines.

At the surface of the p-well region 202 between adjacent gate electrodes, an impurity diffused layer 340 is formed. The impurity diffused layer 340 is shared by adjacent transistors.

As described above, a prime cell including a memory cell transistor MT and a select transistor ST is formed so as to have the following relationship. In adjacent prime cells, their select transistors ST or their memory cell transistors MT are adjacent to each other. The adjacent select transistors or memory cell transistors share the impurity diffused layer 340. Therefore, two adjacent prime cells PC, PC, when their select transistors are adjacent to each other, are arranged symmetrically with the impurity diffused layer (or source region) 340 shared by the two select transistors ST, ST. Conversely, when their memory cell transistors MT are adjacent to each other, two adjacent prime cells PC, PC are arranged symmetrically with the impurity diffused layer (or drain region) 340 shared by the two memory cell transistors MT, MT.

Then, on the p-well region 202, an interlayer insulating film 350 is formed so as to cover the memory cell transistors MT and select transistors ST. In the interlayer insulating film 350, a contact plug CP1 is formed which reaches the impurity diffused layer (or source region) 340 shared by two select transistors ST, ST. On the interlayer insulating film 350, a metal wiring layer 210 to be connected to the contact plug CP1 is formed. The metal wiring layer 210 functions as a source line SL. In the interlayer insulating film 350, a contact plug CP2 is formed which reaches the impurity diffused layer (or drain region) 340 shared by two memory cell transistors MT, MT. On the interlayer insulating film 350, a metal wiring layer 220 to be connected to the contact plug CP2 is formed.

On the interlayer insulating film 350, an interlayer insulating film 360 is formed so as to cover the metal wiring layers 210, 220. In the interlayer insulating film 360, a contact plug CP4 reaching the metal wiring layer 220 is formed (see FIG. 17). On the interlayer insulating film 360, a metal wiring layer 240 connected commonly to a plurality of contact plugs CP4 is formed (see FIG. 17). The metal wiring layer 240 functions as any one of the local bit lines LBL0 to LBL3. A contact plug CP5 reaching the metal wiring layer 210 is formed in the inter layer insulating film 360 (see FIG. 18, source contact region SCA). On the interlayer insulating film 360, a metal wiring layer 250 connected commonly to a plurality of contact plugs CP5 in the bit line direction is formed (see FIG. 18, source contact region SCA). The metal wiring layer 250 functions as a part of a source line SL.

On the interlayer insulating film 360, an interlayer insulating film 370 is formed so as to cover the metal wiring layers 240, 250. On the interlayer insulating film 370, a metal wiring layer 270 is formed. The metal wiring layers 270, which function as shunt wires for the select gate lines, are arranged at equal intervals. On the interlayer insulating film 370, an interlayer insulating film 380 is formed so as to cover the metal wiring layer 270.

On the interlayer insulating film 380, metal wiring layers 280, 290 functioning as write global bit lines and read global bit lines are formed and then an interlayer insulating film 390 is formed.

Figure 19:
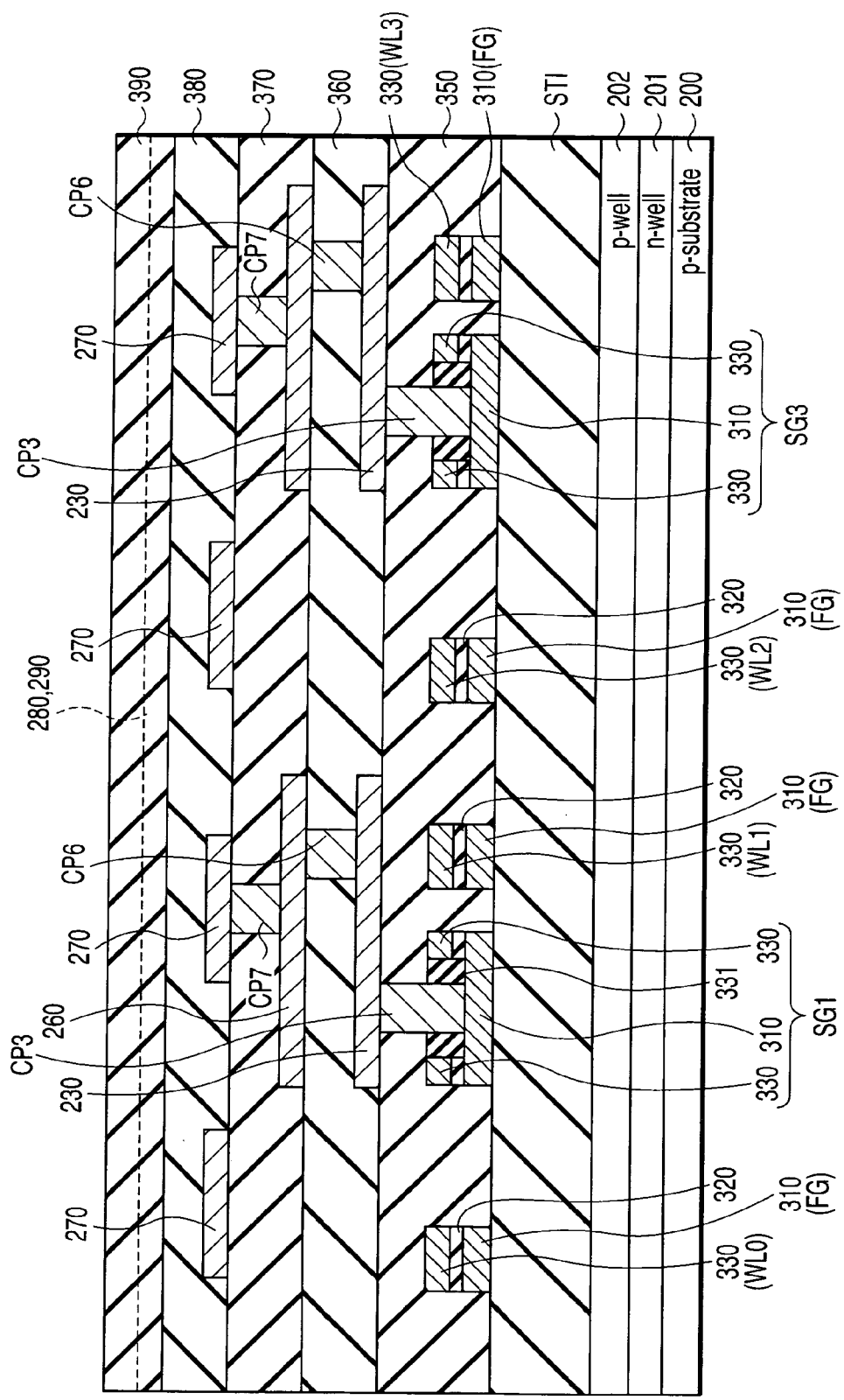
FIG. 19 is a sectional view taken along line 19-19 of FIG. 7.

Next, using FIGS. 13, 16, and 19, a sectional structure of a stitch region SA1 in the prime cell array will be explained. FIG. 19 is a sectional view taken along line 19-19 of FIG. 7.

As shown in FIG. 19, an element isolating region STI is formed in the p-well region 202. On the element isolating region STI, the floating gate 310 and control gates 330 of a memory cell transistor MT are formed. The polysilicon layers 310, 330 have been removed from the select gate lines which have no shunt region SA2 in the stitch region SA1 (see FIG. 13). That is, the select gate lines are divided by the stitch regions SA1. A select gate line with a shunt region SA2 has a stacked gate including the polysilicon layers 310, 330 formed even in the stitch region. The stacked gate is formed so as to project toward the adjacent select gate lines (see FIG. 19). As shown in FIGS. 16 and 19, in a shunt region SA2, the polysilicon layer 330 and inter-gate insulating film 320 are removed, thereby exposing the polysilicon layer 310. Then, a contact plug CP3 is formed so as to touch the polysilicon layer 310 in the region. The contact plug CP3 is electrically isolated from the polysilicon layer 330 by an insulating film 331 (see FIGS. 16 and 19). The contact plug CP3 is formed from the surface of an interlayer insulating film 350 so as to reach the polysilicon layer 310.

On the interlayer insulating film 350, a metal wiring layer 230 is formed. The metal wiring layer 230 is extended so as to cover the top of the gate electrode of the corresponding select transistor ST and the top of the stacked gate electrode of the memory cell transistor MT corresponding to the select transistor ST (see FIG. 19). Then, the metal wiring layer 230 is connected to a contact plug CP3 connected to the corresponding select transistor ST. On the interlayer insulating film 350, an interlayer insulating film 360 is formed so as to cover the metal wiring layer 230. In the interlayer insulating film 360, a contact plug CP6 reaching the metal wiring layer 230 is formed. On the interlayer insulating film 360, a metal wiring layer 260 to be connected to the contact plug CP6 is formed. Like the metal wiring layer 230, the metal wiring layer 260 is extended so as to cover the top of the gate electrode of the corresponding select transistor ST and the top of the stacked gate electrode of the memory cell transistor MT corresponding to the select transistor ST (see FIG. 19). On the interlayer insulating film 360, an interlayer insulating film 370 is formed. In the interlayer insulating film 370, a contact plug CP7 reaching the metal wiring layer 260 is formed. As shown in FIG. 19, the contact plug CP7 is in the central part of a memory cell. In other words, it is formed in a region between the central part of the stacked gate of a memory cell transistor MT and the central part of the gate electrode of a select transistor ST. On the interlayer insulating film 370, a metal wiring layer 270 connected to the contact plug CP7 is formed. As shown in FIG. 19, a plurality of metal wiring layers 270 are arranged at equal intervals on the interlayer insulating film 370. Then, on the interlayer insulating film 370, interlayer insulating films 380, 390 are formed so as to cover the metal wiring layers 270.

Figure 20:
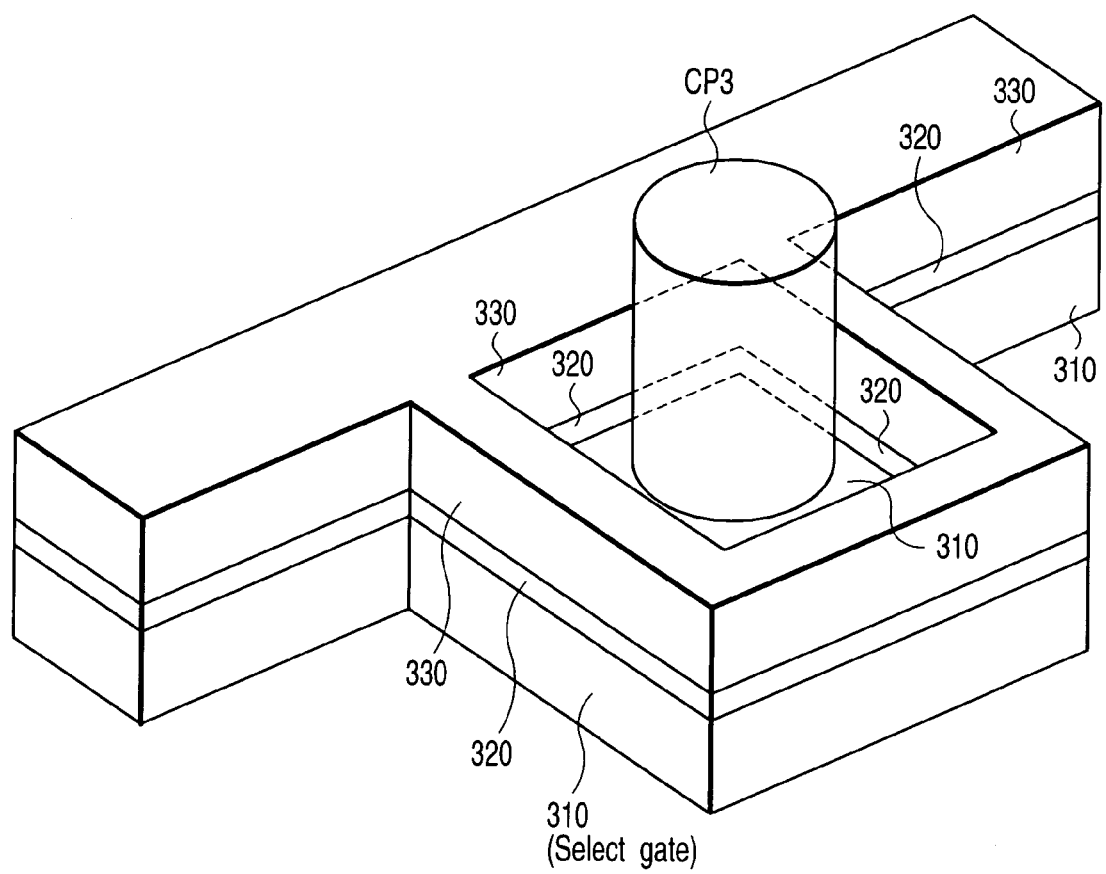
FIG. 20 is a perspective view of a shunt region in FIG. 7.

FIG. 20 is a perspective view of a shunt region SA2. As shown in FIG. 20, a stacked gate structure forming a select gate line is made wider in part. Then, the polysilicon layer 330 and inter-gate insulating film 320 in a part of the wider region are removed, thereby exposing the polysilicon layer 310. A contact plug CP3 is formed so as to touch the exposed polysilicon layer 310. The contact plug CP3 is electrically separated from the polysilicon layer 330. That is, the polysilicon layer 330 is electrically separated from the shunt wire 270.

Figure 21:
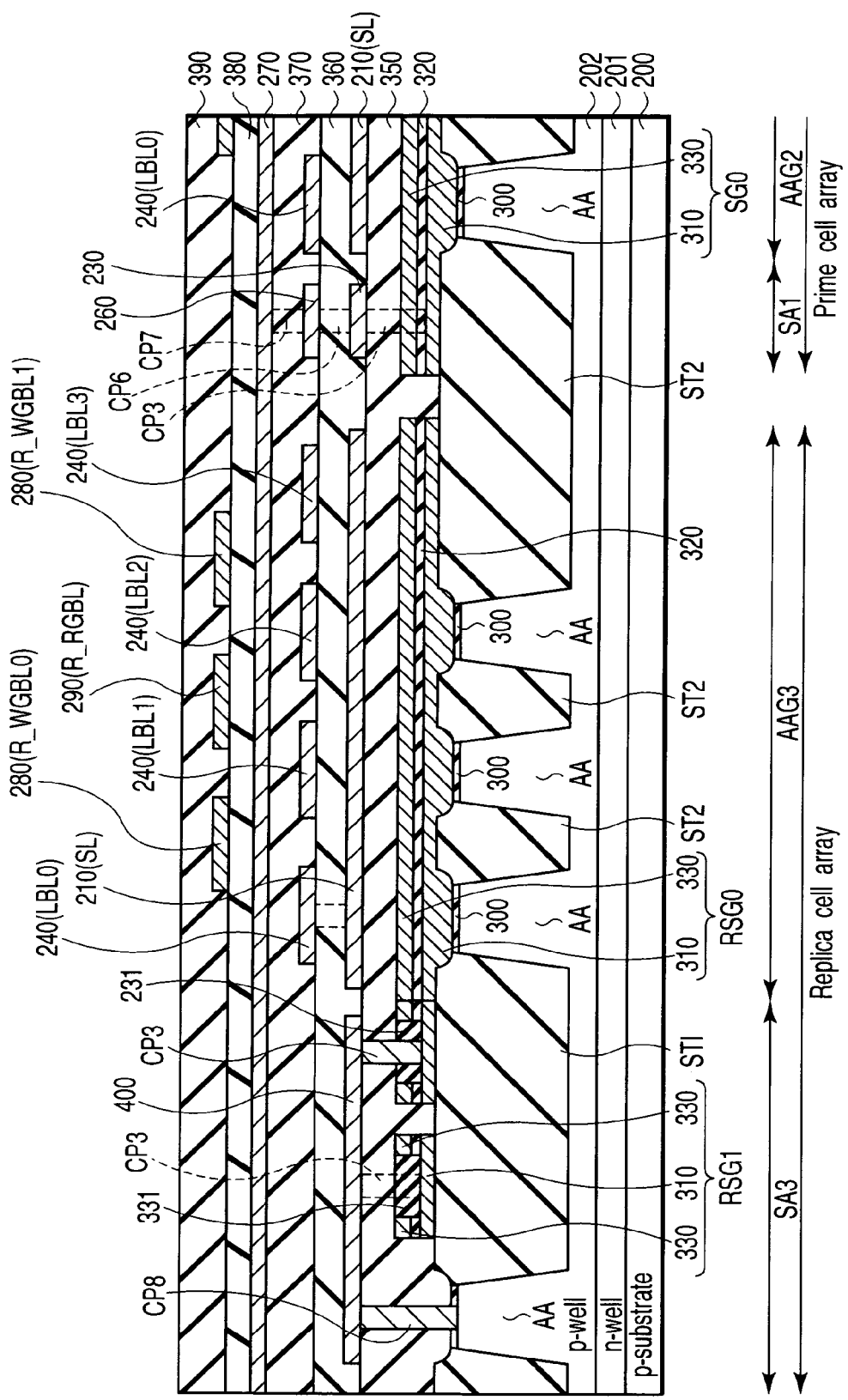
FIG. 21 is a sectional view taken along line 21-21 of FIG. 7.
Figure 22:
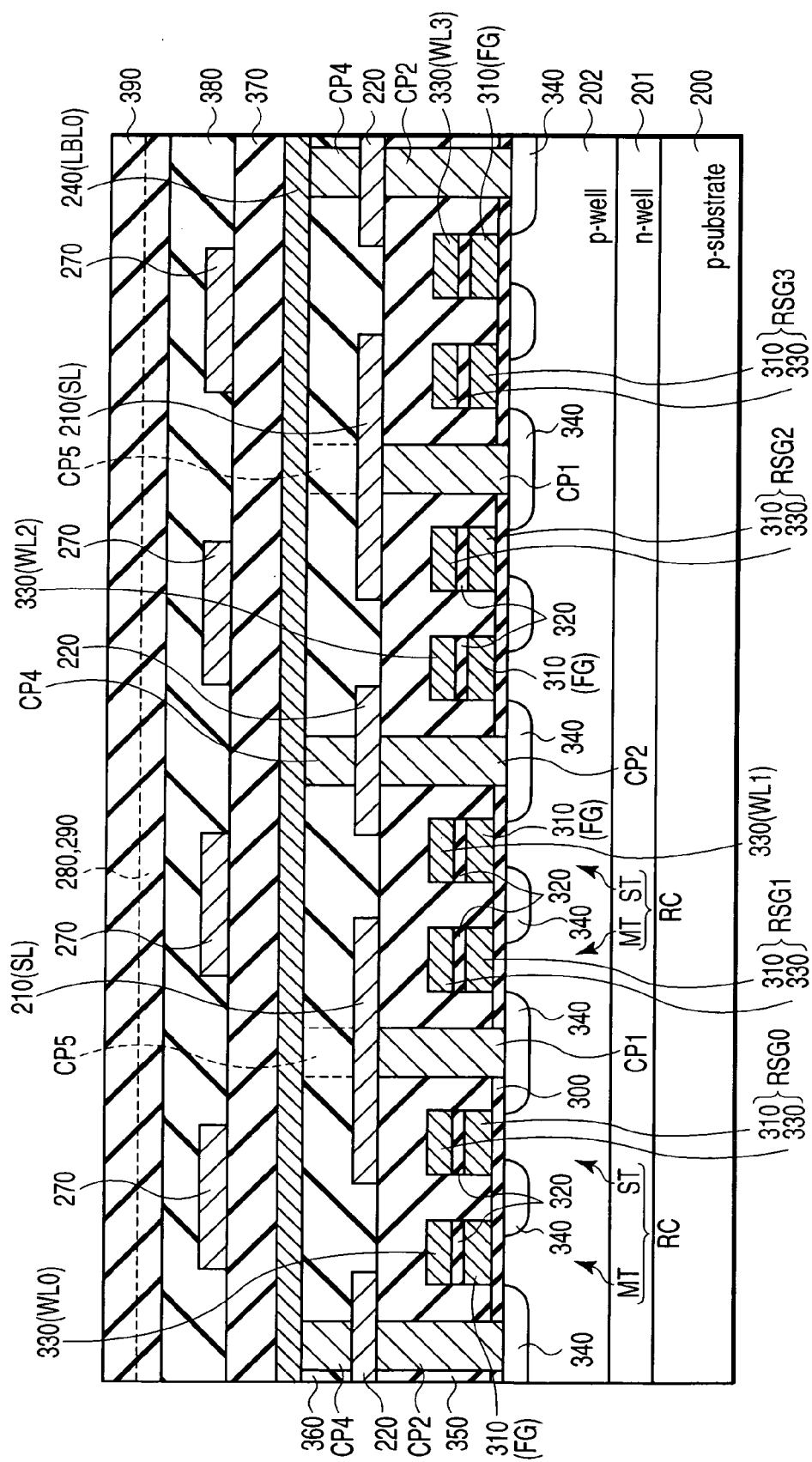
FIG. 22 is a sectional view taken along line 22-22 of FIG. 7.

Next, the replica cell array RCA will be explained. Using FIGS. 21 and 22, a sectional structure of a third element region group AAG3 in the replica cell array RAC will be explained. FIG. 21 is a sectional view taken along line 21-21 of FIG. 7. FIG. 22 is a sectional view taken along line 22-22 of FIG. 7.

As shown in the figures, the configuration of a third element region group AAG3 is the same as that of a first element region group in the prime cell array PCA. Specifically, in the p-well region 202, an element isolating region STI is formed. The region surrounded by the element isolating region STI is an element region AA. On the element region AA of the p-well region 202, a gate insulating film 300 is formed. On the gate insulating film 300, the gate electrodes of the memory cell transistor MT and the select transistor ST of a replica cell are formed.

In a memory cell transistor MT, the polysilicon layers 310, which are separated from each other between adjacent element regions AA, function as floating gates (FG). On the other hand, the polysilicon layers 330, which are connected to each other between adjacent element regions AA, function as control gates (or word lines WL).

In a select transistor ST, the polysilicon layers 310, 320 are connected to one another between adjacent element regions AA. The polysilicon layers 310, 330 function as replica select gate lines RSG. Of these polysilicon layers, it is only the polysilicon layers 310 that practically function as replica select gate lines.

The polysilicon layer 330 functioning as the control gate of a memory cell transistor is connected to the control gate of the prime cell PC. On the other hand, the polysilicon layers 310, 330 functioning as the replica select gate lines RSG for replica cells are isolated from the polysilicon layers 310, 330 functioning as the select gate lines SG for the prime cells PC at the boundary between the prime cell array PCA and the replica cell array RCA.

At the surface of the p-well region 202 between adjacent gate electrodes, an impurity diffused layer 340 is formed. The impurity diffused layer 340 is shared by adjacent transistors.

As described above, a replica cell is formed so as to have the following relationship. In adjacent replica cells RC, their select transistors ST or their memory cell transistors MT are adjacent to each other. The adjacent select transistors or memory cell transistors share the impurity diffused layer 340. Therefore, two adjacent replica cells RC, RC, if their select transistors ST are adjacent to each other, are arranged symmetrically with the impurity diffused layer 340 shared by the two select transistors ST, ST. Conversely, if their memory cell transistors MT are adjacent to each other, two adjacent replica cells RC, RC are arranged symmetrically with the impurity diffused layer 340 shared by the two memory cell transistors MT, MT.

On the interlayer insulating film 360, shunt wires 270 for the select gate lines SG are formed. The shunt wires 270 are electrically isolated from the polysilicon layers 310, 330 functioning as replica select gate lines RSG. On the interlayer insulating film 380, metal wiring layers 280, 290 functioning as replica write global bit lines and replica read global bit lines are formed.

Figure 23:
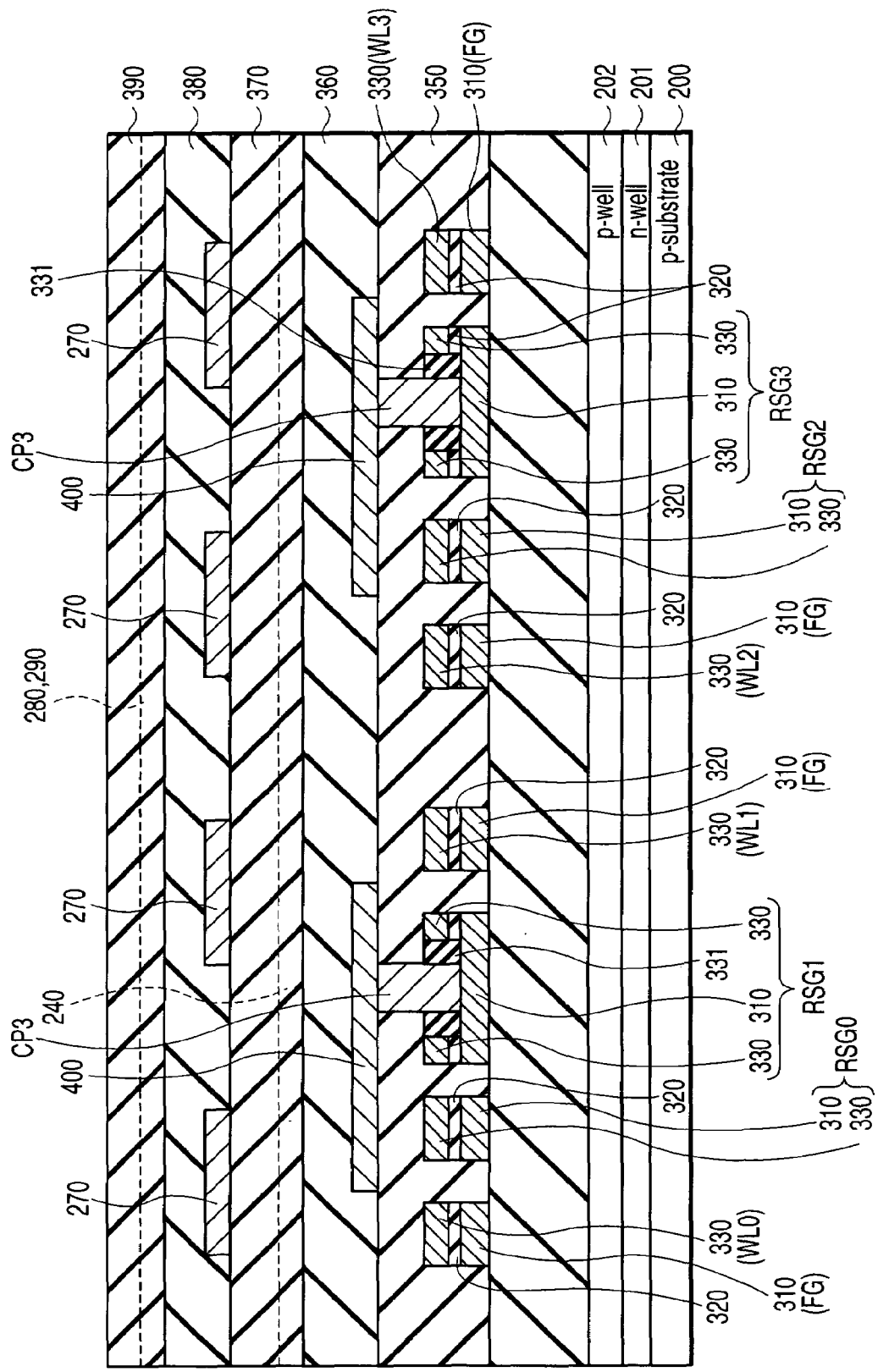
FIG. 23 is a sectional view taken along line 23-23 of FIG. 7.

Next, using FIGS. 21 and 23, a sectional structure of a stitch region SA3 in the replica cell array RCA will be explained. FIG. 23 is a sectional view taken along line 23-23 of FIG. 7.

As shown in the figures, in a stitch region SA3, shunt regions SA4 for replica select gate lines RSG0 to RGS(4m+3) and element regions AA are formed. The structure of a shunt region SA4 is the same as that of a shunt region SA2 for a select gate line SG (see FIGS. 20 and 23). Specifically, the polysilicon layer 330 forming a part of the replica select gate line RSG and the inter-gate insulating film 320 are removed, exposing the polysilicon layer 310. Then, a contact plug CP3 is formed so as to touch the polysilicon layer 310 in the region. The contact plug CP3 is electrically separated from the polysilicon layer 330 by an insulating film 331. The contact plug CP3 is formed from the interlayer insulating film 350 so as to reach the polysilicon layer 310.

Furthermore, in the stitch region SA3, an element region AA is formed. In the interlayer insulating film 350, a contact plug CP8 reaching the element region AA is formed (see FIG. 21). On the interlayer insulating film 350, a metal wiring layer 400 is formed. The metal wiring layer 400 connects the contact plug CP3 to the contact plug CP8. That is, the polysilicon layer 310 functioning as a replica gate line RSG is connected to the p-well region 202 via the contact plugs CP3, CP8 and the metal wiring layer 400.

On the interlayer insulating film 350, interlayer insulating films 360, 370 are formed sequentially. On the interlayer insulating film 370, shunt wires 270 are formed. In the stitch region SA3, too, word lines WL0 to WL(4m+3) are formed. The shunt wires 270 and word lines WL0 to WL(4m+3) pass through the stitch region SA3 and are connected to the write decoder 20. On the other hand, the polysilicon layers 310, 330 functioning as replica select gate lines RSG0 to RSG(4m+3) are formed only in the replica cell array RCA.

Figure 24:
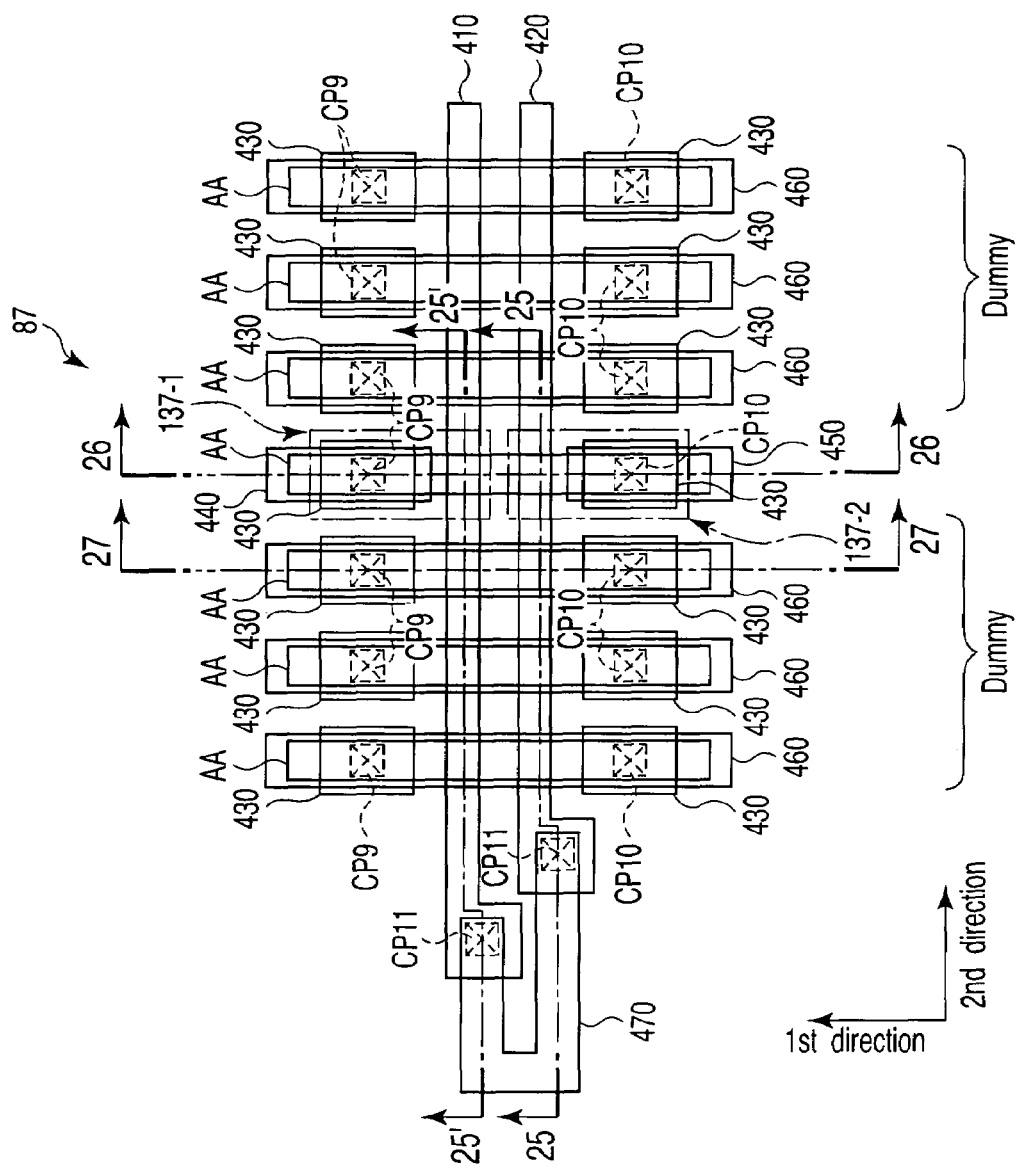
FIG. 24 is a plan view of the current source circuit included in the 2Tr flash memory according to the first embodiment.
Figure 25:
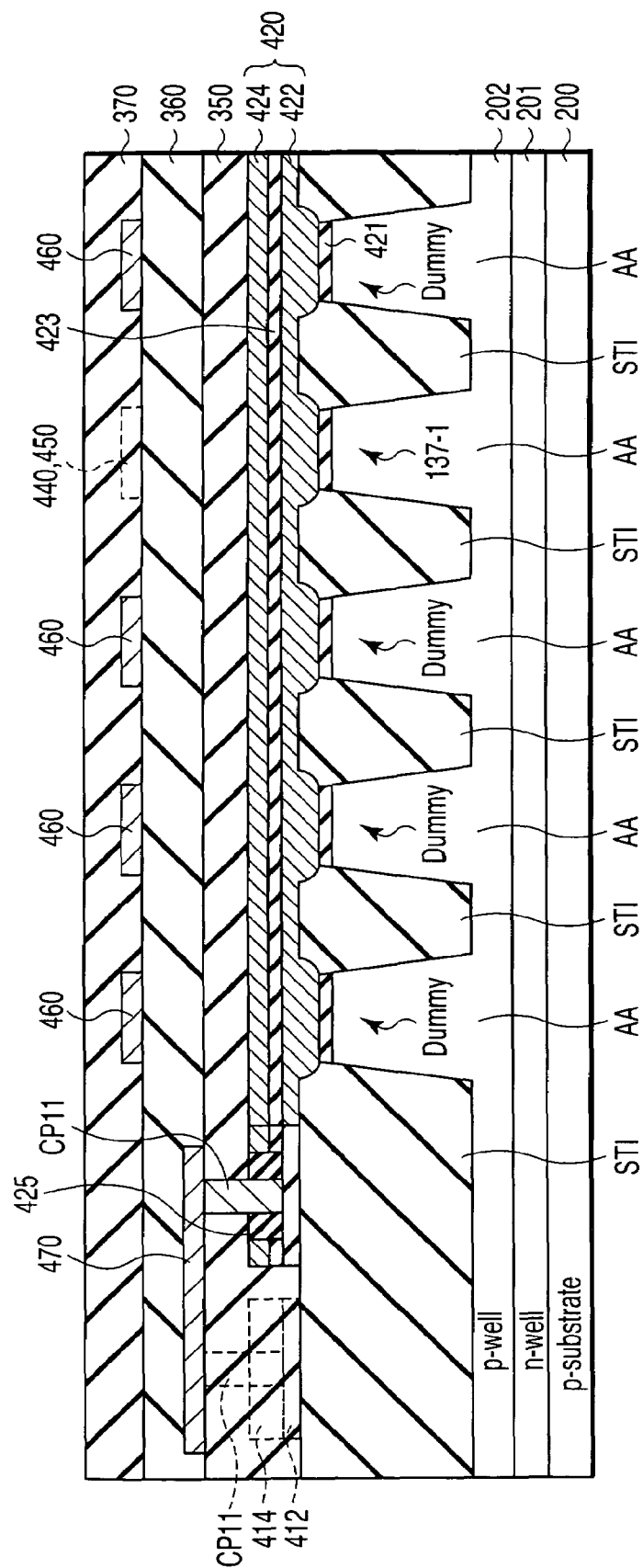
FIG. 25 is a sectional view taken along line 25-25 of FIG. 24.
Figure 26:
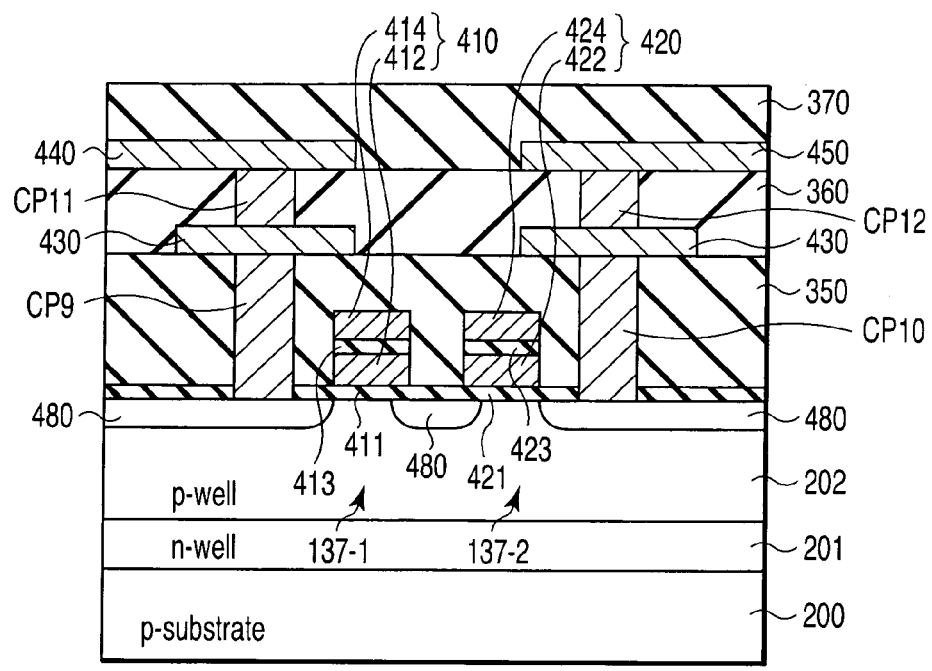
FIG. 26 is a sectional view taken along line 26-26 of FIG. 24.
Figure 27:
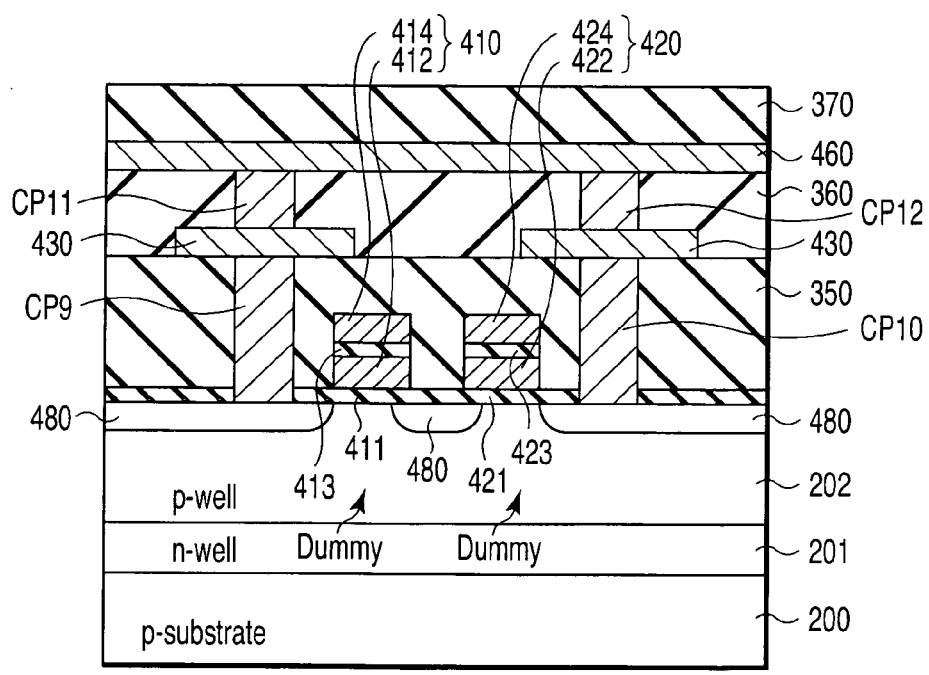
FIG. 27 is a sectional view taken along line 27-27 of FIG. 24.

Next, using FIGS. 24 to 27, the configuration of the MOS transistors 137-1, 137-2 included in the discharge circuit 131 of the read control circuit 130 will be explained. FIG. 24 is a plan view of the current source circuit 137. FIG. 25 is a sectional view taken along line 25-25 of FIG. 24. FIG. 26 is a sectional view taken along line 26-26 of FIG. 24. FIG. 27 is a sectional view taken along line 27-27 of FIG. 24. A sectional view taken along line 25'-25' of FIG. 24 is the same as that of FIG. 25.

As shown in the figures, at the surface of the p-type semiconductor substrate 200, an n-well region 201 is formed as in the memory cell array 10. At the surface of the n-well region 201, a p-well region 202 is formed. At the surface of the p-well region 202, a plurality of element isolating region STI are formed. A strip-shaped region which is surrounded by an element isolating region STI and whose longitudinal direction is in the first direction is an element region AA. On the p-well region 202, strip-shaped gate electrodes 410, 420 extending in the second direction perpendicular to the first direction are formed so as to cross a plurality of element regions AA. The gate electrodes 410, 420 function as the gate electrodes of the MOS transistors 137-1, 137-2, respectively. Each of the gate electrodes 410, 420 has the same stacked structure as that of the select transistors in a prime cell PC and a replica cell RC. Specifically, the gate electrode 410 has a polysilicon layer 412 formed on the p-well region 202 with an inter-gate insulating film 411 interposed therebetween and a polysilicon layer 414 formed on a polysilicon layer 412 with an inter-gate insulating film 413 interposed therebetween. The polysilicon layers 412, 414 are connected to each other between adjacent element regions AA. It is the polysilicon layer 412 that practically functions as a gate electrode. Then, at the surface of the p-well region 202, an impurity diffused layer 480 functioning as the source and drain regions of the MOS transistors 137-1, 137-2 are formed. The source region of the MOS transistor 137-1 and the drain region of the MOS transistor 137-2 share the impurity diffused layer 430.

Although a plurality of MOS transistors have been formed on a plurality of element regions AA, only part of them function as the MOS transistors 137-1, 137-2. The remaining transistors are dummy MOS transistors and therefore do not practically function as the current source circuit 137.

The gate electrodes 410, 420 are withdrawn to the end of the current source circuit 137, thereby forming regions with the same structure as that of the shunt regions SA2, SA4 in a price cell PC and a replica cell RC. Specifically, on the element isolating region STI, the gate electrodes 410, 420 are made wider and the polysilicon layers 414, 424 and the inter-gate insulating films 413, 423 are removed.

Then, an interlayer insulating film 350 is formed on the p-well region 202 so as to cover the MOS transistor group. In the interlayer insulating film 350, contact plugs CP9, CP10 reaching the impurity diffused layer 480 of the MOS transistors 137-1, 137-2 are made. The contact plug CP9 is connected to the drain of the MOS transistor 137-1 and the drain of the dummy MOS transistor in the same row as the MOS transistor 137-1. The contact plug CP10 is connected to the source of the MOS transistor 137-2 and the source of the dummy MOS transistor in the same row as the MOS transistor 137-2. In the region where the polysilicon layers 414, 424 and inter-gate insulating films 413, 423 are removed, a contact plug CP11 reaching the polysilicon layers 412, 422 is formed.

On the interlayer insulating film 350, island metal wiring layers 430 are formed. The metal wiring layers 430 separated from one another are in contact with the contact plugs CP9 or CP10. Further on the interlayer insulating film 350, a metal wiring layer 470 is formed so as to contact the contact plug CP11. Specifically, the polysilicon layer 412 of the gate electrode 410 is electrically connected to the polysilicon layer 422 of the gate electrode 420 via the contact plug CP11 and metal wiring layer 470.

On the interlayer insulating film 350, an interlayer insulating film 360 is formed so as to cover the metal wiring layers 430, 470. In the interlayer insulating film 360, a contact plug CP11 contacting the metal wiring layer 430 connected to the contact plug CP9 and a contact plug CP12 touching the metal wiring layer 430 connected to the contact plug CP10 are formed.

On the interlayer insulating film 360, strip-shaped metal wiring layers 440, 450, 460 whose longitudinal direction is in the first direction are formed. The metal wiring layer 440 is in contact with the contact plug CP11 electrically connected to the MOS transistor 137-1. The metal wiring layer 450 is in contact with the contact plug CP12 electrically connected to the MOS transistor 137-2. The metal wiring layer 460 touches the contact plugs CP11, CP12 connected to dummy MOS transistors. Then, the metal wiring layer 440 is connected to the replica read global bit line R_RGBL. The metal wiring layer 450 is connected to the source of the MOS transistor 139-2. An interlayer insulating film 370 is formed on the interlayer insulating film 360 so as to cover the metal wiring layers 440, 450, 460.

As described above, the current source circuit 137 has the same configuration as that of the memory cell block BLK in the memory cell array 10. A part of the memory cell block can be used as the current source circuit 137. In this case, the memory cell transistor MT and the select transistor ST can function as one of the MOS transistors 137-1 and 137-2 in the current source circuit 137. Then, the metal wiring layer 220 and local bit lines in the memory cell array 10 can be used as the metal wiring layer 430 and metal wiring layers 440, 450, 460 in the current source circuit 137, respectively.

Next, the operation of the 2Tr flash memory configured as described above will be explained using FIG. 28. FIG. 28 is a timing chart for various signals and the voltages at various nodes. Hereinafter, a state where no electrons are injected into the floating gate and the threshold voltage is negative is defined as a state where "1" data has been written. A state where electrons are injected into the floating gate and the threshold voltage is positive is defined as a state where "0" data has been written. To simplify explanation, a case where a memory cell array 10 has two write global bit lines WGBL0, WGBL1 and one read global bit line RGBL0 is used as an example.

<Initial Operation>

Figure 29:
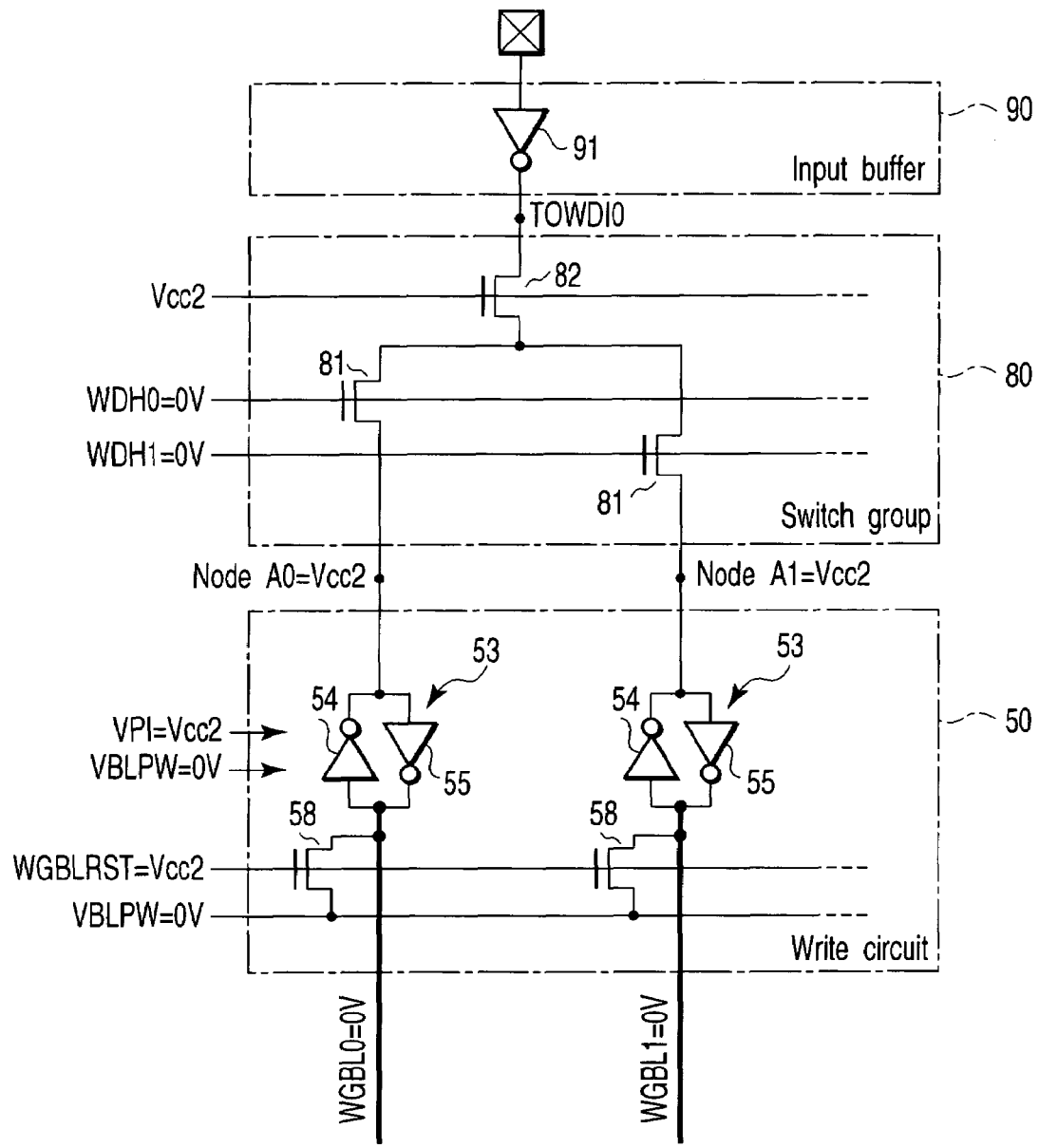
FIG. 29 is a circuit diagram to help explain the input buffer, write circuit, and switch group in an initial operation of the 2Tr flash memory according to the first embodiment.

First, using FIG. 29, an initial operation will be explained. An initial operation is the first operation to be performed in a write, a read, and an erase operation. In FIG. 28, an initial operation is carried out in the period between time t0 to time t1. FIG. 29 is a circuit diagram of the input buffer 90, switch group 80, and write circuit 50 corresponding to write global bit lines WGBL0, WGBL1 in an initial operation. FIG. 29 shows the configuration corresponding to the prime cell array. The replica cell array has the same configuration.

Before the initial operation, the signals WDH0 and WDH1 are both set to the low (L) level (0V), turning off the MOS transistors 81 in the switch group 80, which electrically separates the write circuit 50 from the input buffer 90. The write inhibit voltage VPI supplied as the high voltage power supply voltage of the latch circuit 53 is set to Vcc2 and VBLPW is set to 0V. Then, the signal WGBLRST is set to the high (H) level (Vcc2) and all of the write global bit lines WGBL0, WGBL1 are reset. That is, the MOS transistors 58 in the write circuit 50 are turned on, thereby allowing 0V to be applied from VBLPW node to the write global bit lines WGBL0, WGBL1. As a result, the output nodes of all of the latch circuits 53 go to the low (L) level (0V) and the input nodes (node A0, node A1) go to the high (H) level (Vcc2).

As described above, in the initial operation, the write global bit lines and replica global bit lines are set to 0V and Vcc2 is applied to nodes A0, A1, RA0, and RA1.

<Data Latch Operation>

Figure 30:
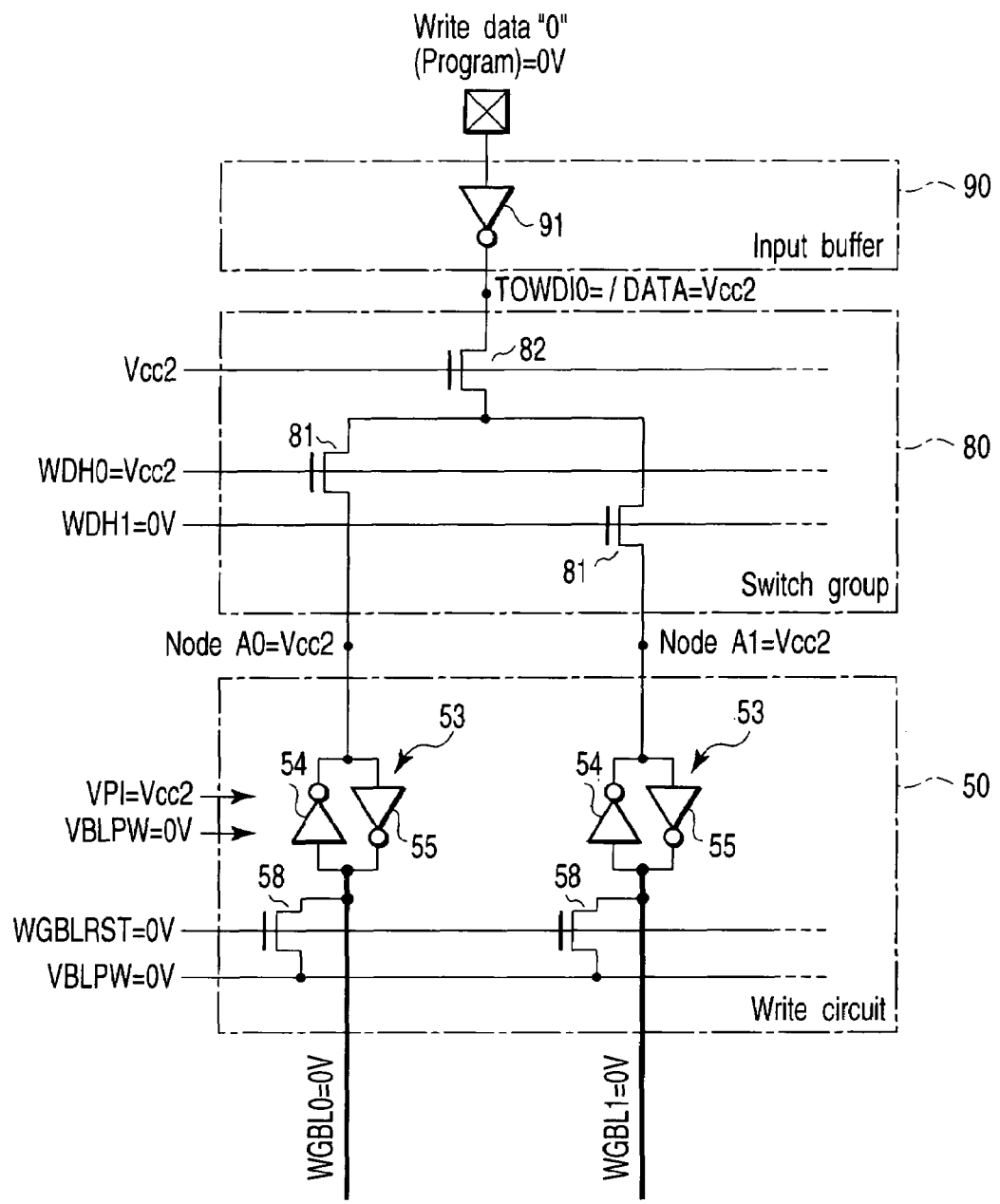
FIGS. 30 and 31 are circuit diagrams to help explain the input buffer, write circuit, and switch group in latching data in the 2Tr flash memory according to the first embodiment.
Figure 31:
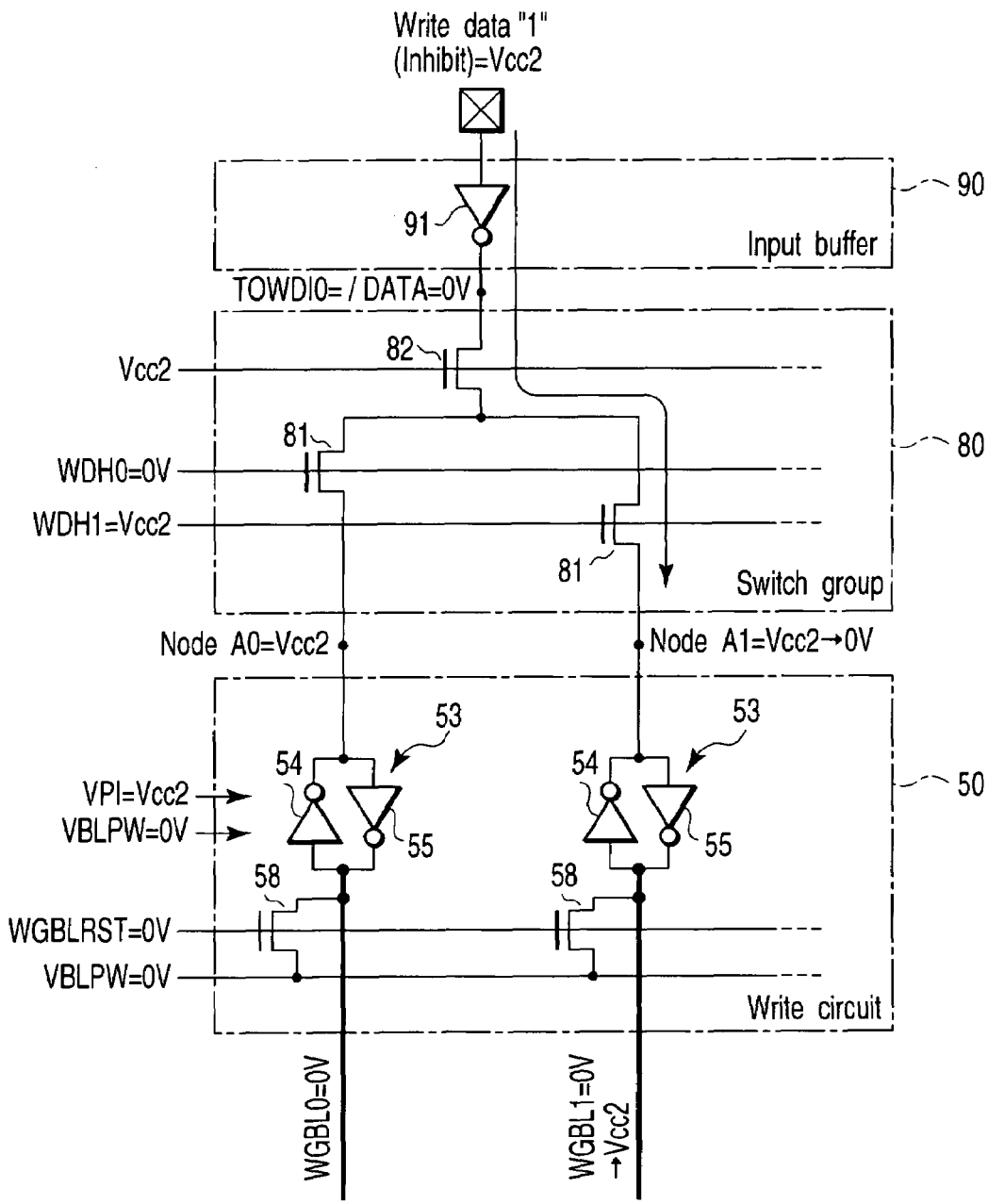

Next, using FIGS. 30 and 31, a data latch operation will be explained. A data latch operation is the operation of inputting write data to each latch circuit 53 in a write operation. A data latch operation is carried out between time t1 and time t2. FIGS. 30 and 31 are circuit diagrams of the input buffer 90, switch group 80, and write circuit 50 in a data latch operation. FIG. 30 shows a case where "0" data has been input. FIG. 31 shows a case where "1" data has been input. Hereinafter, explanation will be given using a case where "0" data is written into the memory cells connected to write global bit line WGBL0 (that is, WGBL0 is selected) and "1" data is written into the memory cells connected to WGBL1 (that is, WGBL1 is unselected).

First, a case where "0" data is input will be explained using FIG. 30. Before a data latch operation, the signal WGBLRST is set to 0V, thereby turning off the MOS transistor 58, which electrically separates write global bit lines WGBL0, WGBL1 from VBLPW node. To latch the data in the latch circuit 53 corresponding to write global bit line WGBL0, the signal WDH0 is set to the high (H) level (Vcc2), which turns on the MOS transistor 81 corresponding to write global bit line WGBL0. On the other hand, the MOS transistor 81 corresponding to write global bit line WGBL1 is turned off. Therefore, the input buffer 90 is electrically connected to the latch circuit 53 corresponding to write global bit line WGBL0.

Then, the CPU 2 inputs "0" data to the inverter of the input buffer 90. When "0" data is input, 0V is applied to the input node of the inverter 91. The "0" data is inverted by the inverter 91. As a result, the potential at TOWDI0 node goes to Vcc2. Then, since Vcc2 has been applied to the gate of the MOS transistor 82, the MOS transistor 82 goes into the cutoff state. Therefore, the latch circuit 53 keeps holding the data given in the period between time t0 to time t1. That is, node A0 remains at Vcc2 and write global bit line WGBL0 remains at 0V.

Next, using FIG. 31, a case where "1" data is input will be explained. What differs from the case where "0" data is input is that setting WDH0 to 0V (WDH0=0V) and WDH1 to Vcc2 (WDH1=Vcc2) turns the MOS transistor 81 corresponding to write global bit line WGBL1 on.

Then, the CPU 2 inputs "1" data to the input buffer. When "1" data is input, Vcc2 is applied to the input node of the inverter 91. Consequently, the potential at TOWDI0 node goes to 0V. The potential at TOWDI0 node is input to the latch circuit 53 via the current path of the MOS transistor 81. As a result, the potential at node A1 is inverted from Vcc2 to 0V, which inverts the potential on write global bit line WGBL1 from 0V to Vcc2.

As described above, in the data latch operation, the data in the latch circuit corresponding to the memory cell into which "1" data is to be written is reversed from its initial state. That is, when "0" writing is done (or when electrons are injected), virtually no data is input from the outside. When "1" writing is done (or when no electrons are injected or the memory is unselected), the data is taken in from the outside.

When the 2Tr flash memory is caused to store the data, all of the replica cells are made unselected for writing. Therefore, the operations of the write circuit 50, switch group 80, and input buffer 90 corresponding to replica write global bit lines R_WGBL0, R_WGBL1 are the same as in the case of write global bit lines WGBL1 in the prime cell array PCA. That is, VPI=0V is applied from the source of the MOS transistor 52 to replica write global bit lines R_WGBL0, R_WGBBL1.

<Write Operation>

Figure 32:
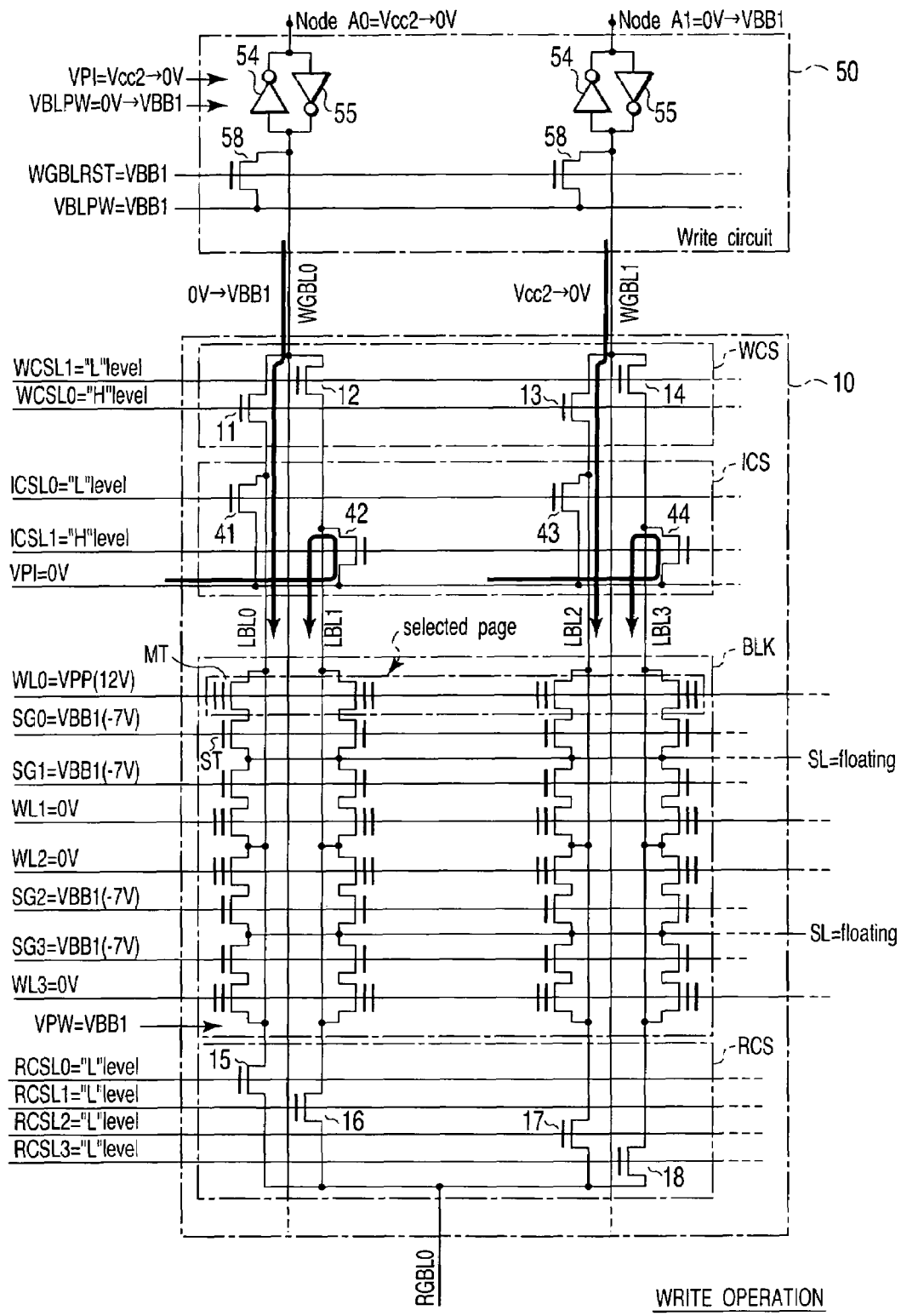
FIG. 32 is a circuit diagram of the prime cell array and write circuit in a write operation of the 2Tr flash memory according to the first embodiment.

Using FIG. 32, a write operation will be explained. Data is written simultaneously into all of the memory cell blocks in a row. In each of the memory cell blocks, the memory cells written into simultaneously include the prime cells connected to one of the local bit lines LBL0 and LBL1 and the prime cells connected to one of the local bit lines LBL2 and LBL3. Into the replica cells connected to the selected word line, "1" data never fails to be written. In other words, the data held in the replica cells is not rewritten.

In FIG. 28, a write operation is carried in the period between time t2 and t3. FIG. 32 is a circuit diagram of the memory cell array 10 and write circuit 50 in a write operation. In FIG. 32, it is assumed that data is written into the memory cell transistors MT connected to word line WL0 and local bit lines LBL0, LBL2 and that, of the memory cell transistors MT, "0" data is written into the one connected to local bit line LBL0 and "1" data is written into the one connected to local bit line LBL2. In other words, the memory cell connected to local bit line LBL0 is selected and the memory cell connected to local bit line LBL2 is unselected.

First, before a write operation, the signal WGBLRST still remains at 0V. At time t2, the write inhibit voltage VPI changes from Vcc2 to 0V and the potential at the VBLPW node changes from 0V to VBB1 (−7V). Under the control of the write state machine 110, the voltage generator 120 outputs the negative potential VBB1. The potential of VPI may be another negative potential instead of −7V.

Then, the low-voltage-side power supply voltage of the inverters 54, 55 in the latch circuit 53 changes from 0V to VBB1 and the high-voltage-side power supply voltage changes from Vcc2 to 0V, with the result that the potentials at node A0 and node A1 change to 0V and VBB1, respectively. The potentials on write global bit lines WGBL0, WGBL1 also change to VBB1 and 0V, respectively.

Then, the write decoder 20 selects word line WL0 and applies the positive voltage VPP (12V) to the selected word line WL0. In addition, the isolating MOS transistor 25 is turned on, which allows the negative potential VBB1 (−7V) at the VSGPW node to be applied to all of the select gate lines SG0 to SG(4m+3). In addition, the write decoder 20 applies the negative potential VBB1 to the substrate (p-well region 202) in which memory cells have been formed. In a write operation, the signal ZISOG is set to the low (L) level, which electrically separates the row address decode circuit 31 of the select gate decoder 30 from the select gate lines.

The column decoder 40 selects write column select line WCSL0 from the two write column select lines connected to the write column selector WCS corresponding to the memory cell block BLK including the selected word line WL0. This turns on the MOS transistors 11, 13 in the write column selector WCS. As a result, write global bit line WGBL0 and local bit line LBL0 are electrically connected and write global bit line WGBL1 and local bit line LBL2 are electrically connected.

Furthermore, the column decoder 40 makes unselected all of the write column select lines connected to the write column selector WCS corresponding to the memory cell block BLK which does not include the selected word line WL0. Therefore, the MOS transistors 11 to 14 in the write column selector WCS corresponding to the memory cell block BLK not including the selected word line are turned off.

Furthermore, the column decoder 40 makes unselected all of the read column select lines RCSL0 to RCSL(4m+3). This turns off the MOS transistors 15 to 18 in all of the read column selectors RCS. Therefore, the read global bit line RGBL is electrically separated from local bit lines LBL0 to LBL3.

In addition, to turn on the MOS transistors 42, 44 connected to local bit lines LBL1, LBL3 made unselected, the column decoder 40 sets the write inhibit column select line ICSL1 to the high (H) level (Vcc2). Write inhibit column select line ICSL0 connected to the MOS transistors 41, 43 corresponding to the selected local bit lines LBL0, LBL2 is set to the low (L) level, which turns off the MOS transistors 41, 43. As a result, the write inhibit voltage VPI=0V is applied to the unselected local bit lines LBL1, LBL3.

Consequently, the write voltage (VBB1) is applied from write global bit line WGBL0 via the MOS transistor 11 in the write column selector WCS to the local bit line LBL0 in the memory cell block BLK including the selected word line WL0. Moreover, the write inhibit voltage VPI (0V) is applied from write global bit line WGBL1 via the MOS transistor 13 to local bit line LBL2 in the memory cell block BLK including the selected word line WL0.

As a result, in the memory cell transistor MT connected to write global bit lines WGBL1 and word line WL0, since the potential difference between the gate and channel is insufficient (VPP1−VPI=12V), no electrons are injected into the floating gate. Thus, the memory cell MC holds the negative threshold value. That is, "1" data is written. Furthermore, in the memory cell transistors MT connected to the unselected local bit lines LBL1, LBL3 and word line WL0, since VPI is applied to the channel, no electrons are injected into the floating gate, which causes the memory cell MC to hold the negative threshold value. On the other hand, in the memory cell transistor MT connected to write global bit line WGBL0 and word line WL0, since the potential difference between the gate and channel is sufficient (VPP1−VBB1=19V), electrons are injected into the floating gate by FN tunneling. As a result, the threshold value of the memory cell transistor MT changes to positive. That is, "0" data is written.

What has been explained above is about the prime cell array PCA; the same holds true for the replica cell array RCA except for the following. Since replica select gate lines RSG0 to RSG(4m+3) are connected to VPW, all of them are set to VBB1. Then, no electrons are injected into the floating gates of the memory cell transistors connected to replica write global bit lines R_WGBL0, R_WGBL1 and word line WL0. Therefore, the threshold values of the replica cells RC remain negative.

As described above, the data is written into one page of memory cell transistors simultaneously. It is only the prime cell array PCA that is used to practically store data. In the replica cell array RAC, "0" data is always written. That is, as a result of a write operation, the threshold values of the replica cells RC do not change and therefore data is not practically written into the replica cells RC.

<Read Operation>

Figure 33:
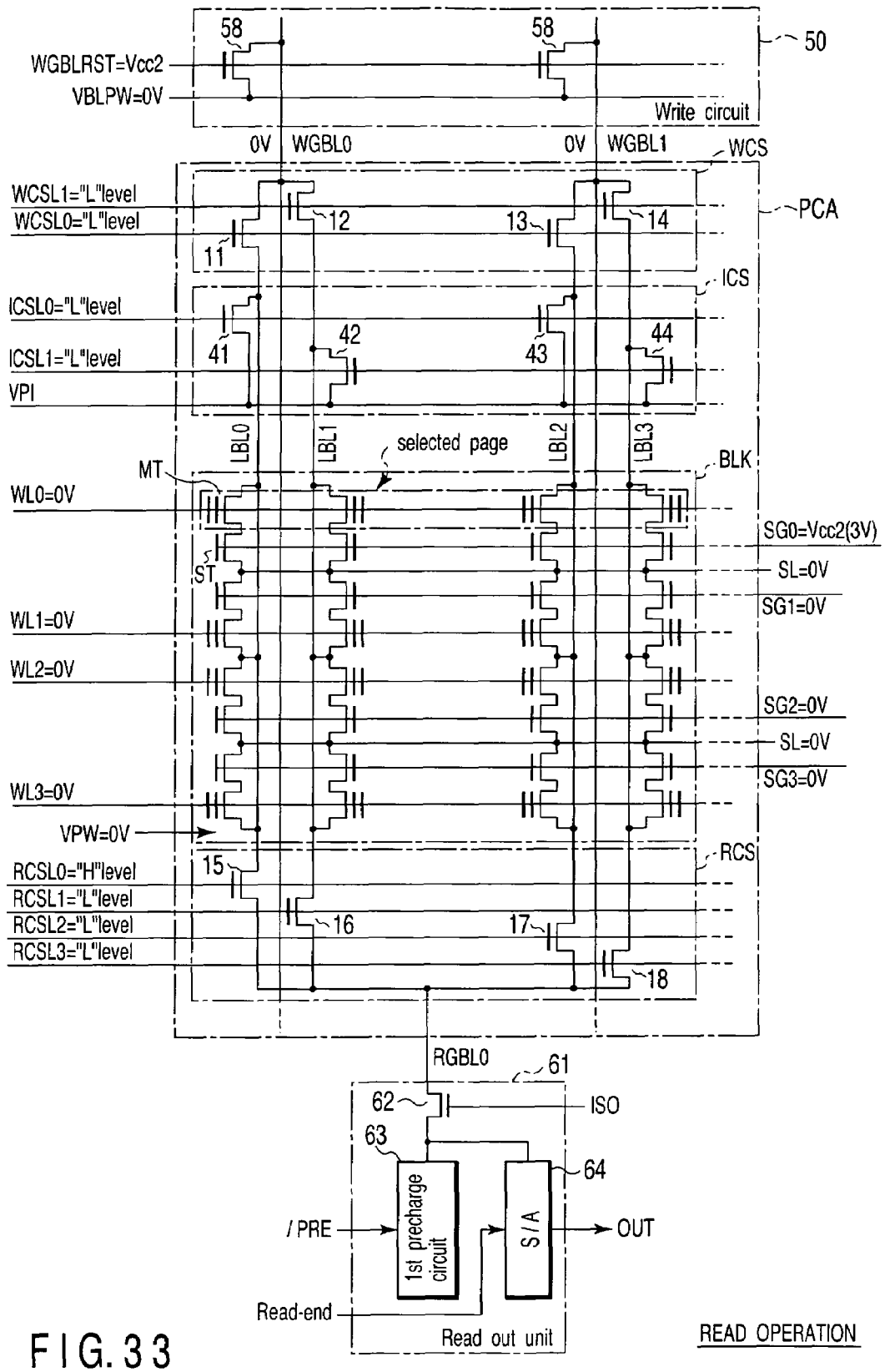
FIG. 33 is a circuit diagram to help explain the prime memory cell array and read circuit in a read operation of the 2Tr flash memory according to the first embodiment.
Figure 34:
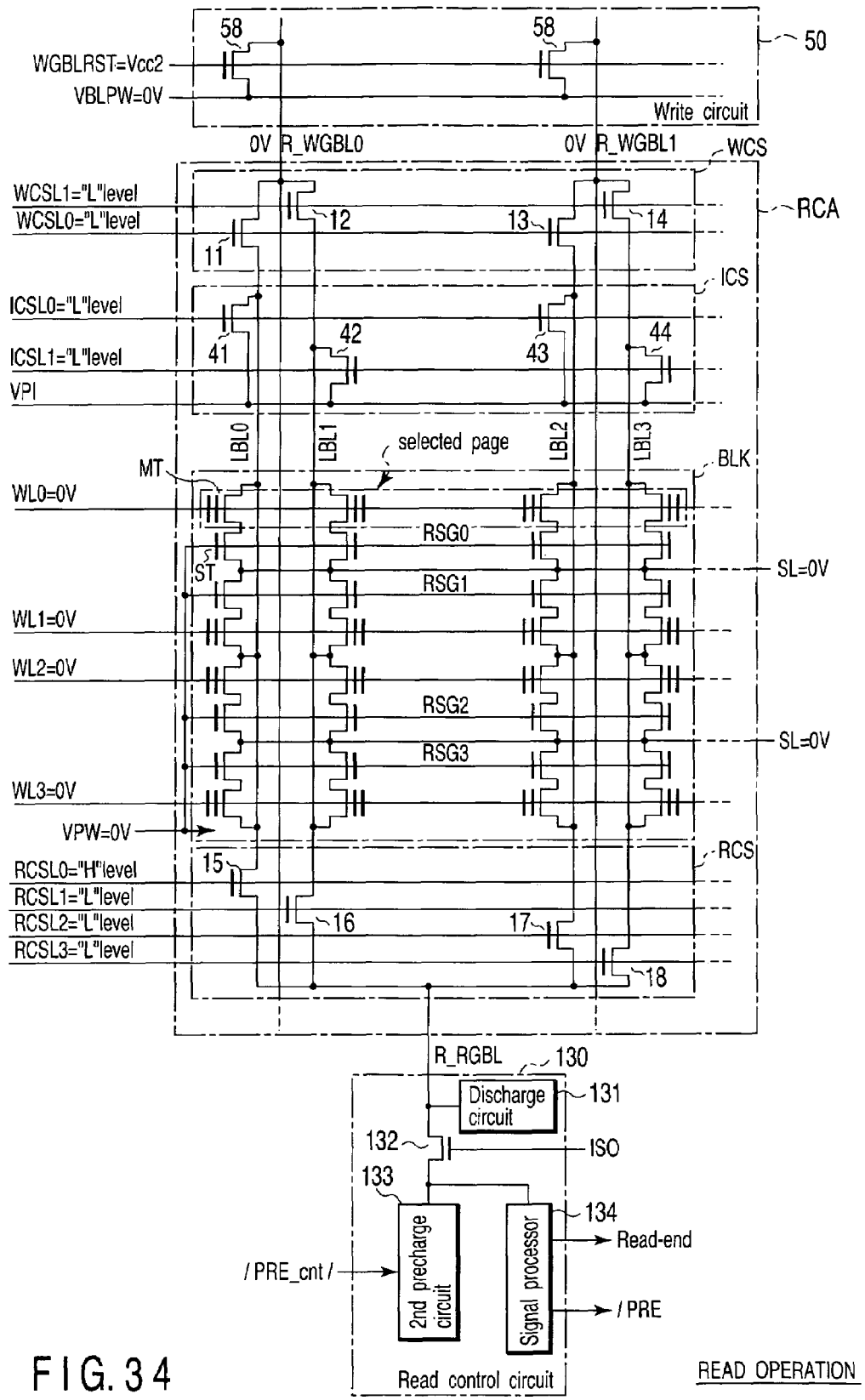
FIG. 34 is a circuit diagram to help explain the replica cell array and read circuit in a read operation of the 2Tr flash memory according to the first embodiment.

Next, using FIGS. 33 and 34, a read operation will be explained. FIG. 33 is a circuit diagram of the prime cell array PCA and read unit 61 in the 2Tr flash memory 3. FIG. 34 is a circuit diagram of the replica cell array RCA and read control circuit 130 in the 2Tr flash memory. FIG. 33 shows a case where data is read from the memory cell transistor MT connected to local bit line LBL0 and word line WL0. FIG. 34 is a diagram to help explain the replica cell array RCA in that case.

In this embodiment, data is read only from the prime cell array PCA and is not read from the replica cell array RCA. Data is read from one prime cell PC per memory cell block BLK. However, when there are a plurality of read global bit lines per memory cell block BLK, as many items of data as correspond to the read global bit lines are read out.

As shown in FIG. 33, first, the select gate decoder 30 selects select gate line SG0 (high (H) level: Vcc=3V). The write decoder 20 makes all of the word lines WL0 to WL(4m+3) unselected (0V) and sets the potential VPW at the p-well region 202 to 0V. Moreover, the source line driver 70 sets the potential on the source lines to 0V.

Then, the column decoder 40 selects read column select line RCSL0 from the four read column select lines RCSL0 to RCSL3 connected to the read column selector RCS corresponding to the memory cell block BLK including the selected select gate line SG0. This turns on the MOS transistor 15 in the read column selector RCS corresponding to the memory cell block BLK including the selected select gate line SG0. In addition, the signal ISO is made high, which turns on the MOS transistor 72. As a result, read global bit line RGBL0 is electrically connected to local bit line LBL0. All of the read column select lines connected to the read column selectors RCS corresponding to the memory cell blocks BLK not including the selected select gate line SG0 are made unselected.

Furthermore, the column decoder 40 makes all of the write column select lines WCSL0 to WCSL(2m+1) unselected, which turns off all of the four MOS transistors 11 to 14 in all of the write column select lines WCSL0 to WCSL(2m+1). Therefore, write global bit line WGBL is electrically isolated from local bit lines LBL0 to LBL3.

As a result, any one of the local bit lines LBL0 to LBL3 per memory cell block BLK is connected to the sense amplifier 64 via the read column selector RCS, read global bit line, and MOS transistor 72.

Then, a change in the potential on the read global bit line RGBL is amplified by the sense amplifier 64, thereby reading the data. Specifically, for example, 3.0V is applied to read global bit line RGBL0. If the data written in the memory cell transistor MT connected to the selected word line WL0 and selected local bit line LBL0 is "1," current flows from read global bit line RGBL0 to the source line. On the other hand, if the data written in the memory cell transistor is "0," no current flows.

In the replica cell array RCA, replica select gate lines RSG0 to RSG(4m+3) are set to 0V (=VPW). Therefore, the data is not read from the replica cell RC connected to the selected word line WL0.

Figure 36:
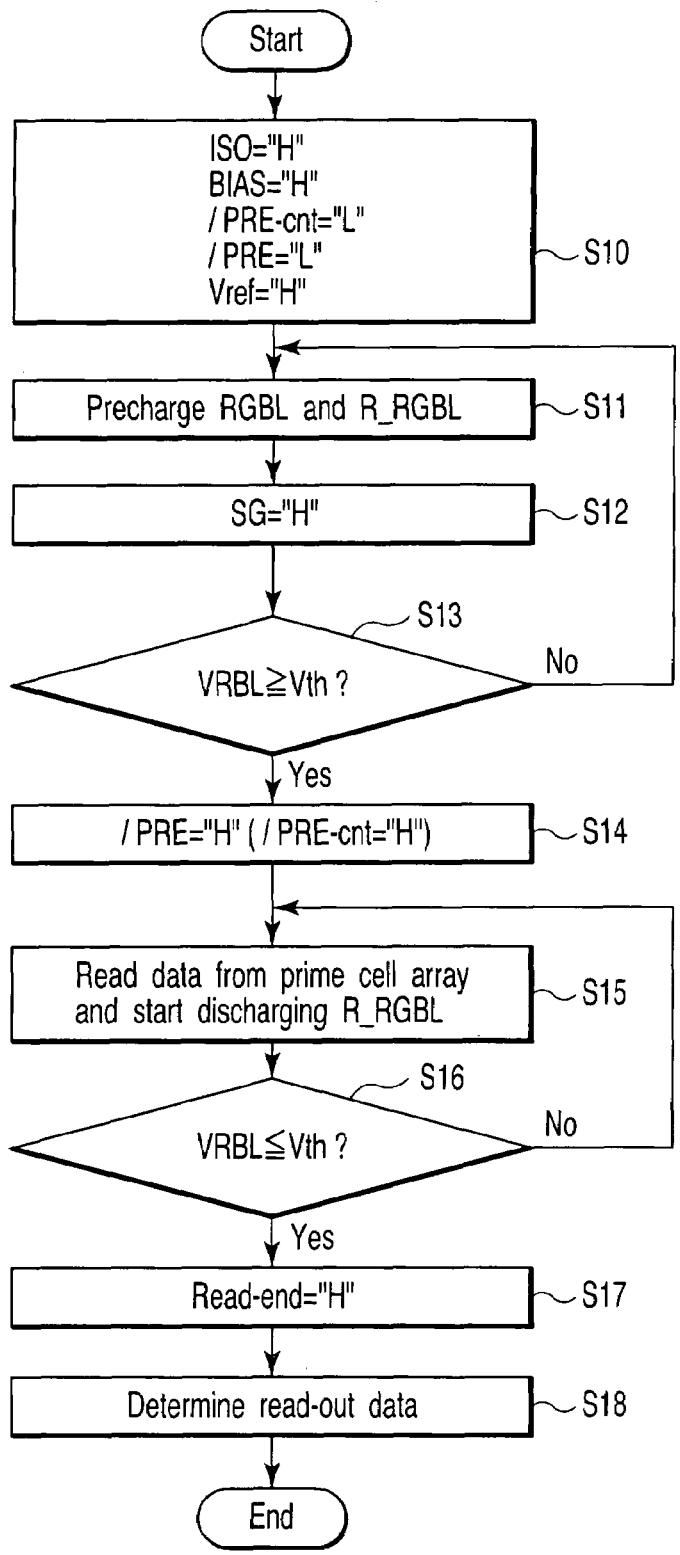
FIG. 36 is a flowchart for a read operation of the 2Tr flash memory according to the first embodiment.
Figure 37:
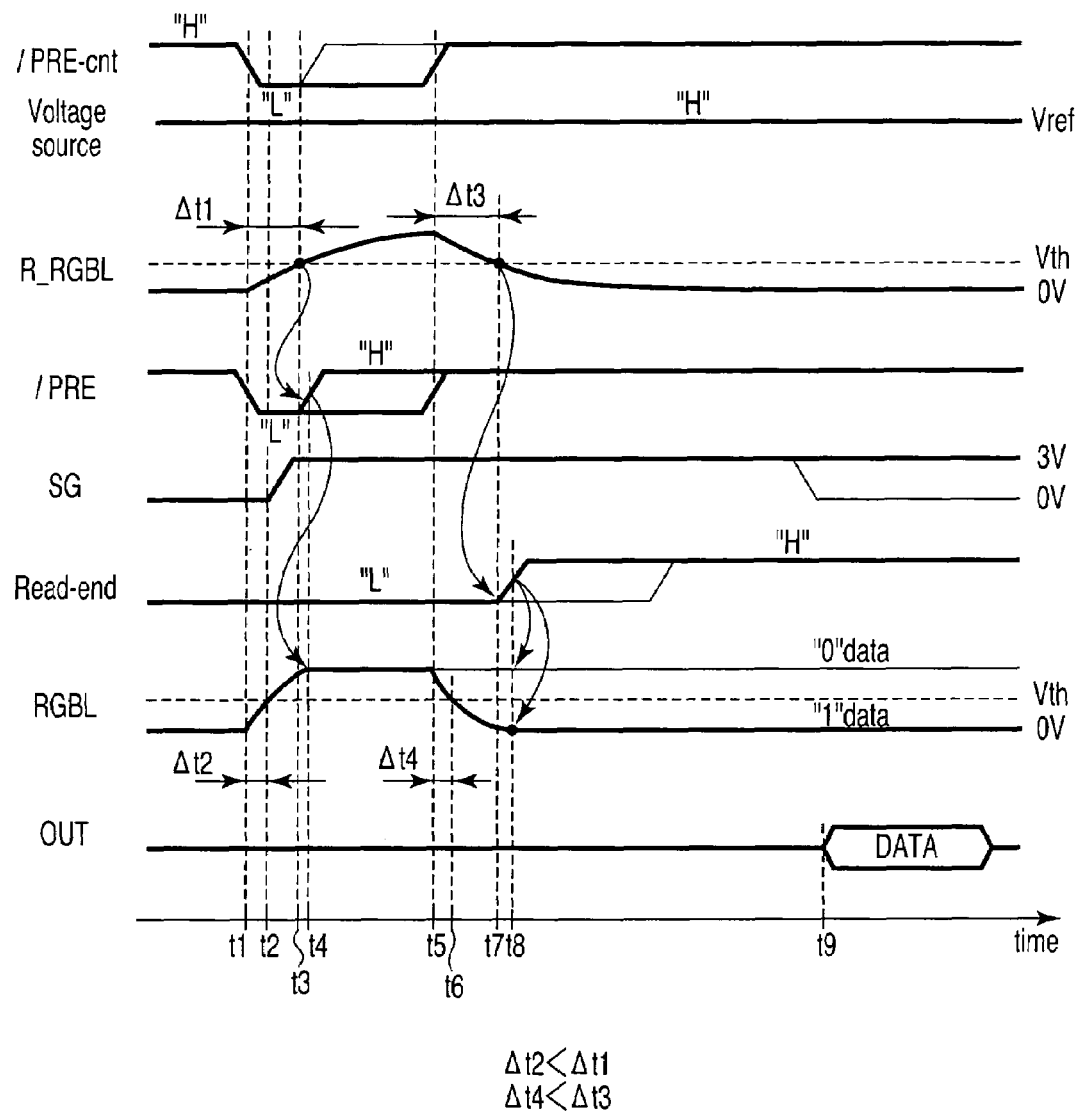
FIG. 37 is a timing chart for various signals in a read operation of the 2Tr flash memory according to the first embodiment.

Using FIGS. 36 and 37, the read operation will be explained in detail. FIG. 36 is a flowchart for the read operation and FIG. 37 is a timing chart for various signals in the read operation. Hereinafter, to simplify explanation, read global bit lines RGBL0 to RGBLn are simply referred to as RGBL.

Before a read operation, read global bit lines RGBL and replica read global bit lines R_RGBL are connected to any one of the local bit lines LBL0 to LBL3. Moreover, the signal BIAS and Vref are set to the high (H) level and the signals /PRE-cnt, /PRE are set to the low (L) level. This brings the MOS transistors 65, 66 of the first precharge circuit 63, the MOS transistors 135, 136 of the second precharge circuit 133 and the MOS transistors 137-1, 137-2 into the on state and the MOS transistor 139-2 into the off state. In this state, the signal ISO is made high, turning on the MOS transistors 132, 62 (step S10, time t1). As a result, the read global bit lines RGBL and replica read global bit lines R_RGBL are precharged by the first and second precharge circuits 63, 134, respectively (step S11).

Next, the select gate decoder 30 selects any one of the select gate lines SG (step S12, time t2).

The first and second precharge circuits 63, 134 have the same precharging capability (or voltage supplying capability). The parasitic capacitance existing on the read global bit lines RGBL is smaller than that of the replica read global bit lines R_RGBL. Therefore, the rate of rise of the potential on the read global bit lines RGBL is larger than that of the replica read global bit lines R_RGBL. Thus, the potential on the read global bit line RGBL rises up to the data decision threshold value Vth of the sense amplifier 64 earlier than that on the replica read global bit line R_RGBL. In the example of FIG. 37, it takes the time Δt1 for the potential on the replica read global bit line R_RGBL to reach Vth (at time t3), whereas the time required for the potential on the read global bit line RGBL to reach Vth (at time t2) is Δt2 (<Δt1).

The signal generator 134 in the read control circuit 130 monitors the potential VRBL on the replica read global bit lines R_RGBL (see FIG. 4). During the period in which the potential VRBL is lower than Vth, the precharge signal /PRE is kept asserted (at the low level). When the potential VRBL has reached Vth (step S13, time t3 or t5), the precharge signal /PRE is negated (or is made high). After the precharge signal /PRE goes to the high level, the precharging of the read global bit lines RGBL is completed and the MOS transistor 139-2 is turned on. As described above, at this point in time, VRBL has exceeded Vth. The precharge signal /PRE-cnt is also made high, which completes the precharging of the replica read global bit lines R_RGBL (Step S14).

What has been described above holds true even when the parasitic capacitance excising on the read global bit lines RGBL is equal to the parasitic capacitance existing on the replica read global bit lines R_RGBL. The reason is that the replica cell array RCA is provided in such a manner that the distance from the select gate decoder 30 is larger than the distance of the prime cell array PCA from the decoder 30. Accordingly, the signal ISO reaches the prime cell array PCA earlier than the replica cell array RCA. That is, all of the MOS transistors 62 are turned on earlier than the MOS transistor 132. Therefore, the precharging of the read global bit lines RGBL is started earlier than that of the replica read global bit lines R_RGBL.

The voltage Vref may be output at the same time as selection of the select gate line or latter.

The signal /PRE is made high level, with the result that the data held in the prime cell PC is read onto the read global bit lines RGBL. At the same time, the signal /PRE-cnt is made high level, which causes the current source circuit 137 to discharge the charge on the replica read global bit lines R_RGBL (step S15, time t6). At this time, all of the replica select gate lines RSG are at 0V.

When the prime cell PC connected to the selected gate line holds "0" data, the potential VBL on the read global bit line RGBL remain at the precharge potential. On the other hand, when the prime cell PC holds "1" data, the potential VBL drops from the precharge potential toward 0V. The potential VRBL on the replica read global bit line R_RGBL drops toward 0V, regardless of the threshold value of the replica cell RC. The rate of drop in the potential on the read global bit line RGBL is larger than that of the replica read global bit line R_RGBL. Therefore, the potential on the read global bit line RGBL connected to the prime cell holding "1" data drops earlier to the data decision threshold value Vth of the sense amplifier 64 than the potential on the replica read global bit line R_RGBL. The reason is that, since the parasitic capacitance existing on the read global bit line RGBL is smaller than the parasitic capacitance existing on the replica read global bit line R_RGBL, the time required for the read global bit line RGBL to discharge is shorter than that for the replica read global bit line RGBL. In the example of FIG. 37, the time required for the potential on the replica read global bit line R_RGBL to reach Vth from the precharge level is Δt3 (time t7), whereas the time required for the potential on the read global bit line RGBL to reach Vth from the precharge level is Δt4 (<Δt3) (time t6).

During the period in which the potential VRBL is higher than Vth, the signal generator 134 of the read control circuit 130 keeps negating the read end signal Read-end (low (L) level). When the potential VRBL has reached Vth (step S16, time t7), the read end signal Read-end is asserted (or is made high; step S17, time t7). After the read end signal Read-end is made high, the sense amplifier 64 determines the read data on the basis of the potential VBL at that point in time (step S18, time t8). More specifically, the data stored in the flip-flop at time t8 is determined as the read data. That is, if the potential VBL has exceeded Vth at time t9, the sense amplifier 64 determines that the stored data is "0" data. If the potential VBL has not exceeded Vth, the sense amplifier 64 determines that the stored data is "1" data. As described above, when the prime cell PC holds "1" data, the potential VBL has dropped below Vth at the time when the read end signal Rread-end is made high.

Then, at time t9, the sense amplifier 4 outputs the read-out data determined at time t8 as an output signal OUT.

<Erase Operation>

Figure 35:
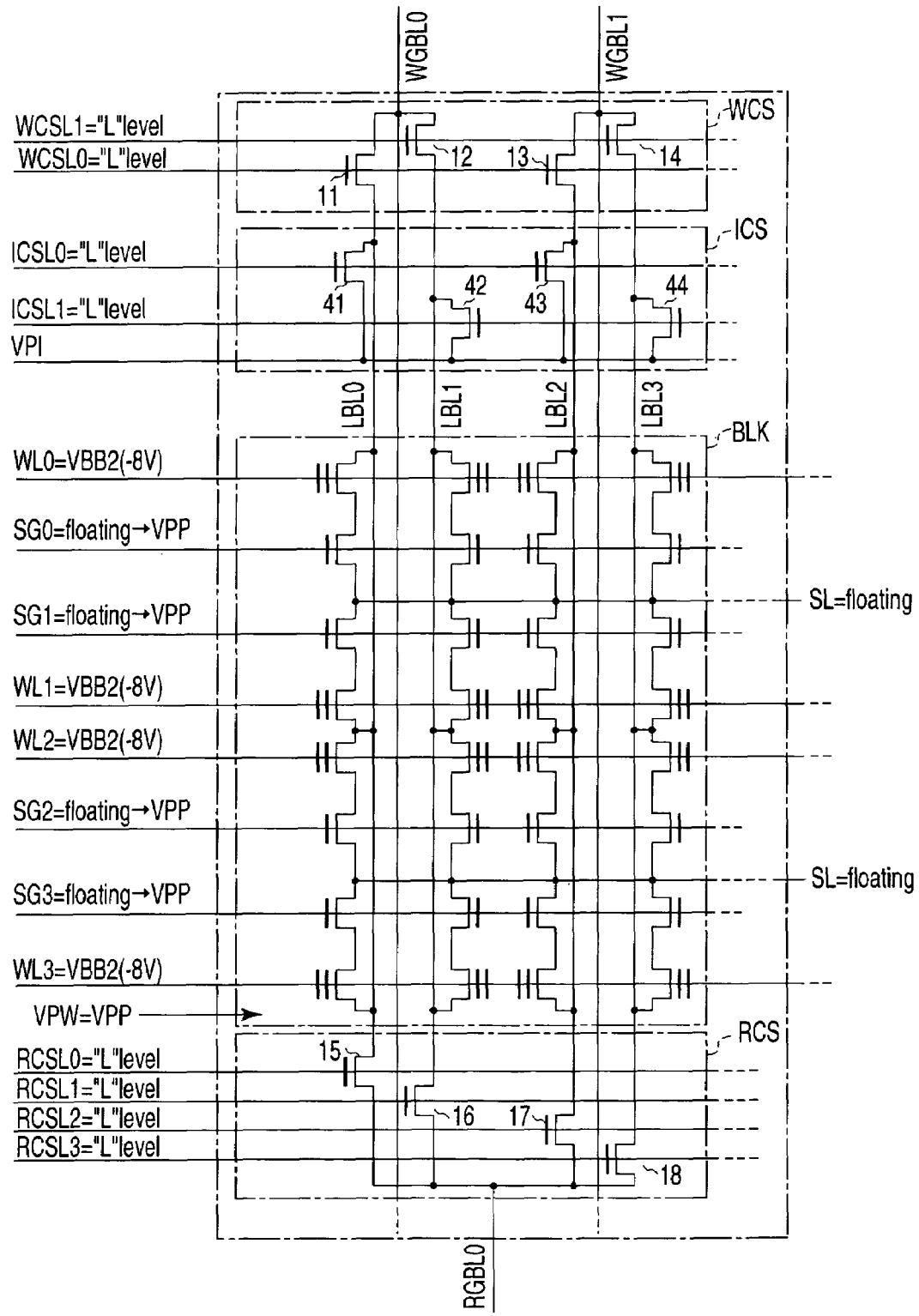
FIG. 35 is a circuit diagram to help explain the prime cell array in an erase operation of the 2Tr flash memory according to the first embodiment.

Next, using FIG. 35, an erase operation will be explained. An erase operation is carried out at time t4 and later in FIG. 28. FIG. 35 is a circuit diagram of the memory cell array 10 in an erase operation. Data is erased from all of the memory cells MC sharing the p-well region 202 simultaneously. An erase operation is carried out by pulling electrons out of the floating gate by FN tunneling.

Before an erase operation, all of the MOS transistors 11 to 16 are turned off. Therefore, all of the write global bit lines WGBL0, WGBL1 are electrically isolates from the latch circuit 51 and from VBLPW node and VPI node and therefore go into the floating state.

Then, the write decoder 20 applies the negative voltage VBB2 to all of the word lines WL0 to WL(4m+3) in the selected block. In addition, the write decoder 20 applies the positive potential VPP to the substrate (p-well region 202) in which memory cells have been formed. In the erase operation, the signals ZISOG and WSG are made low, which electrically isolates the row address decode circuits 31, 21 of the select gate decoder 30 and write decoder 20 from the select gate lines.

As a result, electrons are extracted from the floating gates of the memory cell transistors of the memory cells MC into the semiconductor substrate by FN tunneling. This makes negative the threshold voltages of all of the prime cells PC and replica cells RC connected to word lines word lines WL0 to WL(4m+3), thereby erasing the data.

As described above, the data is erased simultaneously.

The flash memory according to the first embodiment of the present invention produces the effects in item (1) to item (7) below.

(1) The data reading accuracy can be improved (first aspect).

Figure 38:
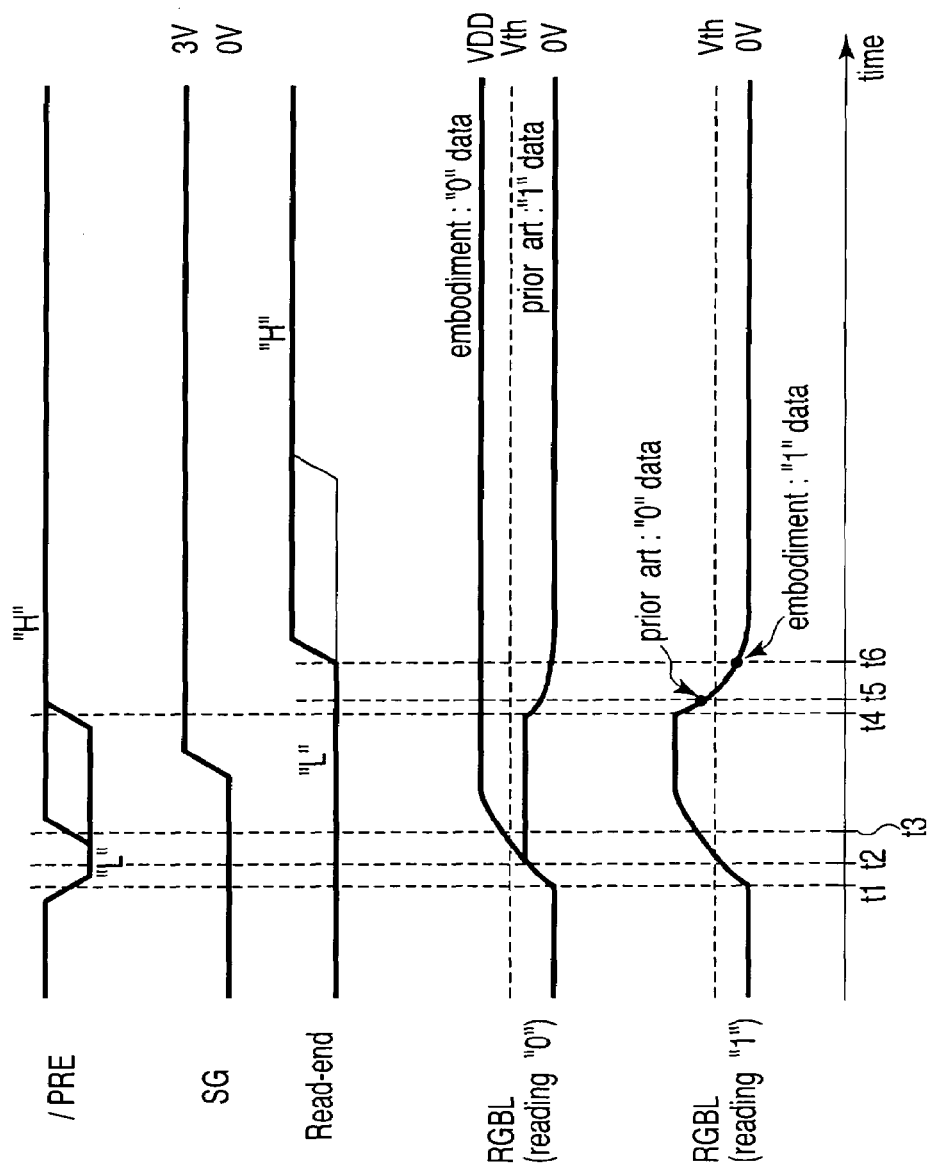
FIG. 38 is a timing chart for various signals in a read operation of the 2Tr flash memory according to the first embodiment and of a conventional 2Tr flash memory.

With the configuration of the first embodiment, the data reading accuracy can be improved. This will be explained using FIG. 38. FIG. 38 is a timing chart for the precharge signal /PRE, the potential on the select gate line SG, the read end signal Read-end, the potential on the read global bit line RGBL in reading "0" data and the potential on the read global bit line RGBL in reading "1" data.

(1-1) Reading "0" data

First, the way of reading "0" data will be explained. In a conventional reading method, the precharge time of a bit line was sometimes too short. In the example of FIG. 38, there was a case where the precharging ended at time t2 before the potential on the bit line rose to the data decision threshold value Vth of the sense amplifier. In this case, since the bit line potential (precharge potential) is lower than Vth, even if the data held in the memory cell is "0" data, the sense amplifier determines erroneously that the read-out data is "1" data.

However, in the first embodiment, it is after the replica read global bit line has reached Vth that the precharging of the read global bit line is completed. At this point in time, the potential on the read global bit line has surely exceeded Vth. Thus, it is possible to determine the read-out data exactly. This will be explained using FIG. 39.

Figure 39:
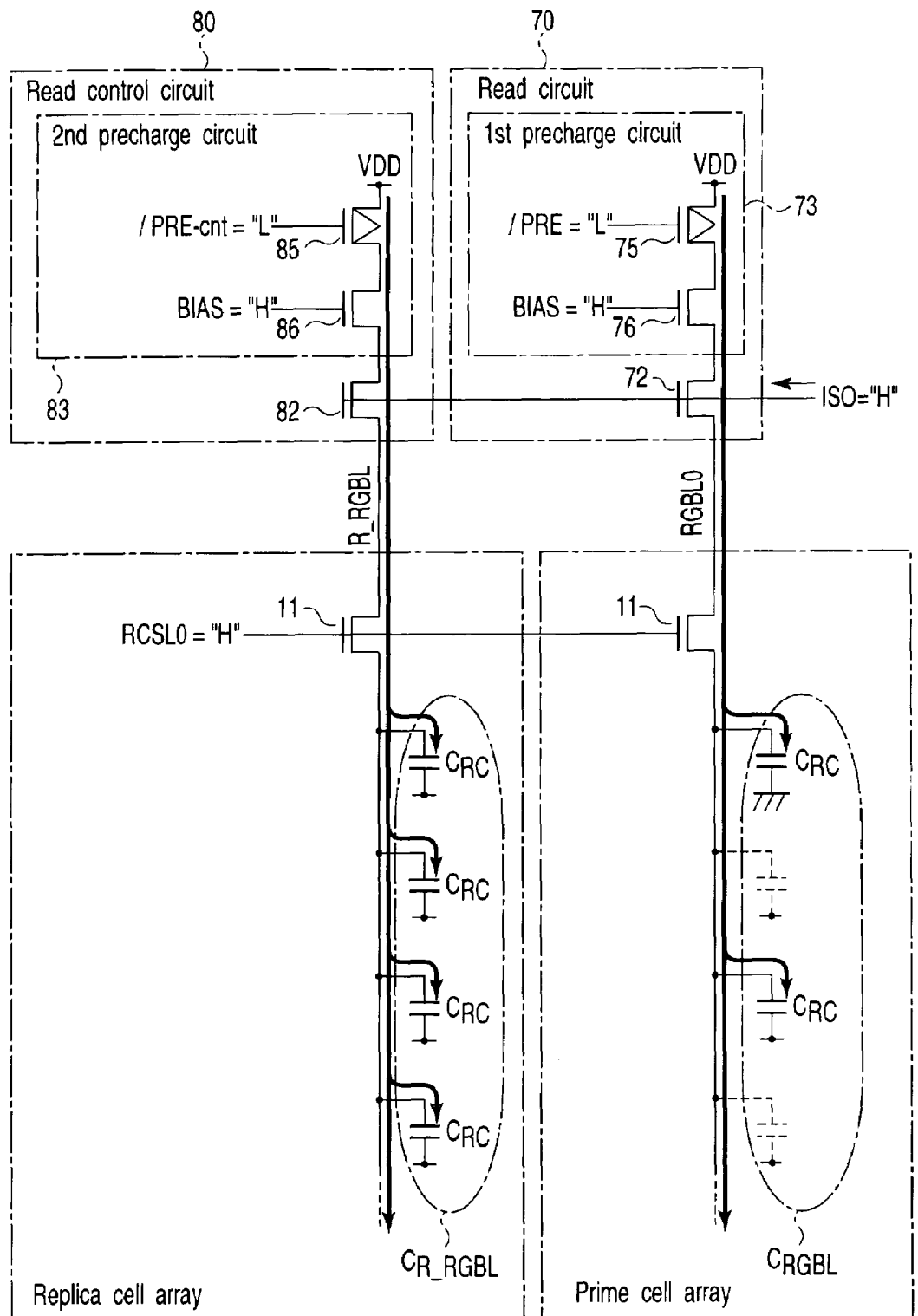
FIG. 39 is a circuit diagram of the memory cell array, read circuit, and read control circuit in precharging the bit lines in the 2Tr flash memory according to the first embodiment.

FIG. 39 is a schematic circuit diagram of the prime cell array PCA, replica cell array RCA, read circuit 60, and read control circuit 130 in a precharge operation.

The precharging of the read global bit lines RGBL is done by a first precharge circuit 73 and the precharging of the replica read global bit lines R_RGBL is done by a second precharge circuit 133. The first and second precharge circuits have the same precharging capability. Therefore, the time required for precharging is determined by the parasitic capacitances existing on the read global bit lines R_RGBL and replica read global bit lines RGBL. The larger the parasitic capacitance, the longer time the precharging takes.

As described above, the parasitic capacitance of each of the local bit lines LBL0 to LBL3 in the prime cell array PCA is smaller than the parasitic capacitance of each of the local bit lines LBL0 to LBL3 in the replica cell array RCA. That is, the parasitic capacitance $C_{R\_RGBL}$ existing on the replica read global bit line R_RGBL is larger than the parasitic capacitance $C_{RGBL}$ existing on the read global bit line RGBL. Then, when $C_{R\_RGBL} > C_{RGBL}$, the time required to precharge the replica read global bit line R_RGBL is longer than the time required to precharge the read global bit line RGBL.

Then, on the basis of the potential on the replica read global bit line R_RGBL, the signal generator 134 generates a precharge signal /PRE. More specifically, after the potential on the replica read global bit line R_RGBL has exceeded the data decision threshold value Vth of the sense amplifier 64, the precharge signal /PRE is negated. In other words, only when the potential on the bit line (replica read global bit line R_RGBL) which takes the longest time to discharge has exceeded Vth, the precharge signal /PRE is negated. Therefore, at the time when the precharge signal /PRE is negated, the potentials on all of the bit lines (read global bit lines and replica read global bit lines) included in the memory cell array 10 have exceeded Vth. Accordingly, it is possible to precharge the potentials on the bit lines reliably.

The above effect results from the fact that the replica cell array RCA is farthest away from the select gate decoder 30 which controls the signal ISO. A data read operation, more specifically a precharge operation, is started only after the signal ISO is made high and this makes turns on the MOS transistors 62, 132. Then, since the MOS transistor 132 in the read control circuit 130 is farther away from the select gate decoder 30 than all of the MOS transistors 62 in the read circuit 60, it is after all of the MOS transistors 62 are turned on that the MOS transistor 132 is turned on. That is, it is after the precharging of all of the read global bit lines RGBL is started that the replica read global bit line R_RGBL is precharged. Using as a reference the potential on the replica read global bit line R_RGBL which is precharged last, the signal generator 134 controls the precharge signal /PRE. Therefore, it is possible to raise reliably to Vth or higher the potential on the read global bit line RGBL which is precharged earlier than the replica read global bit line R_RGBL. Since the replica cell array RCA is farthest away from the select gate decoder 30, a similar effect will be obtained even if $C_{R\_RGBL} = C_{RGBL}$.

(1-2) Reading "1" data

Next, the way of reading "1" data will be explained. In a conventional reading method, the read time was sometimes too short. In the example of FIG. 38, there was a case where the reading of the data from the memory cell ended at time t5 before the potential on the bit line dropped to the data decision threshold value Vth of the sense amplifier. In this case, since the bit line potential is higher than Vth, even if the data held in the memory cell is "1" data, the sense amplifier determines erroneously that the read-out data is "0" data.

Figure 40:
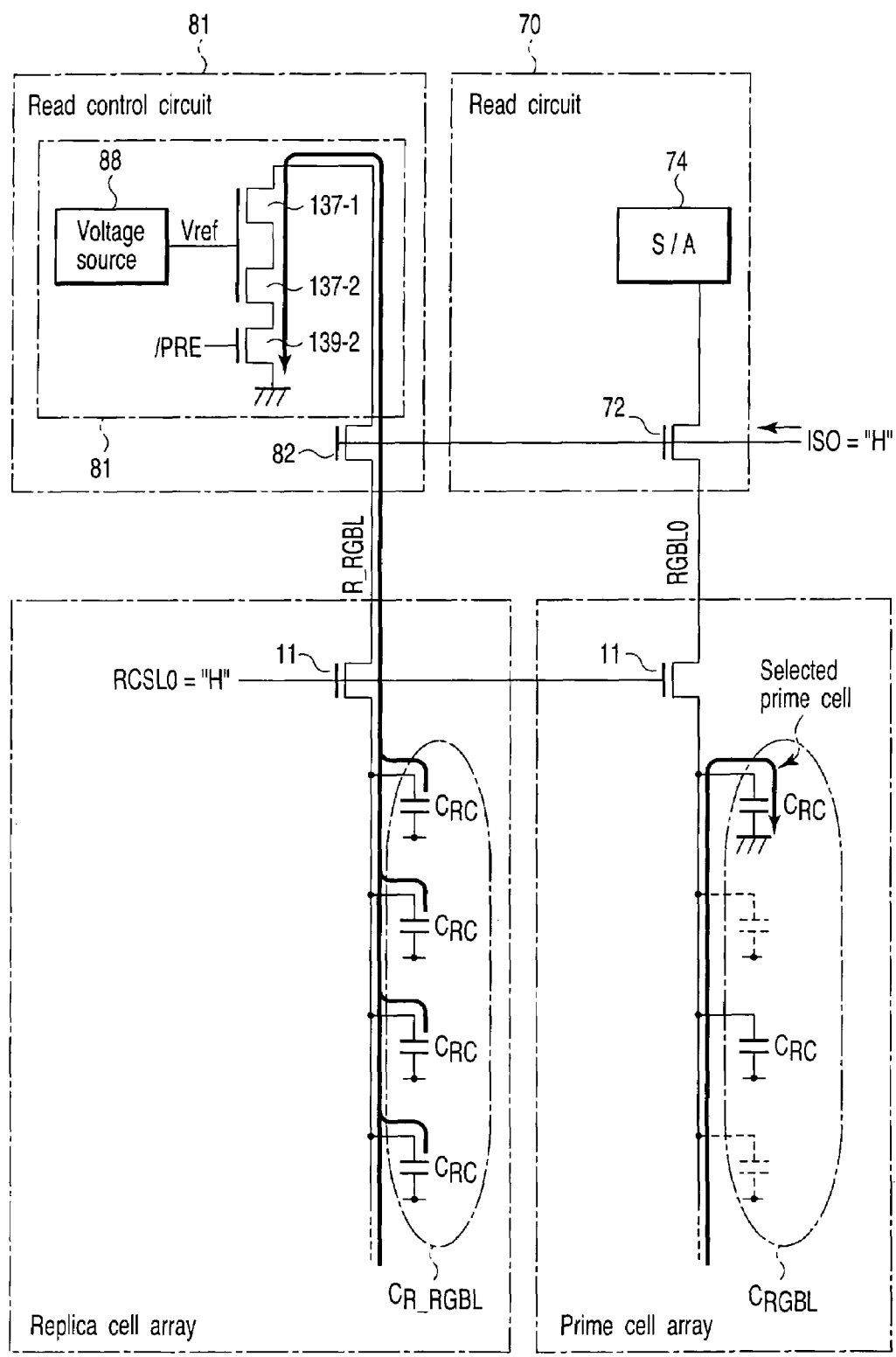
FIG. 40 is a circuit diagram of the memory cell array, read circuit, and read control circuit in discharging the bit lines in the 2Tr flash memory according to the first embodiment.

However, in the first embodiment, it is after the potential on the replica read global bit line has dropped to Vth since the discharging of the replica read global bit line was started that the reading of the data from the prime cell is completed. At this point in time, the potential on the read global bit line has surely dropped below Vth. Thus, it is possible to determine the read-out data exactly. This will be explained using FIG. 40. FIG. 40 is a schematic circuit diagram of the prime cell array PCA, replica cell array RCA, read circuit 60, and read control circuit 130 in a discharge operation.

The discharging of the read global bit lines RGBL is done by the selected prime cell PC and the precharging of the replica read global bit lines R_RGBL is done by the discharge circuit 131. The current source circuit 137 in the discharge circuit 131 has the same configuration as that of the memory cell and is designed to supply a smaller current than the discharge current flowing when the prime cell array PCA is all erased. In addition, the parasitic capacitance $C_{R\_RGBL}$ is made larger than the parasitic capacitance $C_{RGBL}$. Therefore, the time required to discharge the replica read global bit line R_RGBL is longer than the time required to discharge the read global bit line RGBL.

Then, on the basis of the potential on the replica read global bit line R_RGBL, the signal generator 134 generates a read end signal Read-end. More specifically, after the potential on the replica read global bit line R_RGBL has dropped below the data decision threshold value Vth of the sense amplifier 64, the signal generator 134 asserts a read end signal Read-end. In other words, only when the potential on the bit line (replica read global bit line R_RGBL) which takes the longest time to discharge has dropped below Vth, the signal generator 134 asserts a read end signal Read-end. Therefore, at the time when a read end signal Read-end is asserted, the potentials on the replica read global bit lines and on all of the read global bit lines to which the selected prime cell holding "1" data is connected have dropped below Vth. In this way, after the potentials on the bit lines onto which "1" data has been read have surely dropped below Vth, a read end signal Read-end can be asserted.

(2) The data reading accuracy can be improved (aspect 2).

In the configuration of the first embodiment, the replica select gate lines RSG are isolated from the select gate lines and are connected to the p-well region. In a read operation, all of the replica select gate lines RSG are set to 0V. Thus, all of the replica cells RC are off in a read operation. With this configuration, the replica cells RC are prevented from being used in discharging the replica read global bit lines R_RGBL.

When the replica cells RC are used for discharging as in the prior art, the current supplying capability in discharging depends on the threshold voltage of the replica cells. The threshold voltage is determined by the proportion of electrons injected into the floating gate. Therefore, in this case, the current supplying capability of the replica cells in discharging varies according to a change in the threshold voltage of the replica cells caused by disturbance. As a result, it is difficult to always discharge the replica read global bit line R_RGBL at a constant voltage change rate.

However, in the first embodiment, since the replica cells are not used for discharging, the above problem can be solved. Instead, the current source circuit 137 is used to discharge the replica read global bit lines R_RGBL. The current source circuit 137 has the same configuration as that of the replica cell RC, except that a gate voltage is applied to the floating gate. Accordingly, unlike the replica cells RC, the current source circuit 137 is not affected by disturbance and therefore can always discharge the replica read global bit lines R_RGBL at a constant voltage change rate. As a result, the data reading accuracy can be improved.

(3) The data reading speed can be improved.

In parallel with item (1), the data reading speed can be improved. This will be explained using FIG. 38. FIG. 38 shows a case where precharging is done until the potential on the read global bit lines RGBL has reached about VDD and discharging is done until 0V has been reached. However, the effect in item (1) can be obtained even by completing the precharging at time T3 in FIG. 38 and ending the discharging at time t6. That is, even when the precharging is completed at time t3, the potential on the read global bit lines RGBL has exceeded Vth. Moreover, even when the discharging is completed at time t6, the potential on the read global bit lines RGBL has dropped below Vth. Therefore, even when the discharging is started at time t3 and the discharging is completed at time t6 to determine the read-out data, accurate reading can be done. That is, there is no need to allow an extra margin to the precharge and the discharge periods. Therefore, it is possible to improve the reading speed remarkably.

(4) The effects in item (1) to item (3) can be obtained without complicating the manufacturing processes.

In the configuration of the first embodiment, the replica cell array RCA and read control circuit 130 are provided. The configuration of the replica cell array RCA is almost the same as that of the prime cell array PCA. The second precharge circuit 83 of the read control circuit 130 has the same configuration as that of the first precharge circuit 73 of the read circuit 60. Furthermore, the current source circuit 137 of the read control circuit 130 has almost the same configuration as that of the memory cell array 10. Accordingly, the replica cell array RCA and read control circuit 130 can be fabricated by the same processes as those for the prime cell array PCA and read circuit 60. Therefore, the first embodiment can be implemented without complicating the manufacturing processes.

The current source circuit 137 of the discharge circuit 131 requires two MOS transistors to function sufficiently. In this case, however, its pattern stands alone and the reliability of lithography could deteriorate. Therefore, as explained in FIG. 24 of the first embodiment, it is desirable that the current source circuit 137 should be formed of a plurality of MOS transistors including dummy MOS transistors. Since the configuration of the current source circuit 137 is almost the same as that of the memory cell array 10, it may be provided in the memory cell array 10.

(5) The operating speed of the flash memory can be improved.

With the configuration of the embodiment, the bit lines are hierarchized into the local bit lines and the global bit lines (read global bit lines and write global bit lines). That is, a plurality of memory cells are connected to each of a plurality of local bit lines. A plurality of local bit lines are connected to each of a plurality of global bit lines. In the example of FIG. 2, 2(m+1) local bit lines (LBL0 and LBL1 or LBL2 and LBL3) are connected to one write global bit line WGBL via the write column selector WCS. Then, four memory cells are connected to each of the local bit lines LBL. In addition, 4(m+1) local bit lines (LBL0 to LBL3) are connected to one read global bit line RGBL via the read column selector RCS. Then, four memory cells are connected to each of the local bit lines.

In a write operation, only the local bit line LBL to which the selected memory cell has been connected is connected to the write global bit line WGBL. The local bit lines LBL to which the selected memory cell has not been connected are electrically isolated from the write global bit line WGBL by the write column selector WCS. Therefore, only one local bit line including the selected memory cell, that is, four memory cells, can be seen from one write global bit line WGBL. Therefore, only the four memory cells MC contribute to the parasitic capacitance on the write global bit line WGBL. The unselected memory cells which are in the same column as the selected memory cell and are connected to a different local bit line LBL do not contribute to the parasitic capacitance on the write global bit line. Therefore, it is possible to decrease the parasitic capacitance on the write global bit line remarkably. The same holds true for a read operation.

As described above, since the parasitic capacitance on the write global bit line and read global bit line are reduced, the operating speed of the flash memory can be improved.

(6) The read speed can be improved.

In the flash memory, relatively high voltages, including VPP, VBB1 and VBB2 have to be handled in a write operation. To meet this requirement, high-withstand-voltage MOS transistors whose gate insulating film is thick have to be used. On the other hand, the voltages handled in a read operation are lower than in a write operation. Therefore, as far as a read operation is concerned, it is desirable that low-withstand-voltage MOS transistors whose gate insulating film is thin should be used. Even from the viewpoint of operating speed, it is desirable that low-withstand-voltage MOS transistors should be used.

In this respect, with the configuration of the embodiment, the local bit lines are connected to the write global bit lines and read global bit lines. Then, the memory cells are connected to the write circuit 50 via the write global bit lines and to the read circuit 60 via the read global bit lines. That is, the signal route for a write operation differs from the signal route for a read operation. Therefore, in the signal route in a read operation, all of the circuits excluding the read column selector RCS that connects the read global bit lines to the local bit lines can be made using the transistors whose gate insulating film is thin. As a result, the read operating speed can be improved.

(7) The reliability of a write operation can be improved.

As explained in item (5), the bit lines are hierarchized. When the write route is particularly considered, a plurality of local bit lines are connected to one write global bit lines. Then, in a write operation, only one local bit line including the selected memory cell is electrically connected to the write global bit line. The other local bit lines are electrically isolated from the write local bit line. Therefore, the voltage corresponding to the write data is not applied to the local bit lines to which the selected memory cell is not connected. Therefore, the memory cells connected to these local bit lines can be prevented effectively from being written into erroneously, which enables the reliability of the write operation to be improved.

Figure 41:
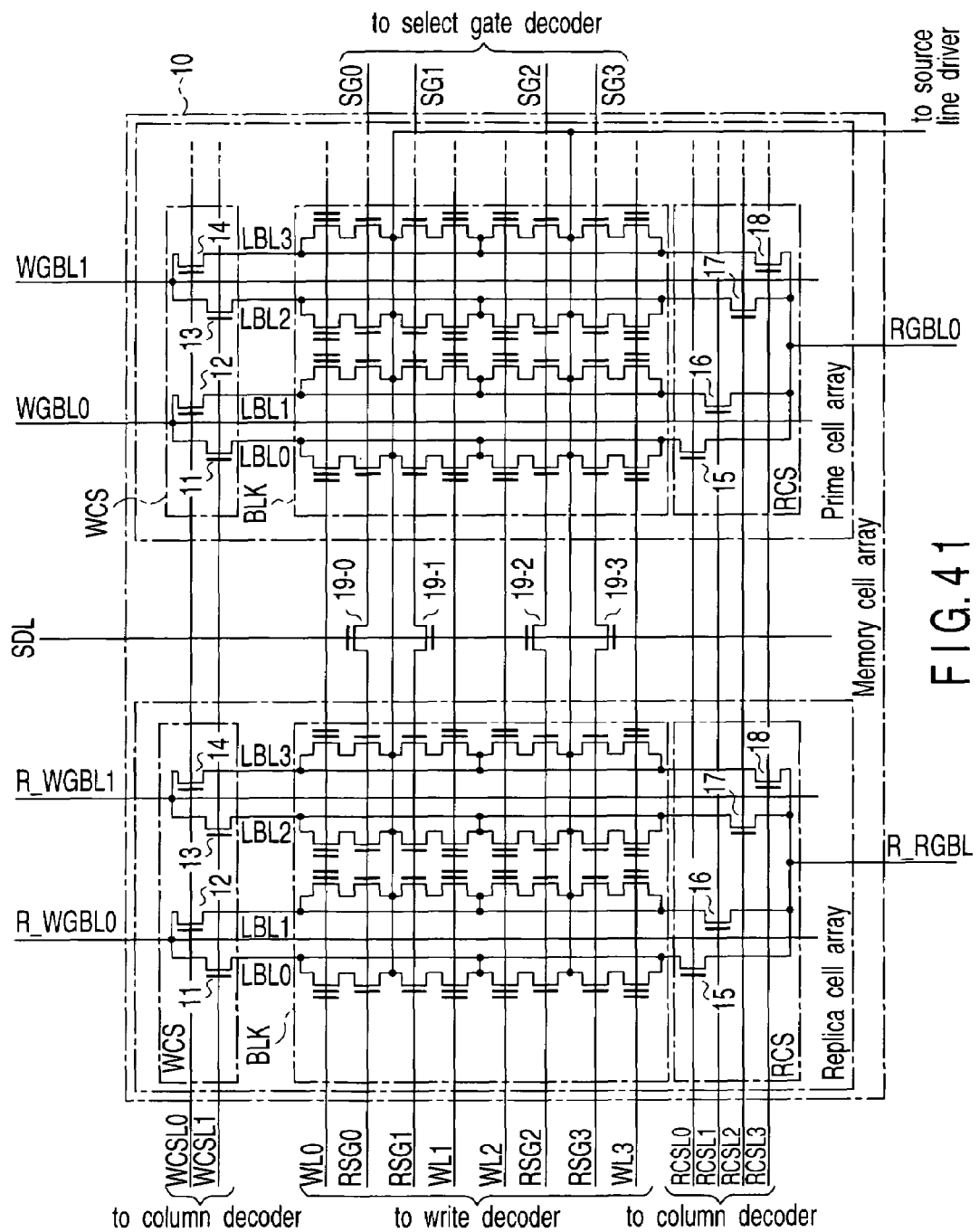
FIG. 41 is a circuit diagram of the memory cell array of a 2Tr flash memory according to a second embodiment of the present invention.
Figure 42:
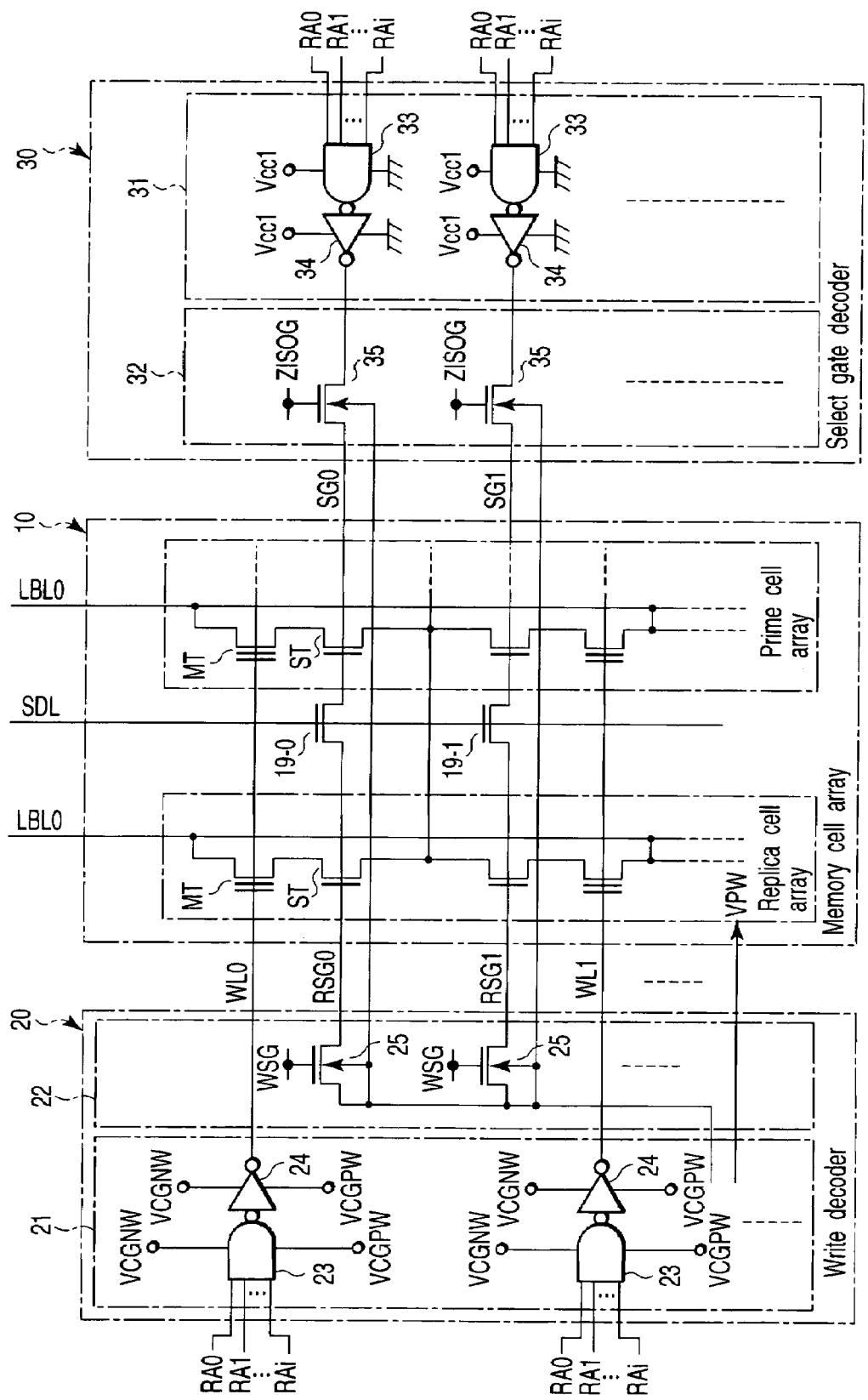
FIG. 42 is a circuit diagram of the memory cell array, write decoder, and select gate decoder included in the 2Tr flash memory according to the second embodiment.

Next, a semiconductor memory device according to a second embodiment of the present invention will be explained. The second embodiment is such that the select gate lines and the replica select gate lines are switched by MOS transistors in the first embodiment. Since the configuration of the second embodiment is the same as that of the first embodiment except for the memory cell array, its explanation will be omitted. FIG. 41 is a circuit diagram of the memory cell array 10 included in a 2Tr flash memory 3 according to the second embodiment. FIG. 42 is a circuit diagram of the memory cell array 10, write decoder 20, and select gate decoder 30.

As shown in the figures, in the configuration explained in the first embodiment, the memory cell array 10 of the second embodiment is modified as follows.

(1) MOS transistors 19-0 to 19-(4m+3) are provided for select gate lines SG0 to SG(4m+3) in a one-to-one correspondence between the prime cell array PCA and the replica cell array RCA.

(2) One end of each of the select gate lines SG0 to SG(4m+3) is connected to the select gate decoder 30 and the other end is connected to one end of the current path of the corresponding one of the MOS transistors 19-0 to 19-(4m+3).

(3) One end of each of the replica select gate lines RSG0 to RSG(4m+3) is connected to the write decoder 20 and the other end is connected to the other end of the current path of the corresponding one of the MOS transistors 19-0 to 19-(4m+3).

(4) The gates of the MOS transistors 19-0 to 19-(4m+3) are connected commonly to a select dummy line SDL.

Figure 43:
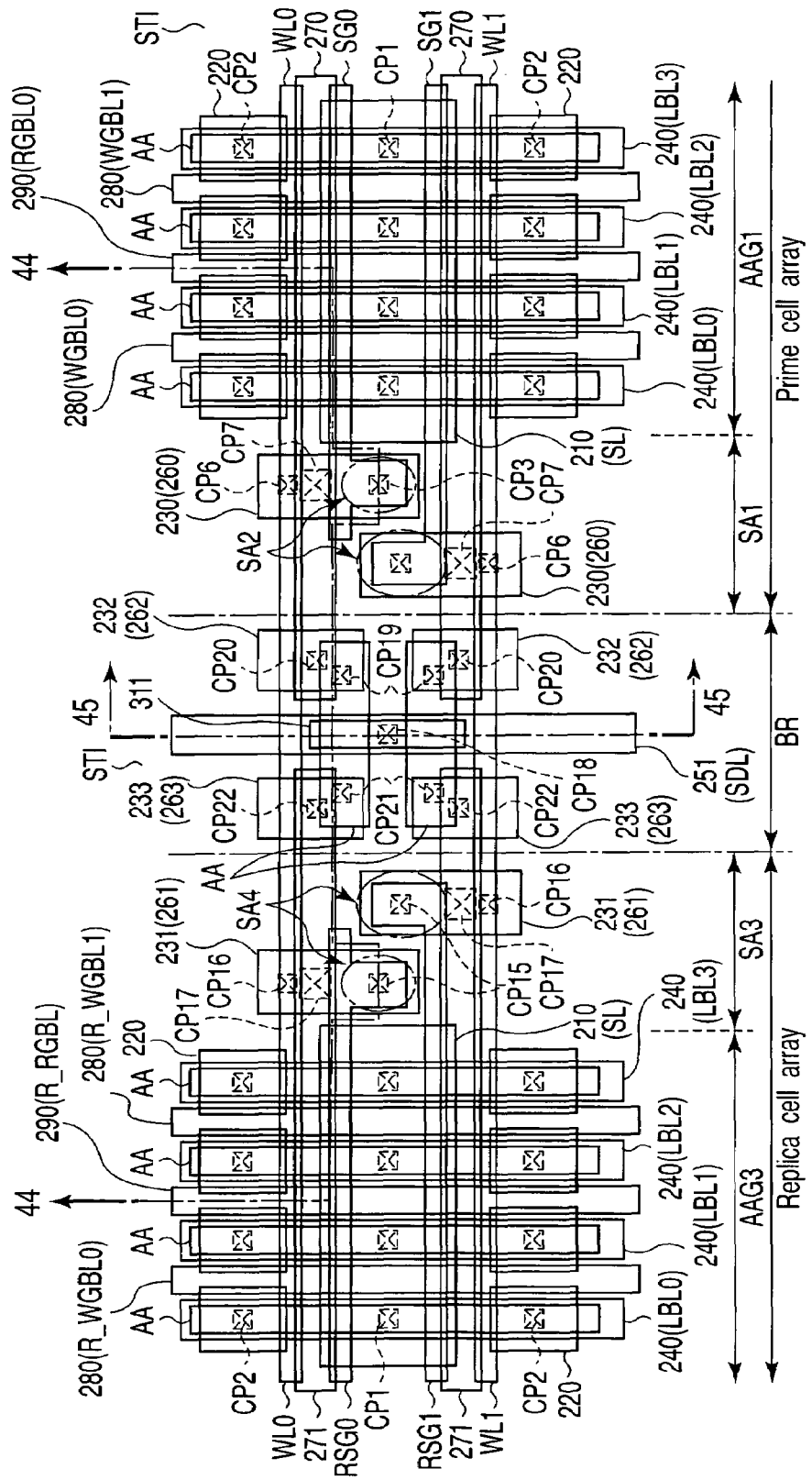
FIG. 43 is a plan view of the memory cell array included in the 2Tr flash memory according to the second embodiment.

Next, using FIG. 43, a plane structure of the memory cell array 10 of the second embodiment will be explained. FIG. 43 is a plan view of a part of the memory cell array 10.

As shown in FIG. 43, the configuration of the prime cell array PCA is the same as that in the first embodiment. The configuration of a third element region group AAG3 in the replica cell array RCA is also the same as that in the first embodiment. A stitch region SA3 in the replica cell array RCA differs from that in the first embodiment and has the same configuration of a stitch region SA1 in the prime cell array PCA. The shunt wires 270 in the first embodiment are separated at the boundary between the prime cell array PCA and the replica cell array RCA. They function as the shunt wires 271 for the replica select gate lines RSG0 to RSG (4m+3) in the replica cell array RCA. Hereinafter, the boundary between the prime cell array PCA and the replica cell array RCA is referred to as the boundary region BR.

Next, the boundary region BR will be explained. In the boundary region BR, select gate lines SG0 to SG(4m+3) and replica select gate lines RSG0 to RSG(4m+3) are removed. On the other hand, word lines WL0 to WL(4m+3) pass through the boundary region BR. In the region from which select gate lines SG0 to SG(4m+3) and replica select gate lines RSG0 to RSG(4m+3) have been removed, the corresponding MOS transistors 19-0 to 19-(4m+3) are formed. That is, element regions AA whose longitudinal direction is in the second direction are formed. Then, strip-shaped gate electrodes 311 are formed in the first direction so as to cross two adjacent element regions sandwiched between two word lines. The gate electrodes 311 are connected commonly to a strip-shaped metal wiring layer 251 extending in the first direction. The metal wiring layer 251 functions as a select dummy line SDL.

To one of the source and drain of each of the MOS transistors 19-0 to 19-(4m+3), the shunt wire 270 for the corresponding one of the select gate lines SG0 to SG(4m+3) is connected via contact plugs CP19, CP20 and metal wiring layers 232, 262. Moreover, to the other of the source and drain of each of the MOS transistors 19-0 to 19-(4m+3), the shunt wire 271 for the corresponding one of the replica select gate lines RSG0 to RSG(4m+3) is connected via contact plugs CP21, CP22 and metal wiring layers 233, 263.

Figure 44:
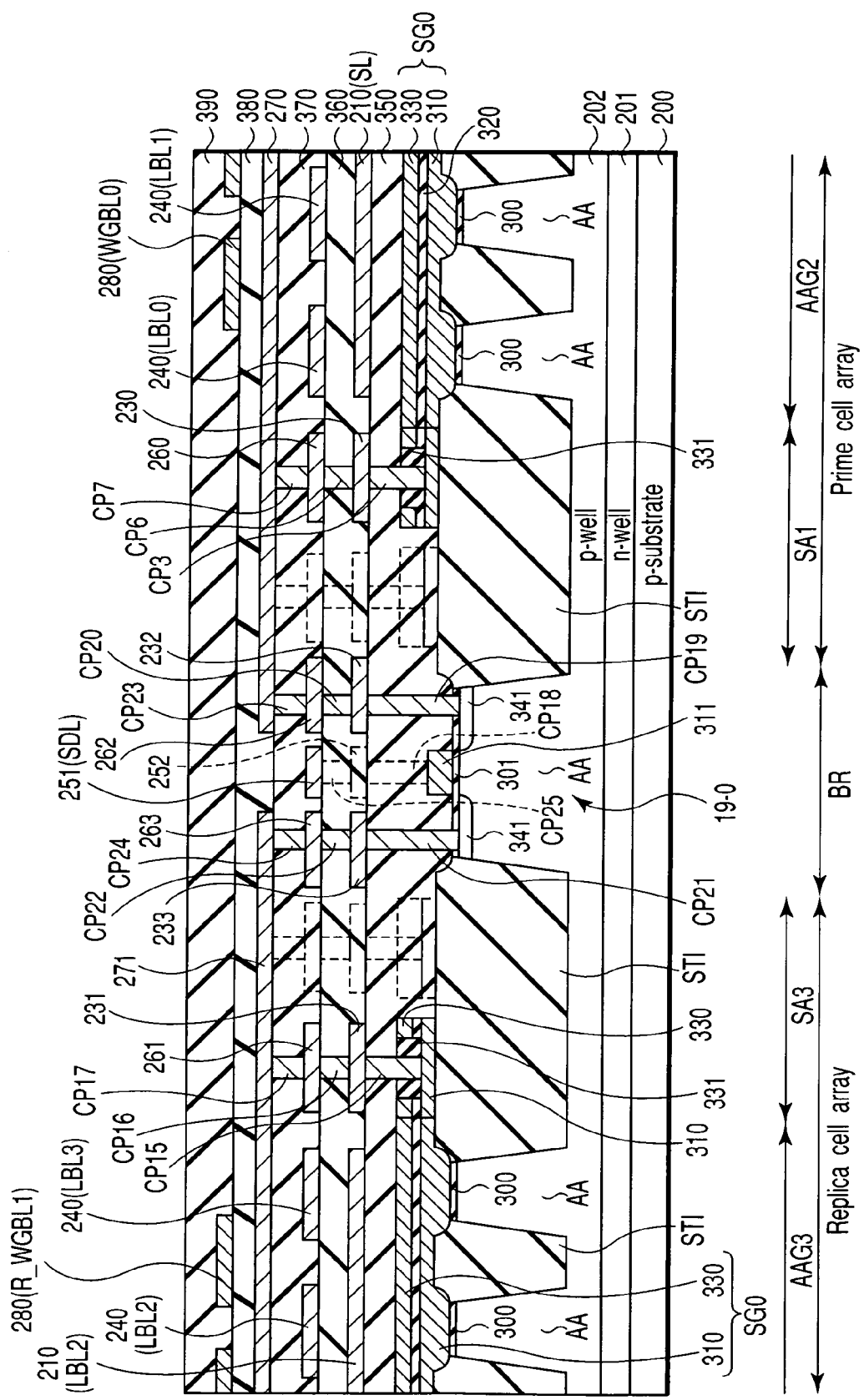
FIG. 44 is a sectional view taken along line 44-44 of FIG. 43.
Figure 45:
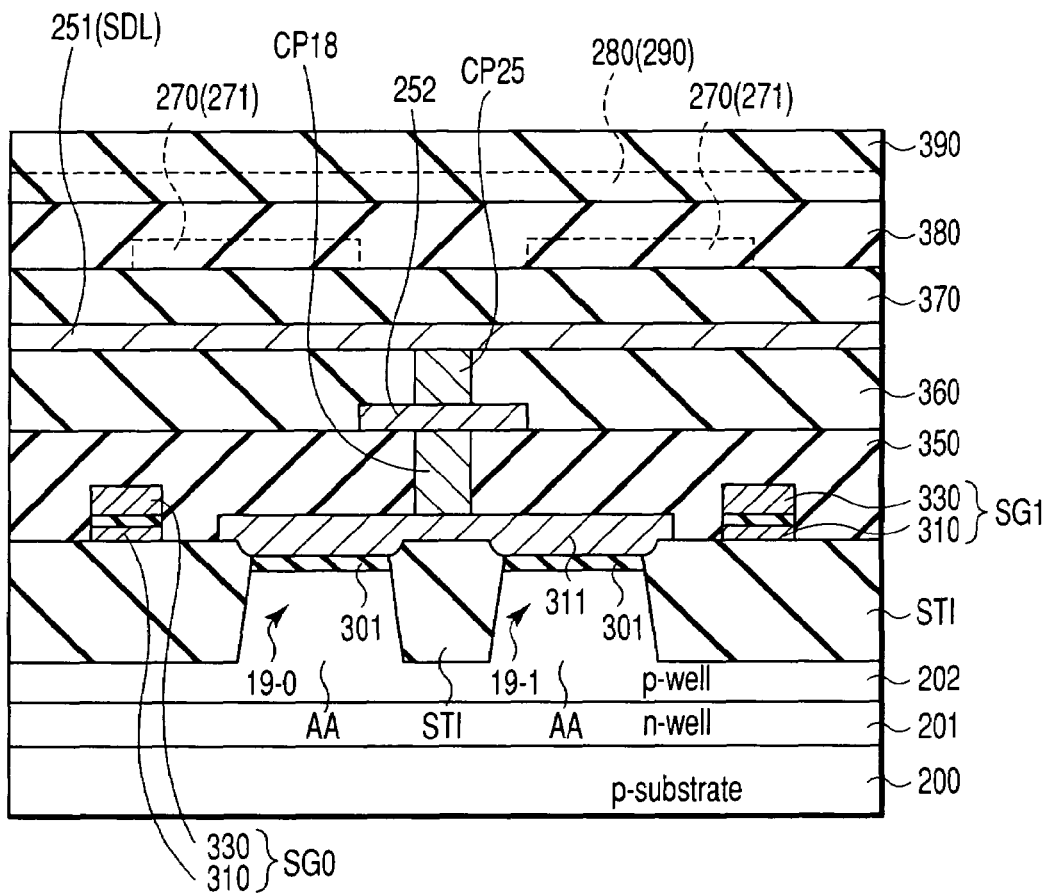
FIG. 45 is a sectional view taken along line 45-45 of FIG. 43.

Next, a sectional structure of the memory cell array 10 configured as described above will be explained. FIG. 44 is a sectional view taken along line 44-44 of FIG. 43. FIG. 45 is a sectional view taken along line 45-45 of FIG. 43.

As shown in the figures, the configuration of the prime cell array PCA is the same as that in the first embodiment, its explanation will be omitted. Since the configuration of a third element region group AAG3 in the replica cell array RCA is such that the shunt wires 270 are just replaced with the shunt wires 271, its explanation will be omitted. Next, a stitch region SA3 in the replica cell array RCA will be explained.

As shown in the figures, a stitch region SA3 has almost the same configuration as that of a stitch region SA1. Specifically, an element isolating region STI is formed in the p-well region 202. Polysilicon layers 310, 330 functioning as replica select gate lines RSG are drawn to the top of the element isolating region STI. In the shunt region SA4, the polysilicon layer 330 and inter-gate insulating film 330 are removed, thereby exposing the polysilicon layer 310. Then, contact plugs CP15 are formed so as to contact the polysilicon layer 310 in the region. The contact plugs CP15 are electrically separated from the polysilicon layer 330 by an insulating film 331. The contact plugs CP15 are formed from the surface of an interlayer insulating film 350 so as to reach the polysilicon layer 310.

On the interlayer insulating film 350, metal wiring layers 231 and an interlayer insulating film 360 are formed. The metal wiring layers 231 are formed for the contact plugs 15 in a one-to-one correspondence and are connected to the corresponding contact plugs 15. In an interlayer insulating film 360, contact plugs CP16 are formed. The contact plugs CP16 are provided for the metal wiring layers 231 in a one-to-one correspondence and are connected to the corresponding metal wiring layers 231.

On the interlayer insulating film 360, metal wiring layers 261 and an interlayer insulating film 370 are formed. The metal wiring layers 261 are provided for the contact plugs 16 in a one-to-one correspondence and are connected to the corresponding contact plugs 16. In an interlayer insulating film 370, contact plugs CP17 are formed. The contact plugs CP17 are provided for the metal wiring layers 261 in a one-to-one correspondence and are connected to the corresponding metal wiring layers 261.

On the interlayer insulating film 370, metal wiring layers 271 functioning as the shunt wires for the replica select gate lines RSG are formed. The metal wiring layers 271 are connected to the corresponding contact plugs CP17. The configuration of a shunt region SA4 is the same as that shown in FIG. 20.

Next, a sectional structure of the boundary region BR will be explained. As shown in FIGS. 44 and 45, on the p-well region 202 in the boundary region BR, MOS transistors 19-0 to 19-(4m+3) are formed. Specifically, at the surface of the p-well region 202, an impurity diffused region 341 functioning as a source and a drain is formed. Then, on the p-well region 202 between the source and drain, a gate electrode (polysilicon layer) 311 is formed with the gate insulating film 301 interposed therebetween. In the interlayer insulating film 350, contact plugs 19, 21 are formed for MOS transistors 19-0 to 19-(4m+3) in a one-to-one correspondence. On the interlayer insulating film 350, metal wiring layers 232, 233 are formed for the contact plugs CP19, CP21 in a one-to-one correspondence. In the interlayer insulating film 360, contact plugs CP20, CP22 are formed for the metal wiring layers 232, 233 in a one-to-one correspondence. On the interlayer insulating film 360, metal wiring layers 262, 263 are formed for the contact plugs CP20, CP22 in a one-to-one correspondence. In the interlayer insulating film 360, contact plugs CP23, CP24 are formed for the metal wiring layers 262, 263 in a one-to-one correspondence.

Then, one of the source and drain of each of the MOS transistors 19-0 to 19-(4m+3) is connected to the shunt wire 270 of the corresponding one of the select gate lines SG0 to SG(4m+3) via the contact plugs CP19, CP20, CP23 and the metal wiring layers 232, 262. The other of the source and drain of each of the MOS transistors 19-0 to 19-(4m+3) is connected to the shunt wire 271 of the corresponding one of the replica select gate lines RSG0 to RSG(4m+3) via the contact plugs CP21, CP22, CP24 and the metal wiring layers 233, 263.

As described above, in the boundary region BR, the shunt wires 270 of the select gate lines SG0 to SG(4m+3) are connected to the shunt wires 271 of the replica select gate lines RSG0 to RSG(4m+3) via the current paths of the MOS transistors 19-0 to 19-(4m+3), respectively. The shunt wires 270 are connected to the select gate decoder 30 and the shunt wires 271 are connected to the write decoder 20.

Figure 46:
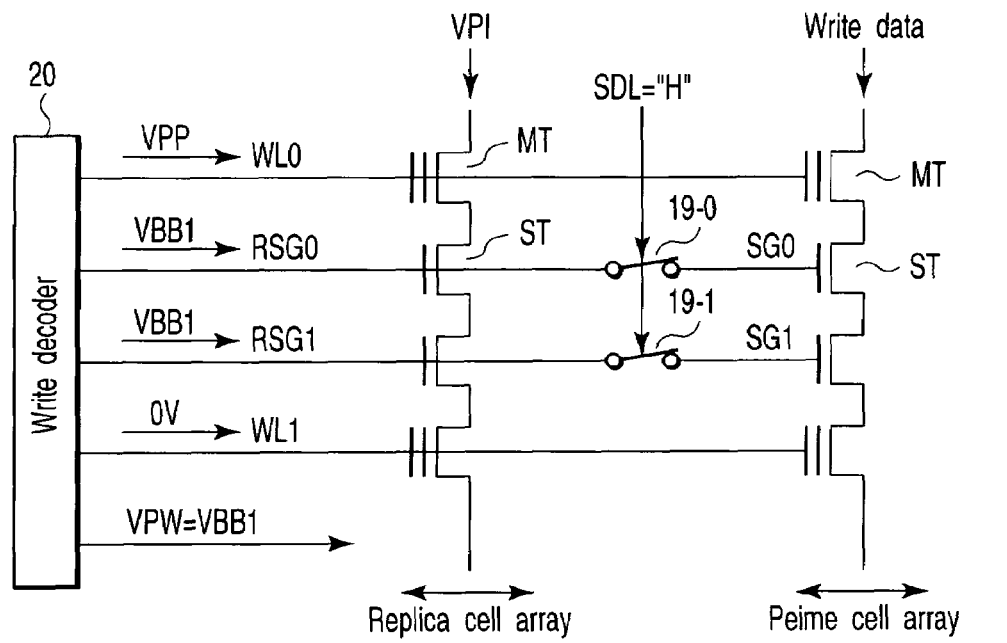
FIG. 46 is a circuit diagram of the memory cell array and write decoder in a write operation of the 2Tr flash memory according to the second embodiment.
Figure 47:
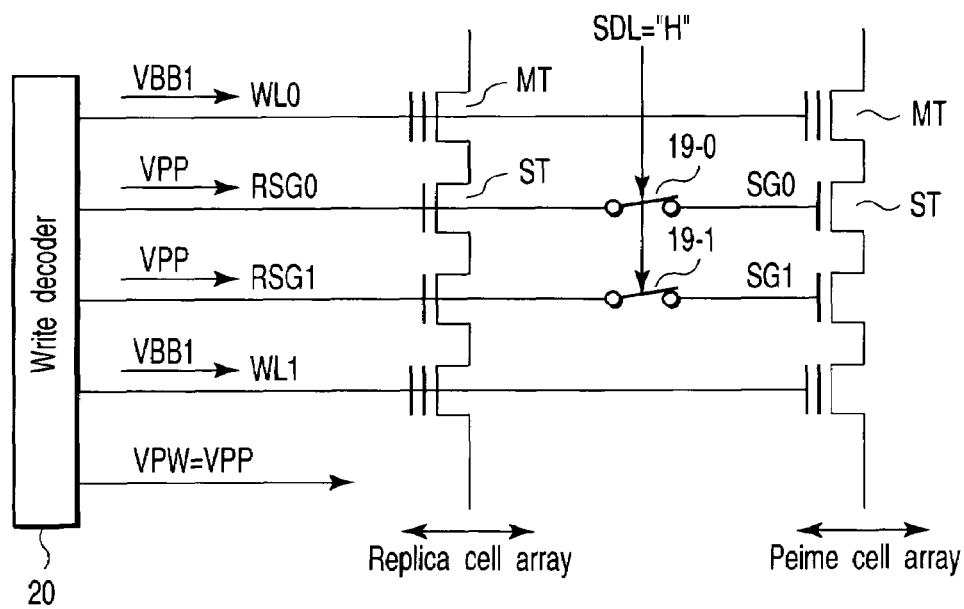
FIG. 47 is a circuit diagram of the memory cell array and write decoder in an erase operation of the 2Tr flash memory according to the second embodiment.
Figure 48:
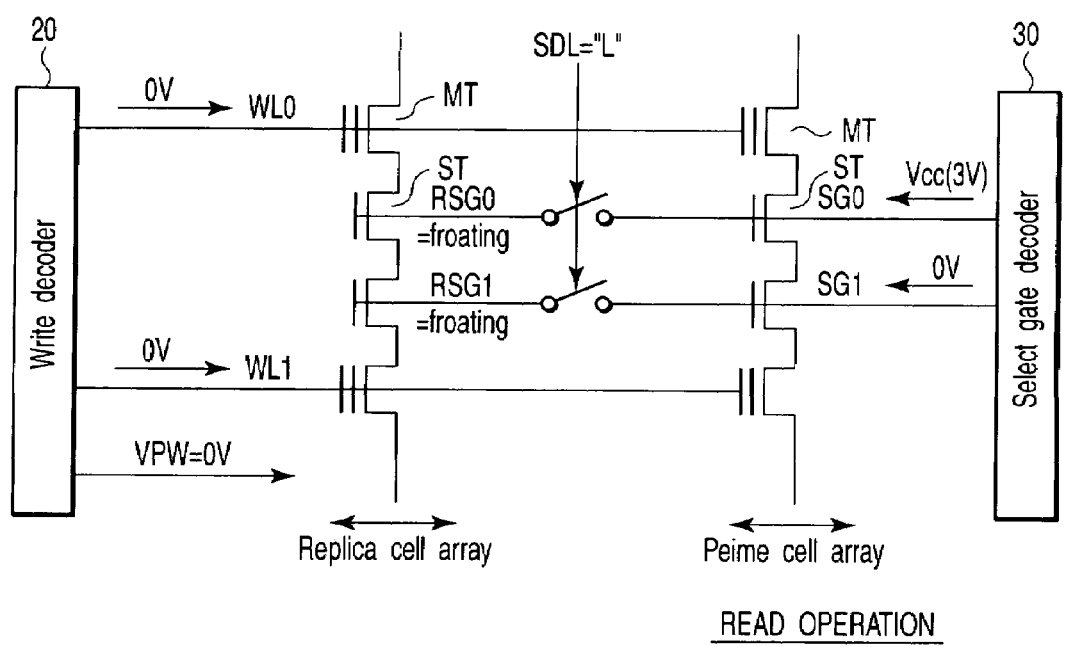
FIG. 48 is a circuit diagram of the memory cell array, write decoder, and select gate decoder in a read operation of the 2Tr flash memory according to the second embodiment.

Next, the operation of the 2Tr flash memory 3 of the second embodiment will be explained. Since the basic operation of the second embodiment is the same as that of the first embodiment, only a write, an erase, and a read operation will be explained, particularly centering on MOS transistors 19-0 to 19-(4m+3). FIGS. 46 to 48 are circuit diagrams to help explain a write, an erase, and a read operation, respectively.

<Write Operation>

Using FIG. 46, a write operation will be explained. As shown in FIG. 46, when a write operation is carried out, a high level (e.g., Vcc=3V or 0V) is applied to the select dummy line SDL. Thus, MOS transistors 19-0 to 19-(4m+3) are turned on, which electrically connects select gate lines SG0 to SG(4m+3) to replica select gate lines RSG0 to RSG(4m+3).

Then, the write decoder 20 applies the negative voltage VBB1 to replica select gate lines RSG0 to RSG(4m+3) and further to select gate lines SG0 to SG(4m+3).

<Erase Operation>

Next, an erase operation will be explained using FIG. 47. As shown in FIG. 47, when an erase operation is carried out, a high (H) level (>VPP) is applied to the select dummy line SDL. This turns on the MOS transistors 19-0 to 19-(4m+3), which electrically connect select gate lines SG0 to SG(4m+3) to replica select gate lines RSG0 to RSG(4m+3).

Then, the write decoder 20 applies the positive voltage VPP to replica gate lines RSG0 to RSG(4m+3) and further to select gate lines SG0 to SG(4m+3).

<Read Operation>

Next, using FIG. 48, a read operation will be explained. As shown in FIG. 48, when an erase operation is carried out, a low (L) level (e.g., 0V or negative voltage VBB1) is applied to the select dummy line SDL. This turns off the MOS transistors 19-0 to 19-(4m+3), which electrically separates select gate lines SG0 to SG(4m+3) from replica select gate lines RSG0 to RSG(4m+3).

Then, the select gate decoder 30 applies the positive voltage Vcc2 to the selected select gate line SG0 and 0V to the unselected gate lines SG1 to RSG(4m+3). On the other hand, replica select gate lines RSG0 to RSG(4m+3) are electrically in the floating state. As a result, the select transistors ST connected to the selected select gate line SG0 are on, whereas the select transistors ST connected to the unselected select gate lines SG1 to SG(4m+3) and all of the replica select gate lines RSG0 to RSG(4m+3) are off.

As described above, even the configuration of the second embodiment can operate as the first embodiment and therefore produce the effects in item (1) to item (7). The MOS transistors 19-0 to 19-(4m+3) have only to be capable of switching between the select gate lines and the replica select gate lines. The way of wiring is not restricted to the method of the second embodiment.

Next, a semiconductor memory device according to a third embodiment of the present invention and a method of controlling the semiconductor memory device will be explained. The third embodiment is related to a method of controlling parasitic capacitances existing in the replica read global bit lines R_RGBL in the first and second embodiments.

Figure 49:
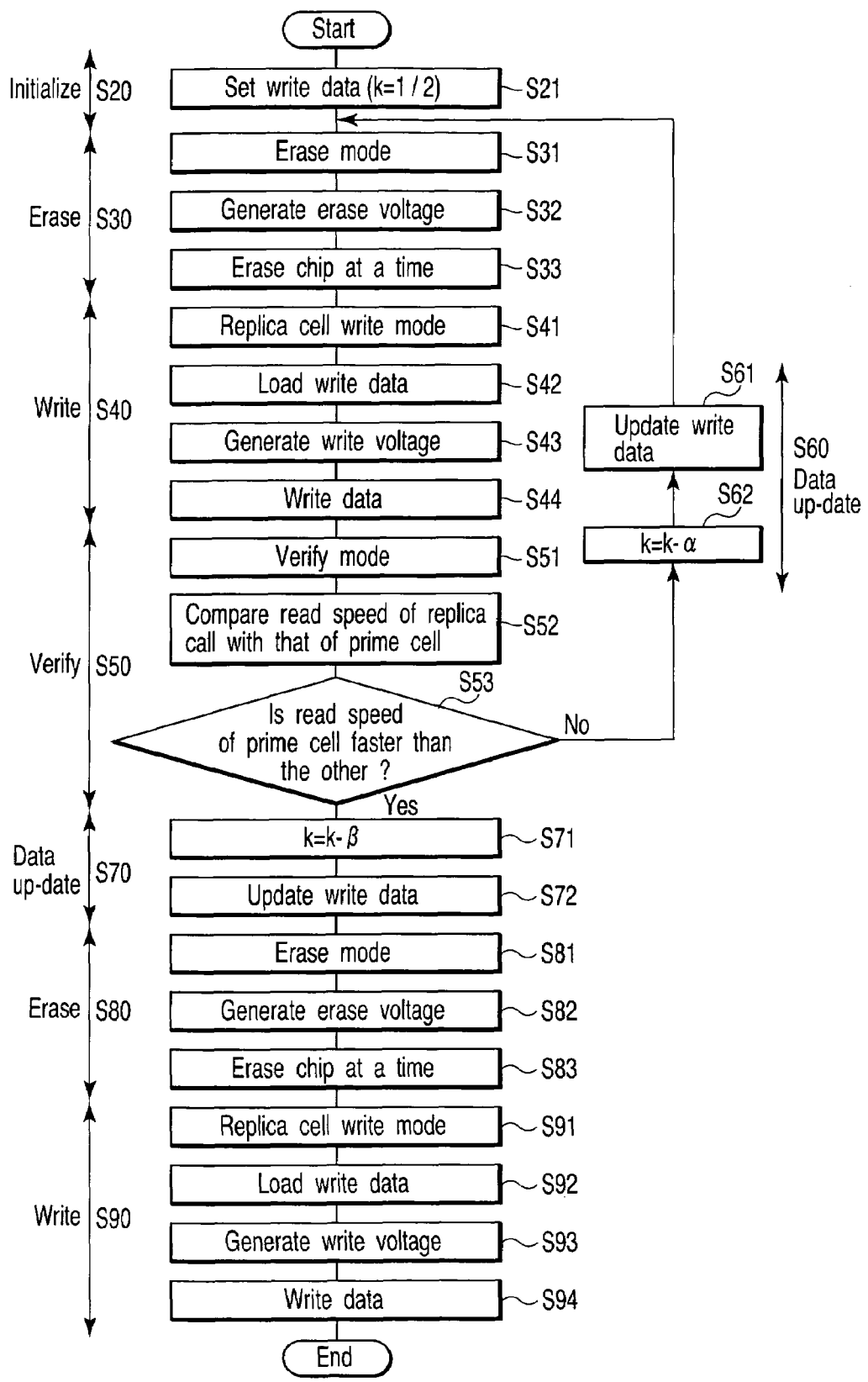
FIG. 49 is a flowchart for a control method of a 2Tr flash memory according a third embodiment of the present invention.

In the first and second embodiments, a parasitic capacitance of each of the local bit lines LBL0 to LBL3 in the prime cell array PCA is smaller than that in each of the local bit lines LBL0 to LBL3 in the replica cell array RCA. A method of setting a parasitic capacitance of a local bit line in the replica cell array RCA will be explained using FIG. 49. FIG. 49 is a flowchart for a method of setting a parasitic capacitance. In this method, the number of memory cells which hold "1" data is changed in the replica cell array RCA.

As shown in FIG. 49, the method roughly includes the following eight steps:
(1) Initialize (step S20)
(2) Erase (step S30)
(3) Write (step S40)
(4) Verify (step S50)
As a result of verification, when a specific result has not been obtained,
(5) Data update (step S60) and when a specific result has been obtained as a result of repetitive verification of item (2) to item (4),
(6) Data update (step S70)
(7) Erase (step S80)
(8) Write (step S90)

Hereinafter, a detailed explanation will be given.

First, the write state machine 120 sets write data (step S21). "Write data" in step S21 is data about how many word lines "0" is to be written into in the replica cell array RCA. If the total number of word lines is l=(4 m+3), the number of word lines, k, into which "0" data is written is set to (l/2).

Next, the write state machine 120 goes into the erase mode (step S31). Then, under the control of the write state machine 120, the voltage generator 130 generates a voltage necessary for erasing (step S32). Then, the data in all of the prime cells and replica cells in the chip is erased ("1" data is written, step S33). As a result, the threshold values of all of the prime cells and replica cells become negative.

Next, the write state machine 120 goes into the write mode (step S41). Then, the write state machine 120 loads the write data set in step S21 (step S42). Furthermore, under the control of the write state machine 120, the voltage generator 130 generates a voltage necessary for writing (step S43). Then, "0" data is written into as many word lines as corresponds to the write data loaded in step S42 (step S44). The write operation is as explained in the first embodiment, except that it differs from an ordinary write operation in that data is not written into the prime cell array PCA. Specifically, the write inhibit voltage VPI is applied to all of the write global bit lines. Then, "0" data is written only into the replica cell array RCA. The replica cells RC connected to a plurality of word lines are written into simultaneously. That is, the positive voltage VPP is applied to a plurality of word lines in FIG. 32. As a result, the threshold values of the replica cells RC connected to a k number of word lines change to positive.

Next, the write state machine 120 goes into the verify mode (step S51). Then, the write state machine reads the data from the prime cell PC and the replica cell RC and compares their read speeds (step S52). Using time t6 that discharging is started or time t1 that precharging is started as a reference, the read speeds are the time elapsed until time t7 when the read global bit line RGBL reaches Vth and the time elapsed until time t8 when the potential on the replica read global bit line R_RGBL reaches Vth.

As a result of step S52, when the read speed of the prime cell PC is slower than the read speed of the replica cell RC (step S53), the parasitic capacitance of the replica read global bit line R_RGBL is smaller than that of the read global bit line RGBL. Therefore, it is necessary to do setting again so that the parasitic capacitance of the replica read global bit line R_RGBL may become much larger. To achieve this, the write data is reset, giving k=k−α (α: arbitrary integer) (steps S62, S63). Then, step S21 to step S53 are repeated. That is, after the chip is erased at the same time, the number of word lines into which "0" is to be written is reduced and writing is done again.

As a result of step S52, when the read speed of the prime cell PC is higher than the read speed of the replica cell RC (step S53), the parasitic capacitance of the replica read global bit line R_RGBL is larger than the parasitic capacitance of the read global bit line RGBL. That is, at this point in time, the condition for the parasitic capacitance explained in the first and second embodiments has been fulfilled. In this case, to carry out a more accurate read operation, writing is done again so as to leave a read margin.

First, the write data is reset, giving k=k−β (β: arbitrary integer) (steps S71, S72).

Next, the write state machine 120 goes into the erase mode (step S81). Then, under the control of the write state machine 120, the voltage generator 130 generates a voltage necessary for erasing (step S82). Then, the data in all of the prime cells and replica cells in the chip is erased ("1" data is written, step S83).

Next, the write state machine 120 goes into the write mode (step S91). Then, the write state machine 120 loads the write data set in step S21 (step S92). Furthermore, under the control of the write state machine 120, the voltage generator 130 generates a voltage necessary for writing (step S93). Then, "0" data is written into as many word lines as correspond to the write data loaded in step S92 (step S94).

As a result, the threshold values of the replica cells connected to a k number of word lines change to positive. Thus, the parasitic capacitance of each of the local bit lines LBL0 to LBL3 in the prime cell array PCA is smaller than that of each of the local bit lines LBL0 to LBL3 in the replica cell array RCA.

Figure 51:
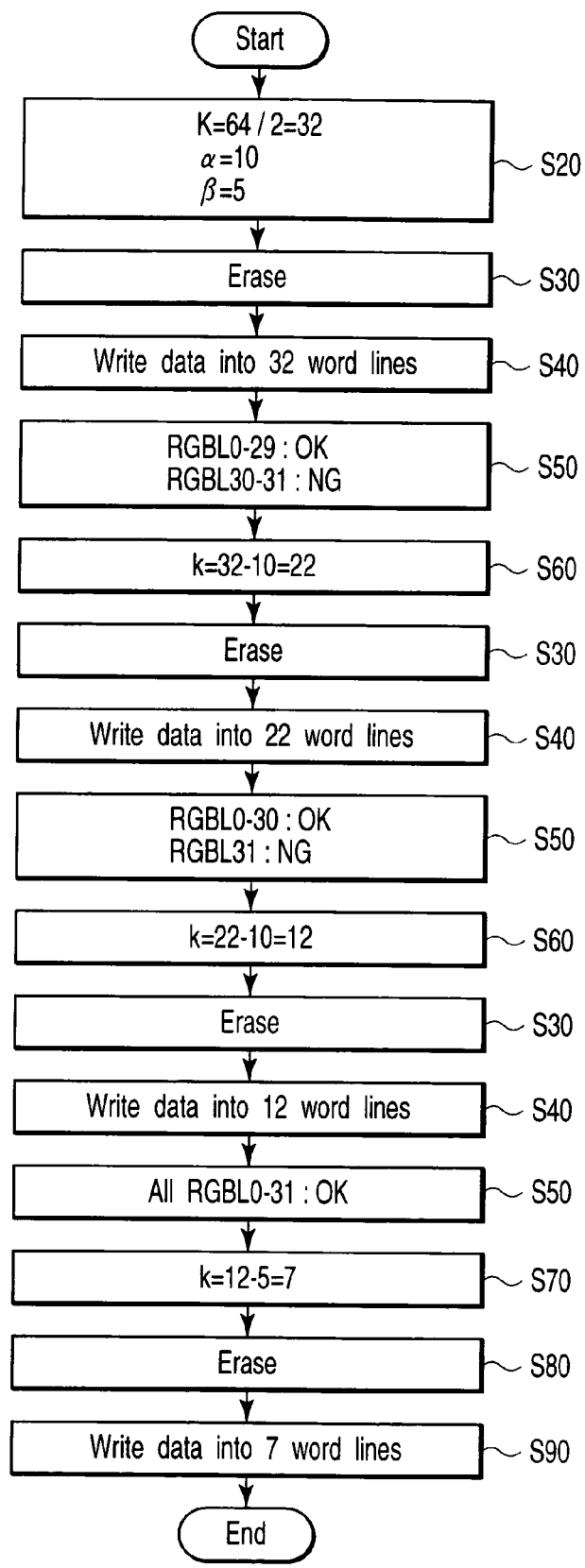
FIG. 51 is a flowchart for a control method of the 2Tr flash memory according the third embodiment.

Using FIGS. 50 and 51, the above method will be explained more concretely. FIG. 50 is a block diagram of the memory cell array. FIG. 51 is a flowchart for a method of setting a parasitic capacitance.

As shown in FIG. 50, suppose the memory cell array 10 has 64 word lines WL0 to WL64 (l=64) and 32 read global bit lines RGBL0 to RGBL31.

First, the write state machine 120 sets write data (initialize, step S20). Since the number of word lines is 64, it follows that k=64/2=32. In addition, α and β are set to 10 and 5, respectively. The values of α and β are illustrative and not restrictive.

Figure 52:
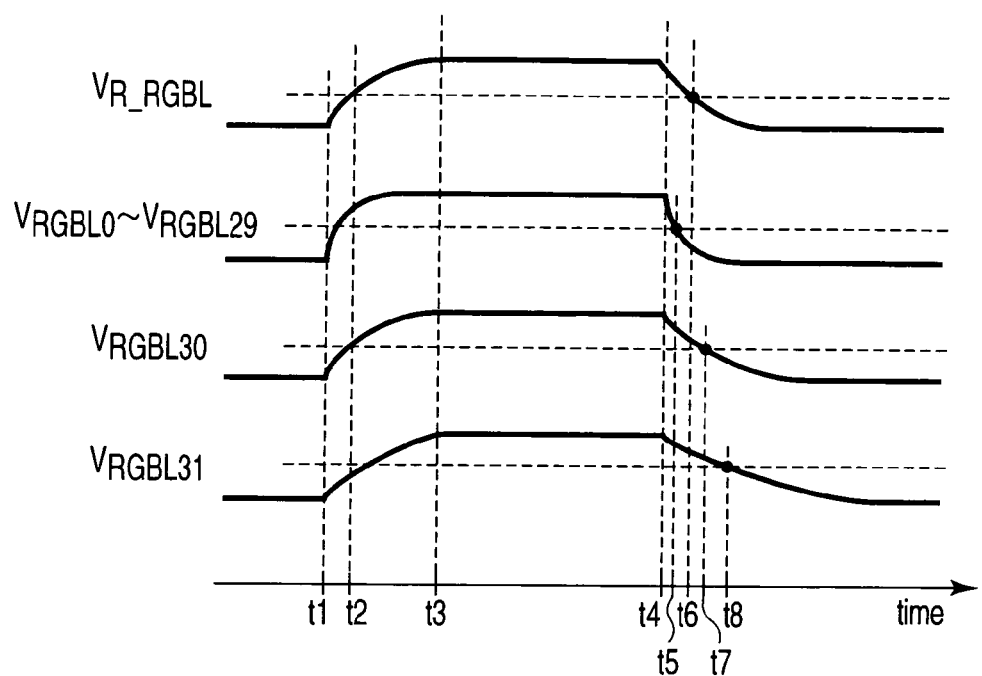

Next, the memory cell array 10 is erased simultaneously (step S30). Then, "1" data is written into the replica cells RC connected to 32 word lines. It is assumed that, when the data is read from the prime cells PC and replica cells RC, a time chart for replica read global bit lines R_RGBL and read global bit lines RGBL0 to RGBL31 is as shown in FIG. 52. As shown in FIG. 52, the replica read global bit lines R_RGBL rise from the precharge level and reach Vth at time t6. On the other hand, read global bit lines RGBL0 to RGBL29 rise from the precharge level and reach Vth at time t5 earlier than time t6. Read global bit lines RGBL30, RGBL31 rise from the precharge level and reach Vth at time t7 and time t8 later than time t5, respectively. That is, the parasitic capacitances of the replica read global bit lines R_RGBL are larger than those of read global bit lines RGBL0 to RGBL29 but smaller than those of read global bit lines RGBL30, RGBL31 (step S50). Therefore, the specific condition has not been met yet.

In this situation, the write state machine 120 sets write data again (step S60). Specifically, it sets as follows: k=k−α=32−10=22.

Figure 53:
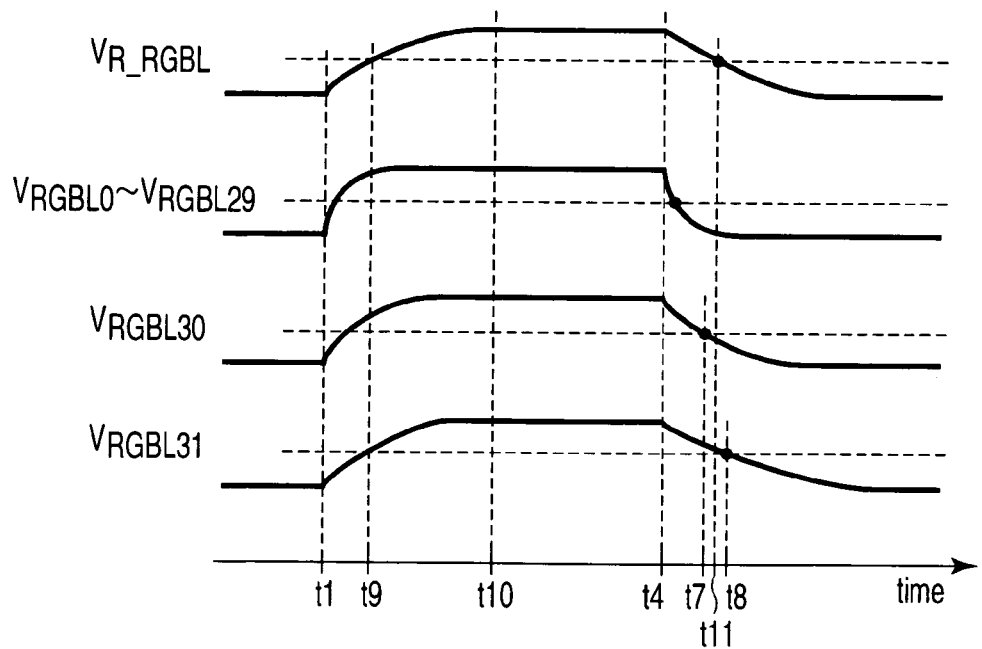

Next, the memory cell 10 is erased simultaneously (step S30) and "1" data is written into the replica cells RC connected to 22 word lines. Then, it is assumed that, when the data is read from the prime cells Pc and replica calls RC, a time chart for the potentials on the replica read global bit lisnes R_RGBL and read global bit lines RGBL0 to RGBL31 is as shown in FIG. 53. As shown in FIG. 53, not only the potentials on read global bit lines RGBL0 to RGBL29 but also the potential on read global bit line RGBL30 rise from the precharge level and reach Vth earlier than the potentials on the replica read global bit lines R_RGBL. However, read global bit line RGBL31 reaches Vth later than the replica global bit lines R_RGBL. That is, the parasitic capacitances of the replica read global bit lines R_RGBL are larger than those of read global bit lines RGBL0 to RGBL30 but smaller than the parasitic capacitance of read global bit line RGBL31 (step S50). Therefore, the specific condition has not been met yet.

In this situation, the write state machine 120 sets write data again (step S60). Specifically, it sets as follows: k=k−α=22−10=12.

Next, the memory cell 10 is erased simultaneously (step S30) and "1" data is written into the replica cells RC connected to 12 word lines. Then, it is assumed that, when the data is read from the prime cells Pc and replica calls RC, a time chart for the potentials on the replica read global bit lines R_RGBL and read global bit lines RGBL0 to RGBL31 is as shown in FIG. 54. As shown in FIG. 54, the potentials on all of the read global bit lines RGBL0 to RGBL31 rise from the charge level and reach Vth earlier than the potentials on the replica read global bit lines R_RGBL. That is, the parasitic capacitances of the replica read global bit lines R_RGBL are larger than those of all of the read global bit lines RGBL0 to RGBL31 (step S51). Therefore, the specific condition is met for the first time.

Next, the write state machine 120 sets write data again (step S70). Specifically, it sets as follows: k=k−β=12−5=7. Then, the memory cell 10 is erased simultaneously (step S80) and "1" data is written into the replica cells RC connected to 7 word lines.

As a result, the setting of the parasitic capacitances of the replica read global bit lines R_RGBL is completed. In this state, if a read operation is carried out, the potentials on read global bit lines RGBL0 to RGBL31 and the potentials on the replica read global bit lines R_RGBL change as shown in FIG. 55. That is, the reading of the data from all of the read global bit lines RGBL0 to RGBL31 is completed, leaving a more sufficient margin than in FIG. 54.

By the above method, the parasitic capacitance of each of the local bit lines LBL0 to LBL3 in the prime cell array PCA can be made smaller than that of each of the local bit lines LBL0 to LBL3 in the replica cell array RCA. In the third embodiment, the parasitic capacitance of the replica cell array RCA has been controlled according to the number of replica cells RC into which "1" data is to be written. In addition to this, bringing the replica cells RC into an overerased state enables the parasitic capacitance of the replica cell array to increase.

Furthermore, with the above method, data on the parasitic capacitance of the prime cell array PCA can be regarded as being written in the replica cell array. Therefore, a fuse circuit or the like for causing data on the parasitic capacitance to be held is not required, which prevents extra chip area from increasing.

Next, a semiconductor memory device according to a fourth embodiment of the present invention will be explained. The fourth embodiment is such that the flash memories explained in the first to third embodiments are mounted in a single chip of an LSI on which other semiconductor memories are also mounted. FIG. 56 is a block diagram of a system LSI according to the fourth embodiment.

As shown in FIG. 56, a system LSI 1 comprises a NAND flash memory 500, a 3Tr-NAND flash memory 600, a 2Tr flash memory 3, an MCU 700, and an I/O circuit 800 formed on a single semiconductor substrate.

The NAND flash memory 500 is used as a storage memory for storing image data or video data.

The 3Tr-NAND flash memory 600 holds an ID code for accessing the LSI 1 and a security code.

The 2Tr flash memory 3 holds program data for the MCU 700 to operate. The configuration of the 2Tr flash memory 3 is as explained in the first to third embodiments.

The MCU 700 does processing on the basis of the program read from the 2Tr flash memory 3, in response to various commands externally input. At this time, the MCU 700 accesses the 2Tr flash memory 3 directly without intervention of an SRAM (Static Random Access Memory) or the like. The processing done by the MCU 700 includes the compression or decompression of the data input to the NAND flash memory 500 and control of an external device. In addition, the MCU 700 reads specific data from the 3Tr-NAND flash memory 600, when the data held in the NAND flash memory 500 is accessed from the outside. Then, the MCU 700 checks the read-out data against the externally input ID code and security data. If they coincide with each other, the MCU 700 permits access to the NAND flash memory 500. When access to the NAND flash memory 500 is permitted, the data in the NAND flash memory 500 is accessed from the outside (host). Specifically, the MCU 700 triggers the NAND flash memory 500 in response to the command received from the outside, thereby reading (or writing) the data.

The I/O circuit 800 controls the exchange of signals between the LSI 1 and the outside.

Next, the configuration of each of the three semiconductor memories 500, 600, 3 included in the LSI 1 will be explained below.

Figure 57:
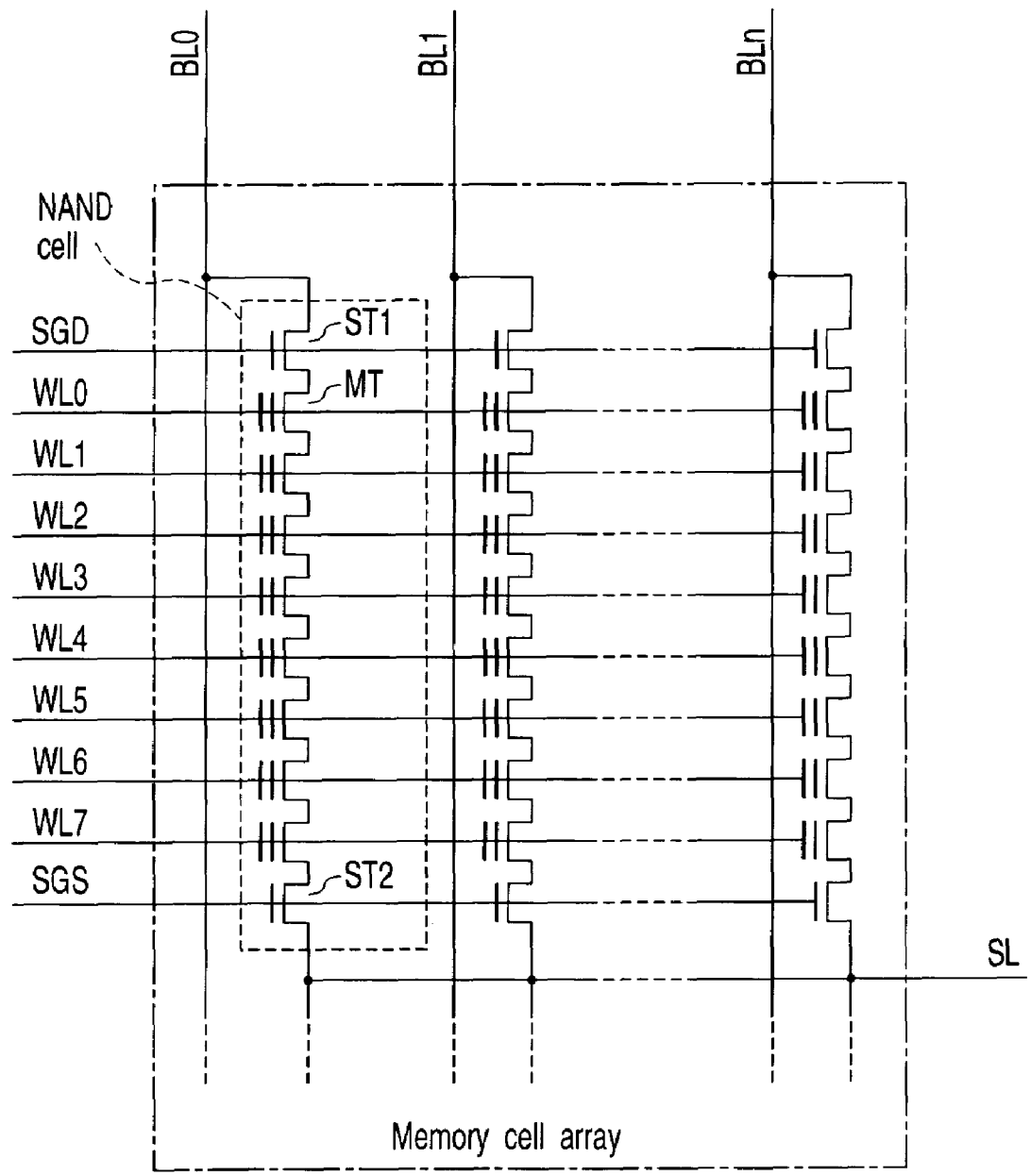
FIG. 57 is a circuit diagram of the memory cell array included in a NAND flash memory according to the fourth embodiment.

FIG. 57 is circuit diagram of the memory cell array included in the NAND flash memory 500. As shown in FIG. 57, the memory cell array has a plurality of NAND cells arranged in a matrix. Each of the NAND cells includes eight memory cell transistors MT and select transistors ST1, ST2. A memory cell transistor MT has a stacked-gate structure that includes a floating gate on a semiconductor substrate with a gate insulating film interposed therebetween and a control gate on the floating gate with an inter-gate insulating film interposed therebetween. The number of memory cell transistors MT is not limited to 8 and may be 16 or 32. The number is illustrative and not restrictive. The adjoining ones of the memory cell transistors MT share their source and drain. They are arranged in such a manner that their current paths are connected in series between the select transistors ST1, ST2. The drain region at one end of the series connection of the memory cell transistors MT is connected to the source region of the select transistor ST1. The source region at the other end is connected to the drain region of the select transistor ST2.

The control gates of the memory cell transistors MT in a same row are connected commonly to any one of word lines WL0 to WLm. The gates of the select transistors ST1, ST2 in the same row are connected commonly to select gate lines SGD, SGS, respectively. Word lines WL0 to WLm and select gate lines SGS, SGD are connected to the row decoder. The drains of the select transistors ST1 in a same column are connected commonly to any one of bit lines BL0 to BLn. The bit lines are then connected to the write circuit and read circuit (not shown). The sources of the select transistors ST2 are connected commonly to a source line SL and then connected to a source line driver. Both of the select transistors ST1, ST2 are not necessarily needed. Only one of them may be used, provided that it can select a NAND cell.

Figure 58:
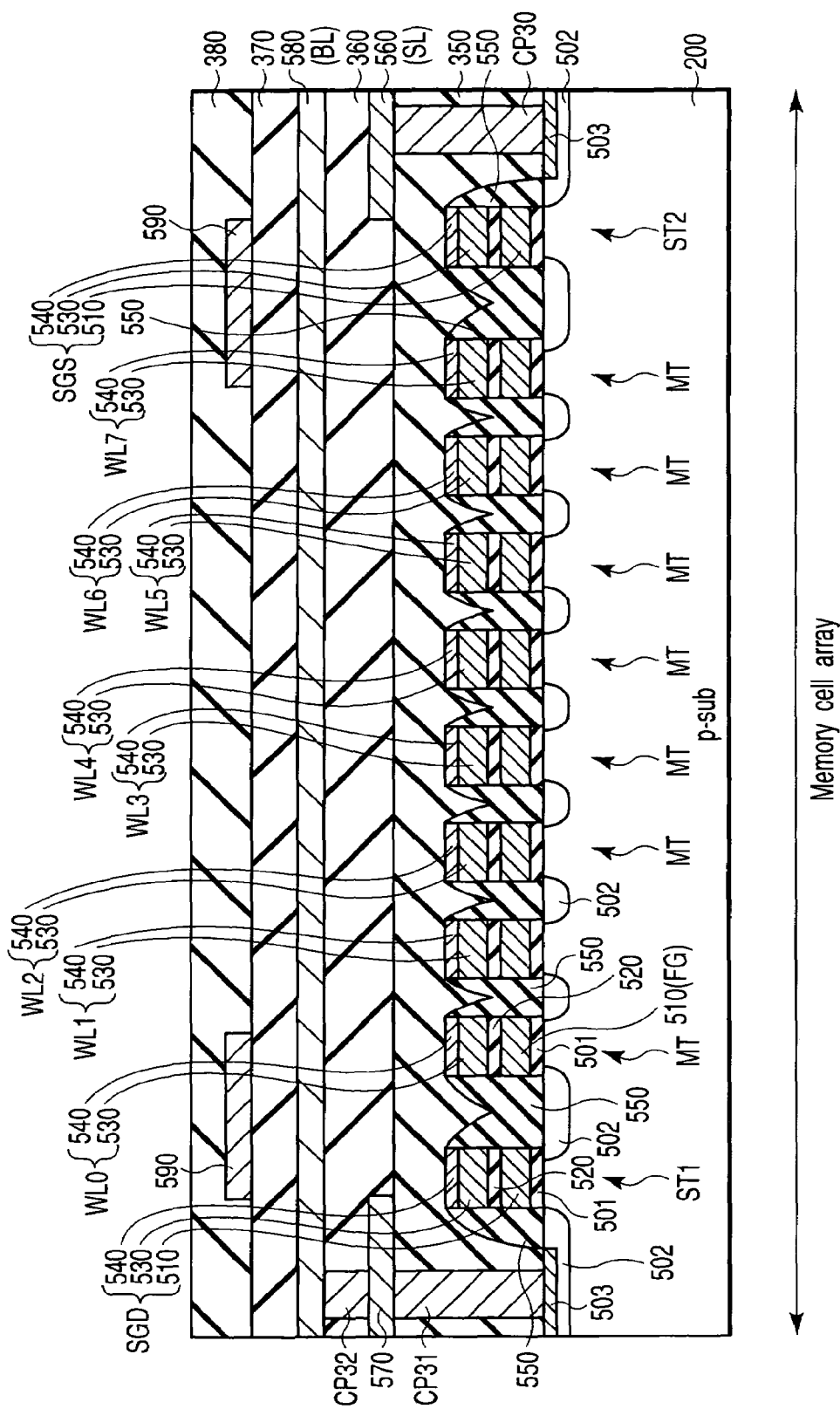
FIG. 58 is a sectional view of the memory cell array included in the NAND flash memory according to the fourth embodiment.

FIG. 58 is a sectional view, taken along a bit line, of the memory cell array included in the NAND flash memory 500. As shown in FIG. 58, on the p-type semiconductor (silicon) substrate 200, a gate insulating film 501 is formed. On the gate insulating film 501, the gate electrodes of a memory cell transistor MT and select transistors ST1, ST2 are formed. Each of the gate electrodes of the memory cell transistor MT and select transistors ST1, ST2 includes a polysilicon layer 510 formed on the gate insulating film 501, an inter-gate insulating film 520 formed on the polysilicon layer 510, a polysilicon layer 530 formed on the inter-gate insulating film 520, and a silicide layer 540 formed on the polysilicon layer 530. The inter-gate insulating film 520 is made of, for example, a silicon oxide film, or an ON film, NO film, or ONO film having a stacked structure of a silicon oxide film and a silicon nitride film. In a memory cell transistor MT, the polysilicon layers 510, which are separated from each other between adjacent element regions AA adjoining in the word line direction, function as floating gates (FG). The polysilicon layers 530 and silicide layers 540 function as control gates (or word lines WL). The polysilicon layers 530 are connected to each other between element regions AA adjoining in the word line direction. In the select transistors ST1, ST2, a part of the inter-gate insulating film 520 is removed in a shunt region (not shown), which connects the polysilicon layers 510, 530 electrically. The polysilicon layers 510, 530 and silicide layers 540 function as select gate lines SGD, SGS. In the select transistors ST1, ST2, the polysilicon layers 510 and polysilicon layers 530 are not separated from one another between element regions AA adjoining in the word line direction and are connected to one another.

At the surface of the semiconductor substrate 200 located between adjacent gate electrodes, impurity diffused layers 502 functioning as source-drain regions are formed. An impurity diffused layer 502 is shared by adjacent transistors. Specifically, an impurity diffused layer 502 between two adjacent select transistors ST1 functions as the drain region of the two select transistors ST1. An impurity diffused layer 502 between two adjacent select transistors ST2 functions as the source region of the two select transistors ST2. An impurity diffused layer 502 between two adjacent memory cell transistors MT functions as the source-drain region of the two memory cell transistors MT. Moreover, an impurity diffused layer 502 between a memory cell transistor MT and a select transistor ST1 adjoining each other functions as the drain region of the memory cell transistor MT and the source region of the select transistor ST1. An impurity diffuse layer 502 between a memory cell transistor MT and a select transistor ST2 adjoining each other functions as the source region of the memory cell transistor MT and the drain region of the select transistor ST2. A silicide layer 503 is formed at the surface of the drain region 502 of the select transistor ST1 and at the surface of the source region 502 of the select transistor ST2. No silicide layer is formed in the source-drain region 502 of the memory cell transistor MT, in the source region 502 of the select transistor ST1, and in the drain region 502 of the select transistor ST2. On the sidewalls of the gate electrodes (stacked gates) of the memory cell transistor MT and select transistors ST1, ST2, a sidewall insulating film 550 is formed. A sidewall insulating film 610 is formed on both of the side facing the source region of the stacked gate and the side facing its drain region. The region between the stacked gates of the memory cell transistor MT and the select transistor ST1 and the region between the stacked gates of the memory cell transistor MT and the select transistor ST2 are filled with the sidewall insulating film 550. Thus, the top of the source-drain region of the memory cell transistor MT, the top of the source region of the select transistor ST1, and the top of the drain region of the select transistor ST2 are covered with the sidewall insulating film 550.

Then, on the semiconductor substrate 200, an interlayer insulating film 350 is formed so as to cover the memory cell transistor MT and select transistors ST1, ST2. In the interlayer insulating film 350, a contact plug CP30 reaching the silicide layer 503 formed in the source region 502 of the select transistor ST2 is formed. On the interlayer insulating film 350, a metal wiring layer 560 connected to the contact plug CP30 is formed. The metal wiring layer 560 functions as a source line SL. Further in the interlayer film 350, a contact plug CP31 reaching the silicide layer 503 formed in the drain region 502 of the select transistor ST1 is formed. On the interlayer insulating film 350, a metal wiring layer 570 connected to the contact plug CP31 is formed.

On the interlayer insulating film 350, an interlayer insulating film 360 is formed so as to cover the metal wiring layers 560, 570. In the interlayer insulating film 360, a contact plug CP32 reaching the metal wiring layer 570 is formed. On the interlayer insulating film 360, a metal wiring layer 580 connected equally to a plurality of contact plugs CP32 is formed. The metal wiring layer 580 functions as a bit line BL.

On the interlayer insulating film 360, an interlayer insulating film 370 is formed so as to cover the metal wiring layer 580. On the interlayer insulating film 370, metal wiring layers 590 are formed. The metal wiring layers 590, which are connected to the silicide layers 540 of the select transistors ST1, ST2 in a region (not shown), function as the shunt wires for the select gate lines SGD, SGS. On the interlayer insulating film 370, an interlayer insulating film 380 is formed so as to cover the metal wiring layers 590.

<3Tr-NAND Flash Memory>

Figure 59:
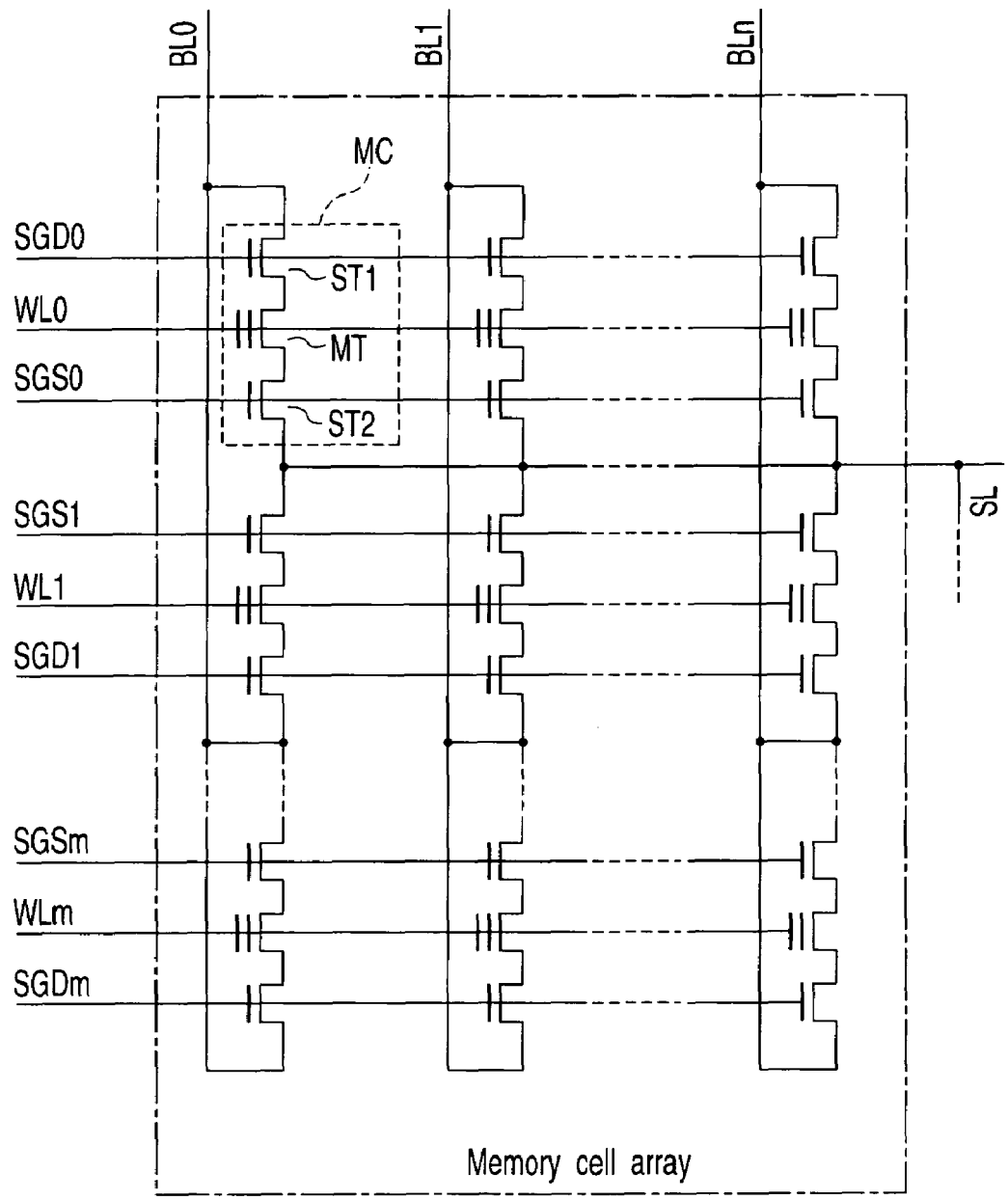
FIG. 59 is a circuit diagram of the memory cell array included in a 3Tr-NAND flash memory according to the fourth embodiment.

FIG. 59 is circuit diagram of the memory cell array included in the 3Tr-NAND flash memory 600. As shown in FIG. 59, the memory cell array has (m+1)×(n+1) memory cells MC arranged in a matrix. Each of the memory cell MCs includes a memory cell transistor MT and select transistors ST1, ST2, which have their current paths connected in series with one another. The current path of the memory cell transistor MT is connected between the current paths of the select transistors ST1, ST2. The memory cell transistor MT has a stacked gate structure that includes a floating gate on a semiconductor substrate with a gate insulating film interposed therebetween and a control gate on the floating gate with an inter-gate insulating film interposed therebetween. Each of the select transistors ST1, ST2 has a multilayer gate structure that includes a first polysilicon layer on the semiconductor substrate with a gate insulating film interposed therebetween and a second polysilicon layer on the first polysilicon layer with an inter-gate insulating film interposed therebetween. The source region of the select transistor ST1 is connected to the drain region of the memory cell transistor MT. The source region of the memory cell transistor MT is connected to the drain region of the select transistor ST2. Memory cells adjoining each other in the column direction share the drain region of the select transistor ST1 or the source region of the select transistor ST2. That is, a memory cell of the 3Tr-NAND flash memory is such that one memory cell transistor MT are used in the NAND flash memory.

The control gates of the memory cell transistors MT of the memory cells MC in a same row are connected commonly to any one of the word lines WL0 to WLm. The gates of the select transistors ST1 of the memory cells MC in a same row are connected commonly to any one of select gate lines SGD0 to SGDm. The gates of the select transistors ST2 of the memory cell MC in a same row are connected commonly to any one of select gate lines SGS0 to SGSm. The drain regions of the select transistors ST1 of the memory cell MCs in a same column are connected commonly to any one of bit lines BL0 to BLn.

Bit lines BL0 to BLn are connected to the write circuit and the read circuit (not shown). The source regions of the select transistors ST2 of the memory cells MC are connected commonly to a source line SL and then are connected to the source line driver.

Figure 60:
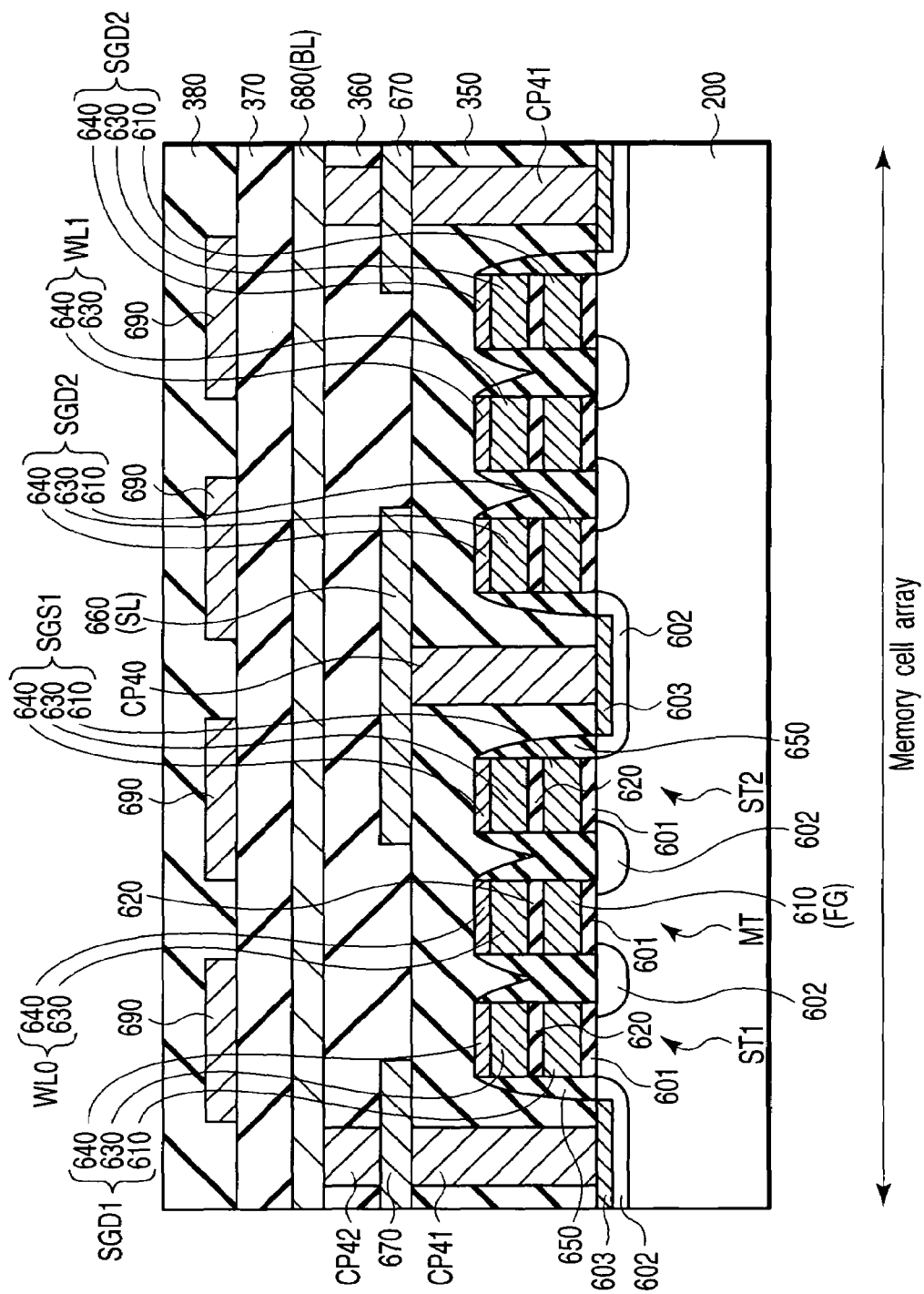
FIG. 60 is a sectional view of the memory cell array included in the 3Tr-NAND flash memory according to the fourth embodiment.

FIG. 60 is a sectional view of the memory cell array included in the 3Tr-NAND flash memory 600. As shown in FIG. 60, on an element region AA of the p-type semiconductor (silicon) substrate 200, a gate insulating film 601 is formed. On the gate insulating film 601, the gate electrodes of a memory cell transistor MT and select transistors ST1, ST2 are formed. Each of the gate electrodes of the memory cell transistor MT and the select transistors ST1, ST2 includes a polysilicon layer 610 formed on the gate insulating film 601, an inter-gate insulating film 620 formed on the polysilicon layer 610, a polysilicon layer 630 formed on the inter-gate insulating film 620, and a silicide layer 640 formed on the polysilicon layer 630. The inter-gate insulating film 620 is made of, for example, an ON film, NO film, or ONO film. In a memory cell transistor MT, the polysilicon layers 610, which are separated from each other between element regions AA adjoining in the word line direction, function as floating gates (FG). The polysilicon layers 630 and silicide layers 640 function as control gates (or word lines WL). The polysilicon layers 630 are connected to each other between element regions AA adjoining in the word line direction. In each of the select transistors ST1, ST2, a part of the inter-gate insulating film 620 is removed in a region (not shown), which electrically connects the polysilicon layers 610, 630. Then, the polysilicon layers 610, 630 and silicide layers 640 function as select gate lines SGS, SGD. In the select transistors ST1, ST2, the polysilicon layers 610 and polysilicon layers 630 are not separated from one another between element regions AA adjoining in the word line direction and are connected to one another. That is, the polysilicon layers 610 and polysilicon layers 630 are all connected to one another and are not separated from one another on a cell basis as in the memory cell transistors MT.

Then, at the surface of the semiconductor substrate 200 located between adjacent gate electrodes, an impurity diffused layer 602 functioning as source and drain regions is formed. The impurity diffused layer 602 is shared by adjacent transistors. Specifically, an impurity diffused layer 602 between two adjacent select transistors ST1 functions as the drain region of the two select transistors ST1. An impurity diffused layer 602 between two adjacent select transistors ST2 functions as the source region of the two select transistors ST2. An impurity diffused layer 602 between a memory cell transistor MT and a select transistor ST1 adjoining each other functions as the drain region of the memory cell transistor MT and the source region of the select transistor ST1. Moreover, an impurity diffused layer 602 between a memory cell transistor MT and a select transistor ST2 adjoining each other functions as the source region of the memory cell transistor MT and the drain region of the select transistor ST2. A silicide layer 603 is formed at the surface of the drain region of the select transistor ST1 and at the surface of the source region 602 of the select transistor ST2. No silicide layer is formed in the source and drain regions 602 of the memory cell transistor MT, in the source region 602 of the select transistor ST1, and in the drain region 602 of the select transistor ST2. On the sidewalls of the gate electrodes (stacked gates) of the memory cell transistor MT and select transistors ST1, ST2, a sidewall insulating film 650 is formed. The sidewall insulating film 650 is formed on both of the side facing the source region 602 of the stacked gate and the side facing its drain region 602. The region between the stacked gates of the memory cell transistor MT and the select transistor ST is filled with the sidewall insulating film 650. Thus, the top of the source-drain region of the memory cell transistor MT, the top of the source region of the select transistor ST1, and the top of the drain region of the select transistor ST2 are covered with the sidewall insulating film 650.

Then, on the semiconductor substrate 200, an interlayer insulating film 350 is formed so as to cover the memory cell transistor MT and select transistors ST1, ST2. In the interlayer insulating film 350, a contact plug CP40 reaching the silicide layer 603 formed in the source region 602 of the select transistor ST2. On the interlayer insulating film 350, a metal wiring layer 660 connected to the contact plug CP40 is formed. The metal wiring layer 660 functions as a source line SL. Further in the interlayer film 650, a contact plug CP41 reaching the silicide layer 603 formed in the drain region 602 of the select transistor ST1 is formed. On the interlayer insulating film 350, a metal wiring layer 670 connected to the contact plug CP41 is formed.

On the interlayer insulating film 350, an interlayer insulating film 360 is formed so as to cover the metal wiring layers 660, 670. In the interlayer insulating film 360, a contact plug CP42 reaching the metal wiring layer 670 is formed. On the interlayer insulating film 360, a metal wiring layer 680 connected equally to a plurality of contact plugs CP42 is formed. The metal wiring layer 680 functions as a bit line BL.

On the interlayer insulating film 360, an interlayer insulating film 370 is formed so as to cover the metal wiring layer 680. On the interlayer insulating film 370, metal wiring layers 690 are formed. The metal wiring layers 690, which are connected to the silicide layers 640 of the select transistors ST1, ST2 in a region (not shown), function as the shunt wires for the select gate lines SGD, SGS. On the interlayer insulating film 370, an interlayer insulating film 380 is formed so as to cover the metal wiring layers 690.

<2Tr Flash Memory>

Figure 61:
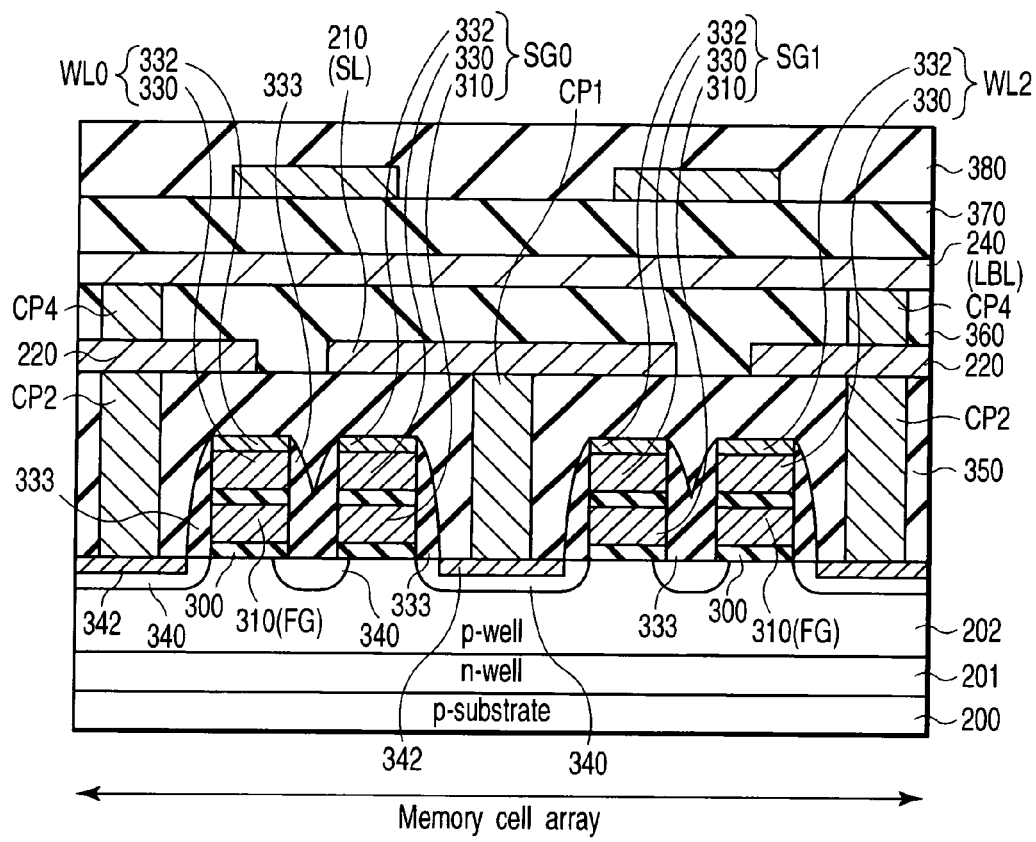
FIG. 61 is a sectional view of the memory cell array included in a 2Tr flash memory according to the fourth embodiment.

The configuration of the 2Tr flash memory 3 is as explained in the first and second embodiments. As shown in FIG. 61, silicide layers 332, 342 may be formed on the polysilicon layer 330 and at the surface of the impurity diffused layer 340, respectively, and a sidewall insulating film 333 may be formed on the sidewalls of the stacked gate. In a memory cell transistor MT, the polysilicon layer 330 and silicide layer 332 function as control gates (or word lines WL).

The silicide layer 342 is formed at the surface of the drain region 340 of the memory cell transistor MT and at the surface of the source region 340 of the select transistor ST. No silicide is formed in the source region 340 of the memory cell transistor MT and in the drain region of the select transistor ST. The region between the stacked gates of the memory cell transistor MT and the select transistor ST is filled with the sidewall insulating film 333. Thus, the top of the source region of the memory cell transistor MT and the top of the drain region of the select transistor ST are covered with the sidewall insulating film 333.

As described above, the system LSI of the fourth embodiment produces not only the effects in item (1) to item (7) but also the effect described below.

(8) It is possible to embed a plurality of types of flash memories in a single chip, while suppressing the manufacturing cost.

With the configuration of the embodiment, the memory cell transistors MT and select transistors ST1, ST2, ST included in the NAND flash memory 500, 3Tr-NAND flash memory 600, and 2Tr flash memory 3 are formed in the same processes. That is, the individual MOS transistors are formed in the same oxidizing process, film-forming process, impurity implanting process, photolithographic etching process. As a result, the gate insulating film, inter-gate insulating film, the floating gates and control gates of the memory cell transistors MT, and the select gates of the select transistors are the same in the three flash memories 500, 600, 3. In such a manufacturing method, the memory cell arrays of the three flash memories can be formed by the number of processes required to form a single flash memory. Therefore, the manufacturing cost of a system LSI including three types of semiconductor memories can be reduced.

(9) The performance of the system LSI can be made higher.

The system LSI of the embodiment has the NAND flash memory 500, 3Tr-NAND flash memory 600, and 2Tr flash memory 3 as described above.

Unlike the NAND flash memory 500 and 3Tr-NAND flash memory 600, the 2Tr flash memory 3 uses a positive voltage (VPP=12V) and a negative voltage (VBB1=−7V, VBB2=−8V) in a write and an erase operation. That is, the potential difference applied across the gate insulating film of the MOS transistor used in the row decoder is 12V, −7V or −8V. Therefore, the gate insulating film of the MOS transistors used in the row decoder included in the 2Tr flash memory 3 may be thinner than that of the MOS transistors used in the row decoders included in the NAND flash memory 500 and 3Tr-NAND flash memory 600. Thus, the row decoder of the 2Tr flash memory can be made more compact. In addition, the operating speed of the row decoder can be made faster than that of the row decoders in the NAND flash memory 500 and 3Tr-NAND flash memory 600.

In this embodiment, the program data for the MCU 700 to operate is stored in the 2Tr flash memory 3. Thus, the 2Tr flash memory can operate at high speed as described above.

The data can be read directly from the 2Tr flash memory 3 without the intervention of the MCU 700 or RAM. As a result, a RAM or the like is not needed, which helps simplify the configuration of the system LSI and improve the operating speed.

In addition, the 3Tr-NAND flash memory 600 holds an ID code and a security code. These code data are not so large in the amount of data, but are frequently changed and updated. Thus, the memory to hold the code data is required to operate at some high speed. In this respect, the 3Tr-NAND flash memory 600 uses a smaller erase unit than that in the NAND flash memory 500 and can rewrite the data in pages. Therefore, it can be said that the 3Tr-NAND flash memory 600 is the preferable semiconductor memory to hold the code data.

A conventional LSI including a NAND flash memory requires the following controller to prevent rewriting from concentrating on a specific block. The controller converts addresses input in ware leveling or logic form into physical addresses or, when a block malfunctions, determines the block to be faulty and performs control to prevent the faulty block from being used. In the fourth embodiment, however, such a controller is not needed. The reason is that the 2Tr flash memory 3 is caused to hold a firmware program to control the blocks in the NAND flash memory 500 and the MCU 700 is caused to perform such control. The MCU 700 performs the control in an interval of time between its original jobs (such as the process of controlling an external device or the process of computing the data input to the NAND flash memory 500). Of course, when the comparison of the capacity of the MCU 700 with the amount of work the MCU 700 has to process has shown that the amount of work has exceeded the capacity, a hardware sequencer or the like may be provided to control the NAND flash memory 500.

As described above, in the semiconductor memory device according to each of the first to fourth embodiments, the parasitic capacitance of each of the local bit lines LBL0 to LBL3 in the prime cell array PCA is smaller than the parasitic capacitance of any one of the local bit lines LBL0 to LBL3 in the replica cell array RCA. Therefore, in a read operation, the parasitic capacitances existing in the replica read global bit lines R_RGBL are equal to or larger than those existing in the read global bit lines RGBL. In addition, the distance between the replica cell array RCA and the select gate decoder 30 is made larger than the distance between the prime cell array PCA and the select gate decoder. The discharge circuit 131 supplies a smaller current than the worst one of the discharge currents in the read global bit lines.

In a precharge operation, after the replica read global bit line R_RGBL has exceeded the data decision threshold voltage Vth of the sense amplifier, the precharging of the read global bit line RGBL is ended. Furthermore, at the end of the data read operation, after the voltage on the replica read global bit line R_RGBL has dropped from the precharge potential to Vth, the data on the read global bit line is determined.

Accordingly, in the precharge operation, the potential on the read global bit line RGBL can be made higher than Vth reliably. When "1" data is read, the data can be determined after the potential on the read global bit line RGBL drops completely below Vth. Therefore, it is possible to avoid determining the read-out data erroneously.

Furthermore, to make the parasitic capacitance of each of the local bit lines LBL0 to LBL3 in the prime cell array PCA smaller than the parasitic capacitance of each of the local bit lines LBL0 to LBL3 in the replica cell array RCA, the number of replica cells which hold "1" data and are connected to the local bit lines LBL0 to LBL3 in the prime cell array PCA is controlled. Alternatively, the same may be achieved by providing excessively erased replica cells.

In the above embodiments, the discharge circuit 131 has the voltage generator 138 and the current source circuit 137 including the MOS transistors 137-1, 137-2 as shown in FIG. 5. However, the discharge circuit 131 is not restricted to this configuration and may take another configuration, as long as the charge on the replica global bit lines can be discharged at a constant time rate of change. The discharging capability of the discharge circuit 131 in FIG. 5 can be changed according to the size of the MOS transistors 137-1, 137-2 or the value of the voltage Vref.

Figure 62:
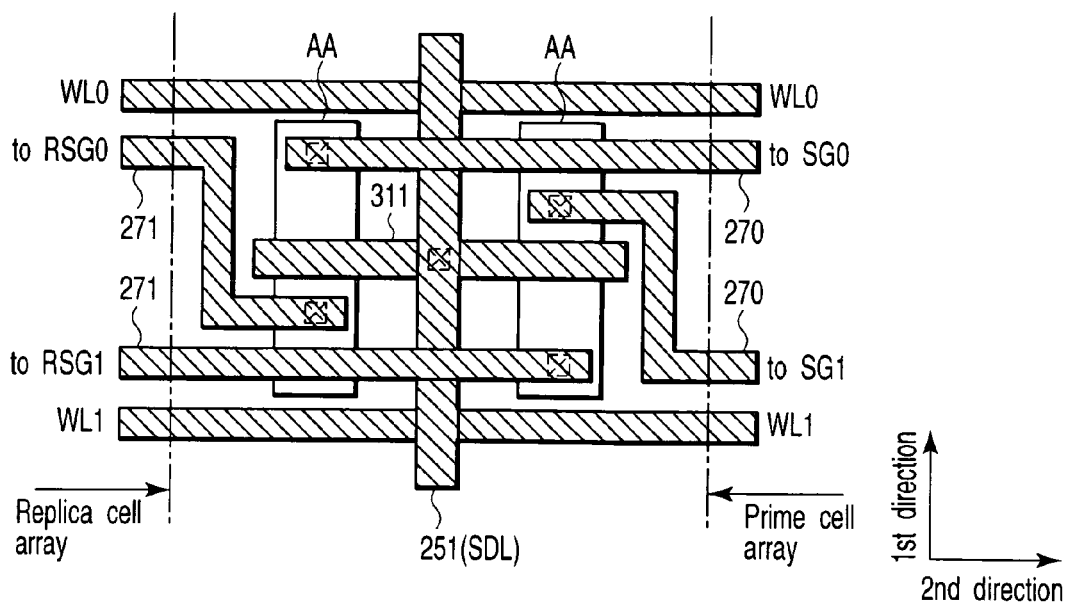
FIG. 62 is a plan view of an isolating MOS transistor included in a 2Tr flash memory according to a first modification of the second embodiment.

Furthermore, the MOS transistors 19-1 to 19-(4m+3) explained in the second embodiment are not limited to the plane pattern of FIG. 43 and may take any plane pattern, provided that they can switch between the select gate lines SG0 to SG(4m+3) and the replica select gate lines RSG0 to RSG(4m+3). For instance, they may be arranged as shown in FIG. 62. FIG. 62 is a plane pattern of the MOS transistors 19-1 to 19-(4m+3). For the sake of simplification, only word lines, shunt wires 270 for select gate lines, shunt wires 271 for replica select gate lines, a gate electrode 31, and a select dummy line SDL are shown as wiring lines.

As shown in FIG. 62, unlike in FIG. 43 explained in the second embodiment, two MOS transistors 19-0 and 19-1 (19-2 and 19-3, 19-4 and 19-5, . . . ) are arranged in the second direction between two word lines WL0, WL1 (between word lines WL2, WL4, between word lines WL4, WL5, . . . ). The longitudinal direction of the gate electrode 311 is in the second direction. The source region, channel region, and drain region of the gate electrode 311 are in the first direction. Each of the shunt wires 270 for select gate lines is connected to one of the source and drain of each of the MOS transistors 19-0, 19-1. Each of the shunt wires 271 for replica select gate lines is connected to the other of the source and drain.

Furthermore, as shown in FIGS. 63 and 64, the gate electrodes 311 of the MOS transistors 19-0 to 19-(4m+3) may have a multilayer gate structure as the gates of the prime cells and replica cells. FIGS. 63 and 64 are sectional views of MOS transistors 19-0 to 19-(4m+3) taken along the gate length and the gate width, respectively. As shown in FIGS. 63 and 64, a gate electrode 311 includes a polysilicon layer 312 formed on the gate insulating film 301 and a polysilicon layer 314 formed on the polysilicon layer 312 via an inter-gate insulating film 313. In a region, the polysilicon layer 314 and inter-gate insulating film 313 are removed. Then, in the region, a contact plug CP18 is formed so as to contact the polysilicon layer 312. In the example of FIG. 64, the contact plug CP18 is electrically separated from the polysilicon layer 314 by an insulating film 315 as in the shunt region SA2. However, the contact plug CP18 may be in contact with the polysilicon layer 314.

Figure 65:
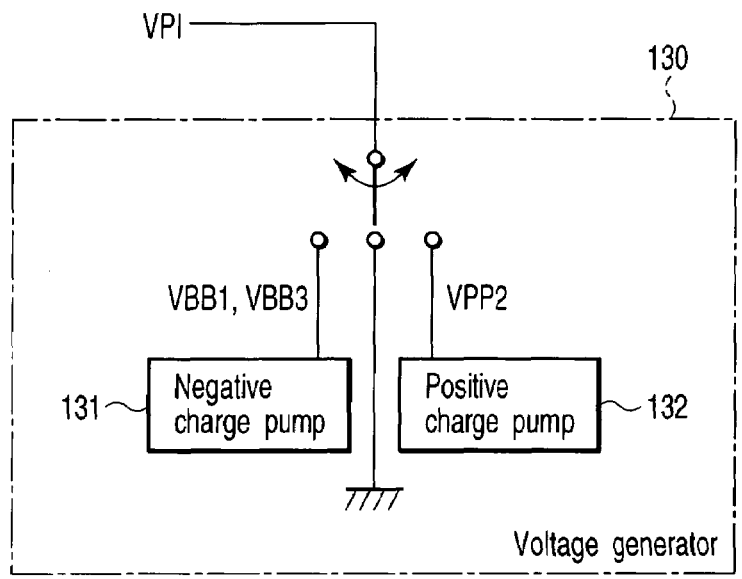
FIG. 65 is a block diagram of the voltage generator included in a 2Tr flash memory according to a first modification of each of the first to fourth embodiments.
Figure 66:
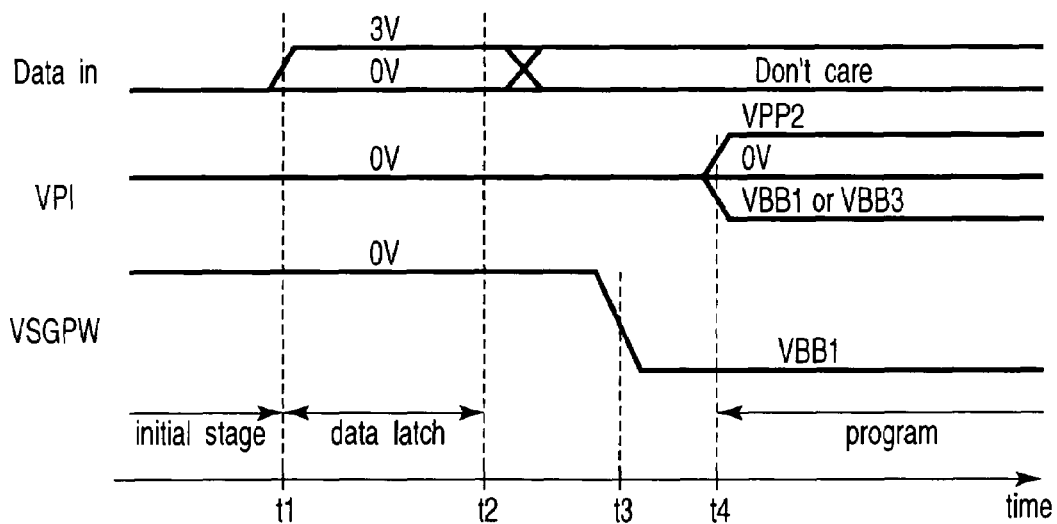
FIG. 66 is a timing chart for various signals in a write operation of a 2Tr flash memory according to a second modification of each of the first to fourth embodiments.

In the above embodiments, not only the negative voltage and 0V but also a positive voltage may be used as the write inhibit voltage VPI. FIG. 65 shows a circuit configuration in such a case. FIG. 66 is a timing chart for VPI.

As shown in FIG. 65, the voltage generator 130 includes a charge pump circuit 131 which generates a negative potential and a charge pump circuit 132 which generates a positive potential. The charge pump circuit 131 generates the negative potentials VBB1, VBB3. The charge pump circuit 132 generates the positive potential VPP2. Then, a switch connects the output nodes of these voltages and the ground potential node to VPI node suitably, which enables the voltage most suitable for the situation to be used as the write inhibit voltage VPI.

Furthermore, in the above embodiments, the 2Tr flash memory including the write decoder 20 and select gate decoder 30 has been explained. However, as shown in FIG. 67, one row decoder 140 is caused to select a word line and a select gate line. In an erase operation, the potentials on the select gate lines may be brought into the floating state.

Moreover, while in the above embodiments, the bit lines have been hierarchized, the present invention is not limited to this.

Figure 68:
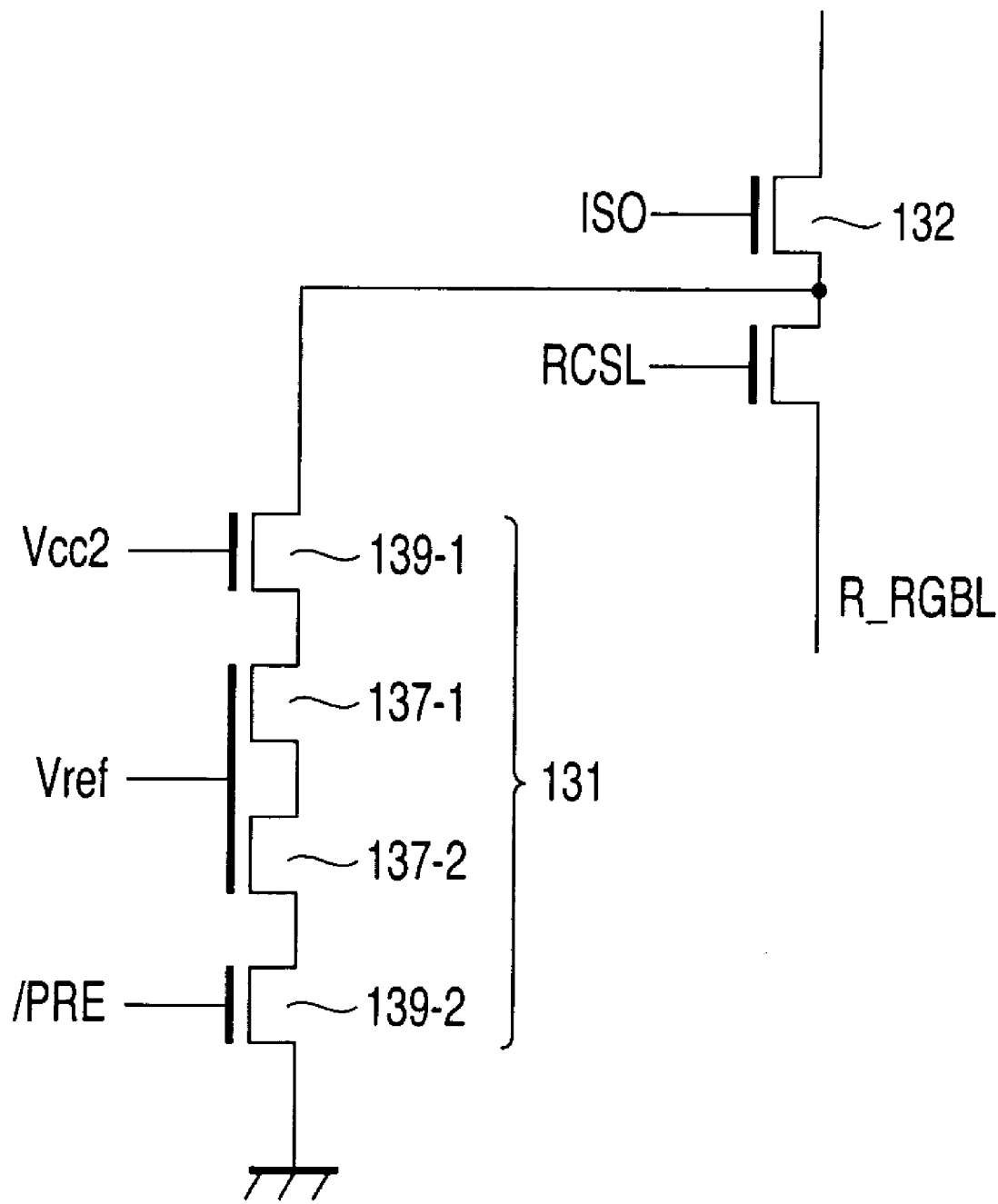
FIG. 68 is a circuit diagram of a part of the 2Tr flash memory according to the first modification of each of the first to fourth embodiments.

In addition, as shown in FIG. 68, the discharge circuit 131 may further include MOS transistor 139-1. The MOS transistor 137-1 is connected to a replica read global bit line via the current path of the MOS transistor 139-1. Then, Vcc2 is input to the gates of the MOS transistor 139-1. In this configuration, Vref is made constant, which keeps the MOS transistors 137-1, 137-2 on all the time. Then, the MOS transistor 139-2 determines whether to cause a discharge current to flow according to signal /PRE. A low-voltage MOS transistor, such as a MOS transistor used in the select gate decoder 30 or the read route can be used as the MOS transistor 139-2. Therefore, the on/off switching speed of the discharge circuit can be made faster.

Figure 69:
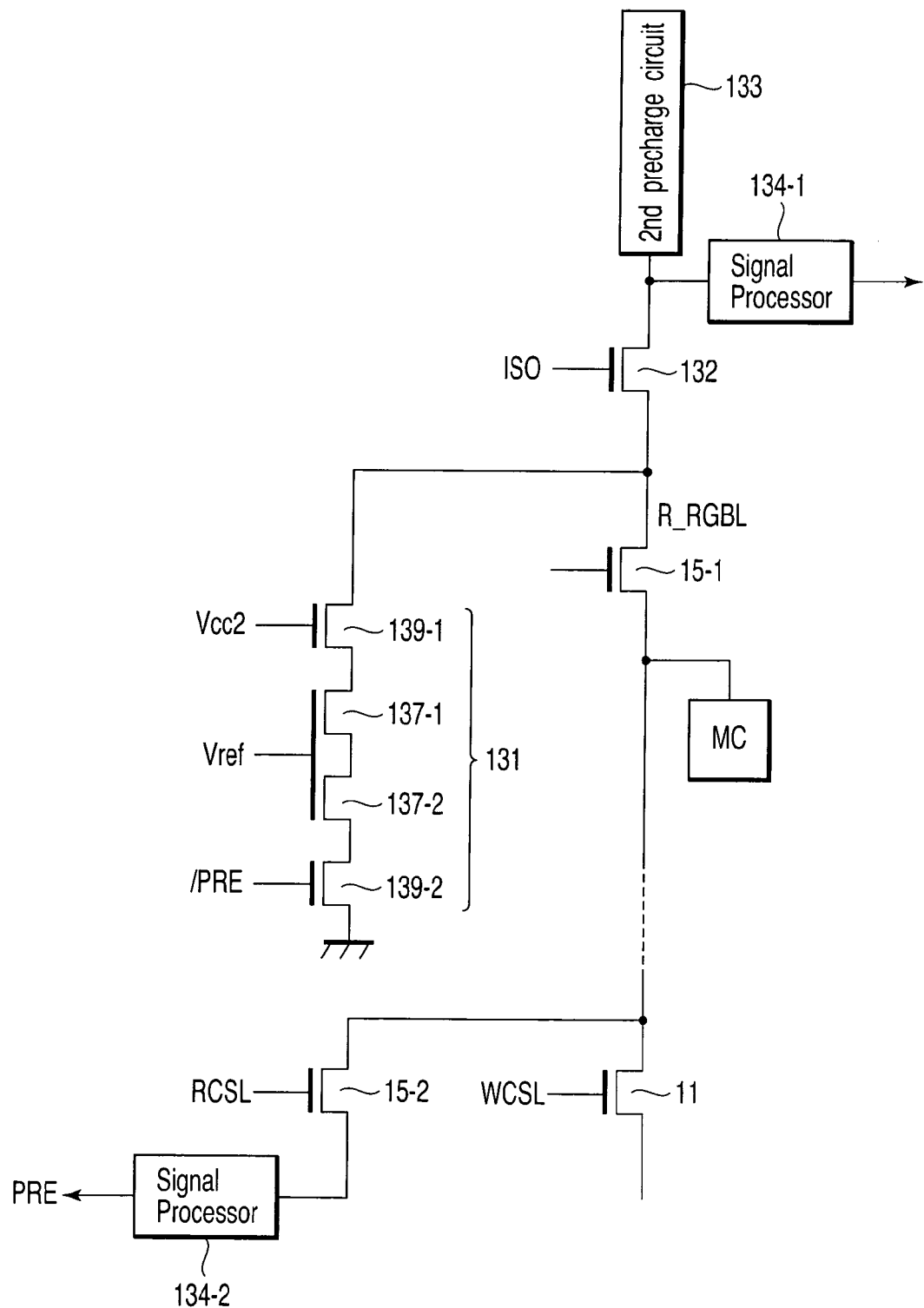
FIG. 69 is a circuit diagram of a part of the 2Tr flash memory according to the second modification of each of the first to fourth embodiments.

Furthermore, as shown in FIG. 69, a second precharge circuit may be provided at one end of the replica read global bit line R_RGBL and a signal generator 134-2 may be provided at the other end of the replica read global bit line via a select transistor 15-2. The signal generator 134-2 generates a precharge signal PRE. In a precharge operation, the second precharge circuit side (or one end) of the replica global bit line R_RGBL reaches the precharge potential earlier. Therefore, to increase the reliability of the precharge signal PRE, the signal generator 134-2 may be provided at the other end of the replica global bit line which takes a longer time to reach the precharge potential.

In addition, as shown in FIG. 70, in the case of a flash memory which has two memory cell arrays, the power supplies (Vref, Vcc2) of the discharge circuit may be shared by the two memory cell arrays.

Next, an application of the flash memory will be explained. FIG. 71 shows an example of a memory card. As shown in FIG. 71, the memory card 900 includes a flash memory 3 (3Tr-NAND flash memory, NAND flash memory, or 2Tr flash memory) explained in the above embodiments. The flash memory 3 receives specific controls signals and data from an external unit (not shown). In addition, the flash memory 3 outputs specific control signals and data to the external unit.

A signal line (DAT), a command line enable signal line (CLE), an address line enable signal line (ALE) and a ready/busy signal line (R/B) are connected to the memory card 900 having the flash memory 3. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device is ready, or not.

Another exemplary implementation is shown in FIG. 72. The memory card shown in FIG. 72 differs from the memory card presented in FIG. 71 in that the memory card of FIG. 72 includes, in addition to the memory device, a controller 910 which controls the flash memory 3 and receives/transfers predetermined signals from/to an external device (not shown).

The controller 910 includes interface units (I/F) 911, 912, a microprocessor unit (MPU) 913, a buffer RAM 914 and an error correction code unit (ECC) 915. The interface units (I/F) 911, 912 receives/outputs predetermined signals from/to an external device (not shown). The microprocessor unit 913 converts a logical address into a physical address. The buffer RAM 914 stores data temporarily. The error correction code unit 915 generates an error correction code. A command signal line (CMD), a clock signal line (CLK) and a signal line (DAT) are connected to the memory card 900. It should be noted that the number of the control signal lines, bit width of the signal line (DAT) and a circuit construction of the controller could be modified suitably.

Figure 73:
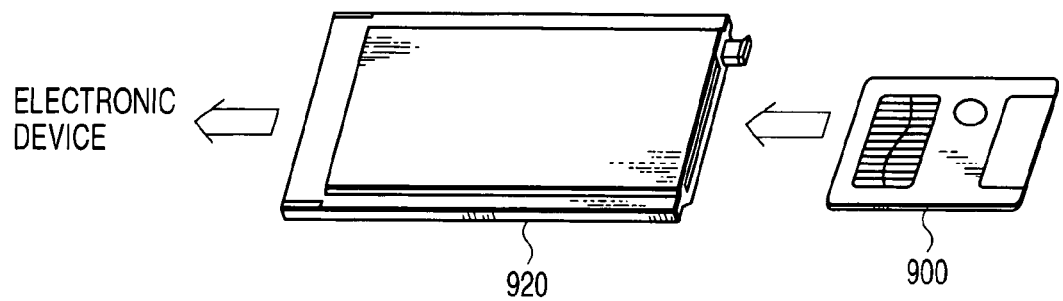
FIG. 73 is the outward appearance of a memory card including a flash memory according to the first to fourth embodiments and a card holder.

FIG. 73 shows another application. As shown in FIG. 73, the memory card 900 is inserted into a cardholder 920, which is then connected to electronic equipment (not shown). The cardholder 920 may have a part of the function of the controller 910.

Figure 74:
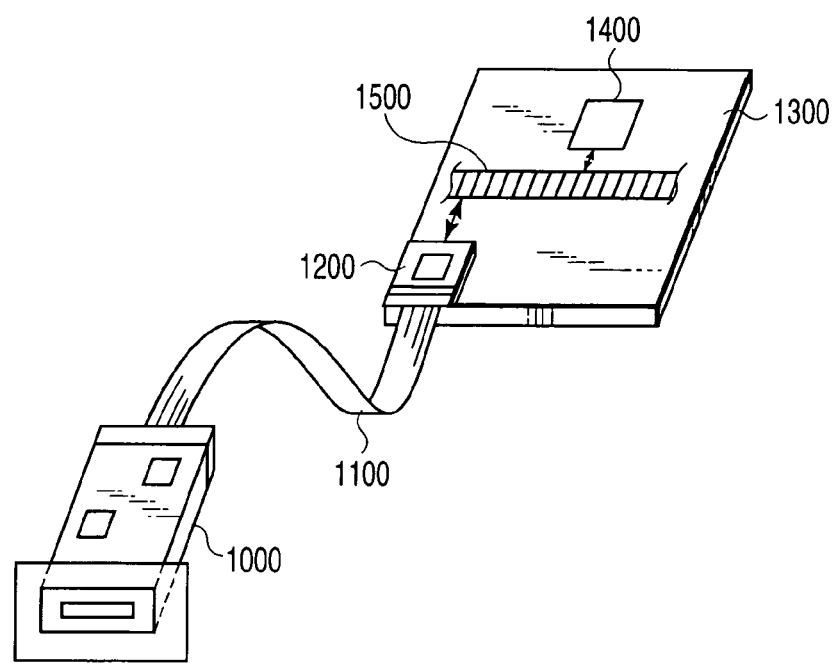
FIG. 74 is the outward appearance of a connection unit which enables connection with a memory card including a flash memory according to the first to fourth embodiments.

FIG. 74 shows another application. As shown in FIG. 74, the memory card 900 or the cardholder 920 in which the memory card 900 has been inserted is inserted into a connection unit 1000. The connection unit 1000 is connected to a board 1300 via a connection cable 1100 and an interface circuit 1200. The board 1300 includes a CPU 1400 and a bus 1500.

Figure 75:
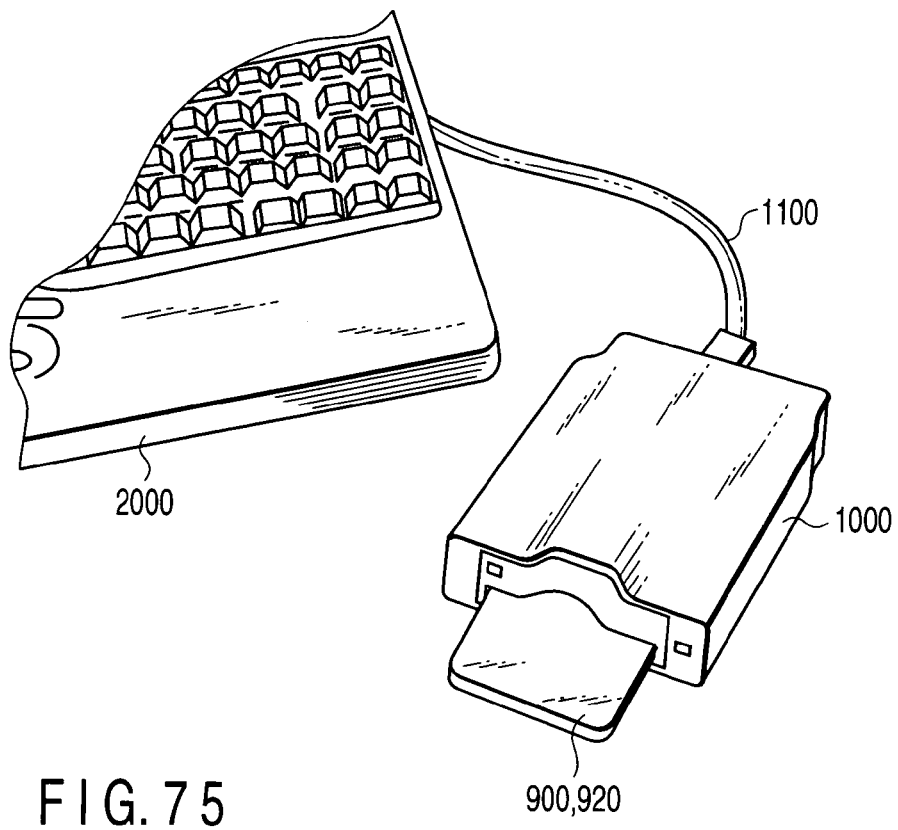
FIG. 75 is the outward appearance of a connection unit which enables connection with a memory card including a flash memory according to the first to fourth embodiments.

FIG. 75 shows another application. The memory card 900 or the cardholder 920 in which the memory card 900 has been inserted is inserted into the connection unit 1000. The connection unit 1000 is connected to a personal computer 2000 via the connection cable 1100.

Figure 76:
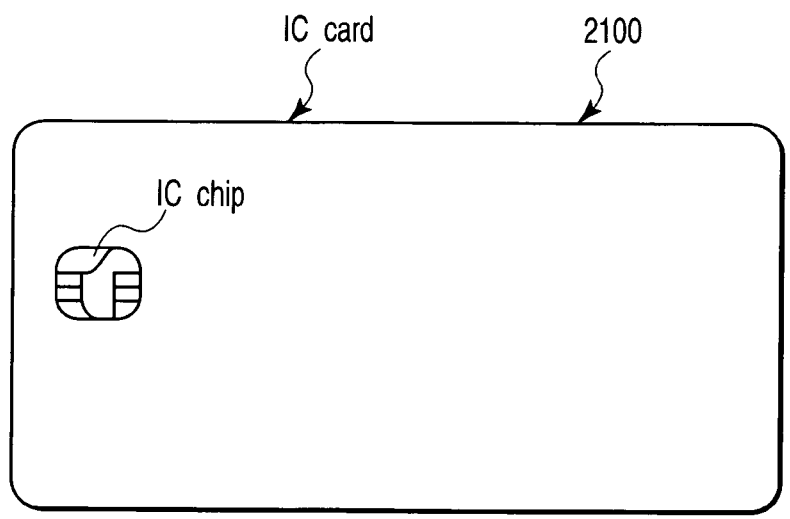
FIG. 76 is the outward appearance of an IC card including a flash memory according to the first to fourth embodiments.
Figure 77:
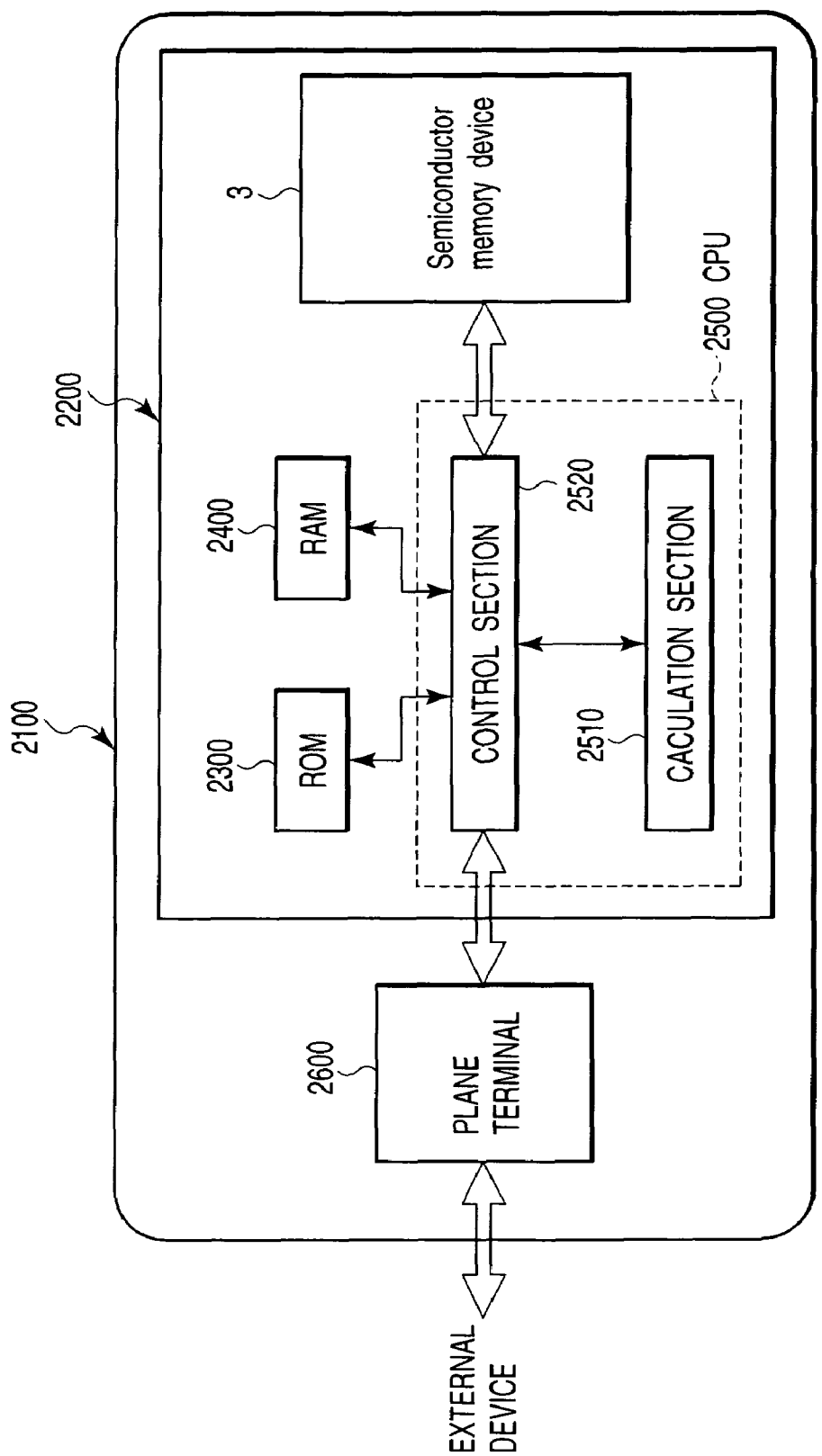
FIG. 77 is a block diagram of an IC card including a flash memory according to the first to sixth embodiments.

FIGS. 76 and 77 show another application. As shown in FIGS. 76 and 77, an IC card 2100 includes an MCU 2200. The MCU 2200 includes the flash memory 3 according to any one of the above embodiments, other circuits, including ROM 2300 and RAM 2400, and a CPU 2500. The IC card 2100 is connectable to the MCU 2200 via a plane connecting terminal 2600 connected to the MCU 2200 and provided on the IC card 2100. The CPU 2500 includes a computing section 2510 and a control section 2520 connected to the flash memory 3, ROM 2300, and RAM 2400. For example, the MPU 2200 is provided on one side of the IC card 2100 and the plane connecting terminal 2600 is provided on the other side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   first memory cells each of which has a first MOS transistor including a floating gate and a control gate, and a second MOS transistor having a drain connected to a source of the first MOS transistor;
   a first cell array in which the first memory cells are arranged in a matrix; second memory cells each of which has a third MOS transistor including a floating gate and a control gate, and a fourth MOS transistor having a drain connected to a source of the third MOS transistor;
   a second cell array which includes the second memory cells;
   a memory cell array which includes the first cell array and the second cell array;
   first bit lines each of which electrically connects commonly the drains of the first MOS transistors in a same column in the first cell array;
   second bit lines each of which electrically connects commonly the drains of the third MOS transistors in a same column in the second cell array;
   a first precharge circuit which precharges the first bit lines in a read operation;
   a sense amplifier which amplifies the data read from the first memory cells in the read operation;
   a read control circuit which precharges and discharges the second bit lines in the read operation and, on the basis of the time required to precharge and discharge the second bit lines, controls the first precharge circuit and the sense amplifier; and
   word lines each of which connects commonly the control gates of the first and third MOS transistors in a same row in the memory cell array; a well region in which the first memory cells and the second memory cells are formed; a first row decoder which applies a voltage to the word lines and the well region in a write operation and an erase operation; and write circuits which are provided so as to correspond to the first bit lines and the second bit lines and which hold write data.

2. The semiconductor memory device according to claim 1, further comprising:
   write selector circuits which are provided so as to correspond to the first bit lines and the second bit lines and which, on the basis of the write data held in the write circuit, apply a write voltage or a write inhibit voltage to the first bit lines and the second bit lines.

3. The semiconductor memory device according to claim 2, wherein the write inhibit voltage is applied to all of the second bit lines in writing data into the first memory cells.

4. The semiconductor memory device according to claim 1, further comprising:
   first select gate lines each of which connects commonly the gates of the second MOS transistors in a same row in the first cell array;
   second select gate lines each of which connects commonly the gates of the fourth MOS transistors in a same row in the second cell array; and
   a second row decoder which selects any one of the first select gate lines in the read operation,
   wherein the first select gate lines are electrically isolated from the second select gate lines in the read operation.

5. The semiconductor memory device according to claim 4, wherein the distance between the second cell array and the second row decoder is larger than the distance between the first cell array and the second row decoder.

6. The semiconductor memory device according to claim 4, further comprising:
   an isolating MOS transistor which has one end and the other end of its current path connected to the first select gate line and the second select gate line in the same row, respectively, and which is turned off in the read operation.

7. The semiconductor memory device according to claim 6, wherein the memory cell array and the isolating MOS transistor are formed on the same well region.

8. The semiconductor memory device according to claim 4, wherein the second select gate lines are electrically connected to a well region in which the first memory cells and the second memory cells are formed.

9. The semiconductor memory device according to claim 1, wherein the read control circuit comprises:
    a second precharge circuit which precharges the second bit lines and has the same circuit configuration as that of the first precharge circuit; and
    a discharge circuit which discharges the second bit lines and which includes a current source circuit and a reference voltage generator, the current source circuit including a fifth MOS transistor which includes a floating gate and a control gate and having a drain connected to the second bit line and a sixth MOS transistor having a drain connected to the source of the fifth MOS transistor, the reference voltage generator generating a reference voltage and applying the reference voltage to the floating gate of the fifth MOS transistor and the gate of the sixth MOS transistor.

10. The semiconductor memory device according to claim 9, wherein the time required to precharge the second bit lines is longer than the time required to precharge the first bit lines.

11. The semiconductor memory device according to claim 1, wherein the maximum one of the parasitic capacitances existing in the first bit lines is equal to or smaller than the parasitic capacitances existing in the second bit lines.

12. The semiconductor memory device according to claim 1, wherein the time required to discharge the second bit lines is longer than the time required to read the data from the first memory cells which hold "1" data.

13. The semiconductor memory device according to claim 1, wherein, in a read operation, the first precharge circuit completes precharging of the first bit line and, at the same time, the read control circuit starts to discharge the second bit lines, and
    the time required for the potential on the second bit lines to reach a data decision threshold value of the sense amplifier from a precharge potential is longer than the time required for the potential on the first bit lines before the "1" data is read from the first memory cells to reach the data decision threshold value of the sense amplifier from the precharge potential.

14. The semiconductor memory device according to claim 1, wherein the fourth MOS transistors are normally off.

15. A memory card comprising:
    a semiconductor memory device including,
    first memory cells each of which has a first MOS transistor including a floating gate and a control gate, and a second MOS transistor having a drain connected to a source of the first MOS transistor,
    a first cell array in which the first memory cells are arranged in a matrix; second memory cells each of which has a third MOS transistor including a floating gate and a control gate, and a fourth MOS transistor having a drain connected to a source of the third MOS transistor,
    a second cell array which includes the second memory cells,
    a memory cell array which includes the first cell array and the second cell array,
    first bit lines each of which electrically connects commonly the drains of the first MOS transistors in a same column in the first cell array,
    second bit lines each of which electrically connects commonly the drains of the third MOS transistors in a same column in the second cell array,
    a first precharge circuit which precharges the first bit lines in a read operation,
    a sense amplifier which amplifies the data read from the first memory cells in the read operation,
    a read control circuit which precharges and discharges the second bit lines in the read operation and, on the basis of the time recquired to precharge and discharge the second bit lines, controls the first precharge circuit and the sense amplifier, and
    word lines each of which connects commonly the control gates of the first and third MOS transistors in a same row in the memory cell array; a well region in which the first memory cells and the second memory cells are formed; a first row decoder which applies a voltage to the word lines and the well region in a write operation and an erase operation; and write circuits which are provided so as to correspond to the first bit lines and the second bit lines and which hold write data.

16. The memory card according to claim 15, further comprising a control device which controls the semiconductor memory device.

* * * * *